(12) United States Patent
Lin et al.

(10) Patent No.: US 12,261,203 B2
(45) Date of Patent: Mar. 25, 2025

(54) SEMICONDUCTOR DEVICE STRUCTURE WITH GATE STACK AND METHOD FOR FORMING THE SAME

(71) Applicant: TAIWAN SEMICONDUCTOR MANUFACTURING COMPANY, LTD., Hsinchu (TW)

(72) Inventors: Chien-Chih Lin, Taichung (TW); Yun-Ju Pan, Taipei (TW); Szu-Chi Yang, Hsinchu (TW); Jhih-Yang Yan, Hsinchu County (TW); Shih-Hao Lin, Hsinchu (TW); Chung-Shu Wu, Taoyuan (TW); Te-An Yu, Taipei (TW); Shih-Chiang Chen, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 536 days.

(21) Appl. No.: 17/578,559

(22) Filed: Jan. 19, 2022

(65) Prior Publication Data
US 2023/0122339 A1 Apr. 20, 2023

Related U.S. Application Data

(60) Provisional application No. 63/255,640, filed on Oct. 14, 2021.

(51) Int. Cl.
*H01L 29/06* (2006.01)
*H01L 29/423* (2006.01)
(Continued)

(52) U.S. Cl.
CPC .... *H01L 29/0665* (2013.01); *H01L 29/42392* (2013.01); *H01L 29/66553* (2013.01); *H01L 29/66742* (2013.01); *H01L 29/78696* (2013.01)

(58) Field of Classification Search
CPC .......... H01L 29/0665; H01L 29/42392; H01L 29/66553; H01L 29/66742;
(Continued)

(56) References Cited

U.S. PATENT DOCUMENTS 9,209,247 B2   12/2015   Colinge et al.
9,236,267 B2   1/2016    De et al.
(Continued)

FOREIGN PATENT DOCUMENTS

TW   202129840 A   8/2021

OTHER PUBLICATIONS

Structural and Electrical Demonstration of SiGe Cladded Channel (Year: 2020).*

*Primary Examiner* — Fernando L Toledo
*Assistant Examiner* — Marshall Mu-Nuo Hatfield
(74) *Attorney, Agent, or Firm* — Birch, Stewart, Kolasch & Birch, LLP

(57) ABSTRACT

A semiconductor device structure is provided. The semiconductor device structure includes a substrate including a base and a fin structure over the base. The fin structure includes a nanostructure. The semiconductor device structure includes a gate stack over the base and wrapped around the nanostructure. The gate stack has an upper portion and a sidewall portion, the upper portion is over the nanostructure, and the sidewall portion is over a first sidewall of the nanostructure. The semiconductor device structure includes a first inner spacer and a second inner spacer over opposite sides of the sidewall portion. A sum of a first width of the first inner spacer and a second width of the second inner spacer is greater than a third width of the sidewall portion as measured along a longitudinal axis of the fin structure.

20 Claims, 49 Drawing Sheets

(51) Int. Cl.
*H01L 29/66* (2006.01)
*H01L 29/786* (2006.01)

(58) Field of Classification Search
CPC .......... H01L 29/78696; H01L 29/1079; H01L 29/42376; H01L 29/66439; H01L 29/7848; H01L 29/66545
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2016/0351701 A1* | 12/2016 | Cea | H01L 29/785 |
| 2018/0294348 A1* | 10/2018 | Xie | H01L 29/167 |
| 2018/0301564 A1* | 10/2018 | Kwon | H01L 29/0653 |
| 2019/0157386 A1* | 5/2019 | Ando | H01L 21/02603 |
| 2020/0098893 A1 | 3/2020 | Guillorn et al. | |
| 2020/0373391 A1* | 11/2020 | Yi | H01L 29/1079 |
| 2021/0098302 A1 | 4/2021 | Ju et al. | |
| 2021/0202527 A1* | 7/2021 | Kim | H01L 27/11807 |
| 2021/0217848 A1* | 7/2021 | Kim | H01L 29/42392 |
| 2021/0305393 A1 | 9/2021 | Wang | |
| 2021/0305401 A1 | 9/2021 | Liaw | |

\* cited by examiner

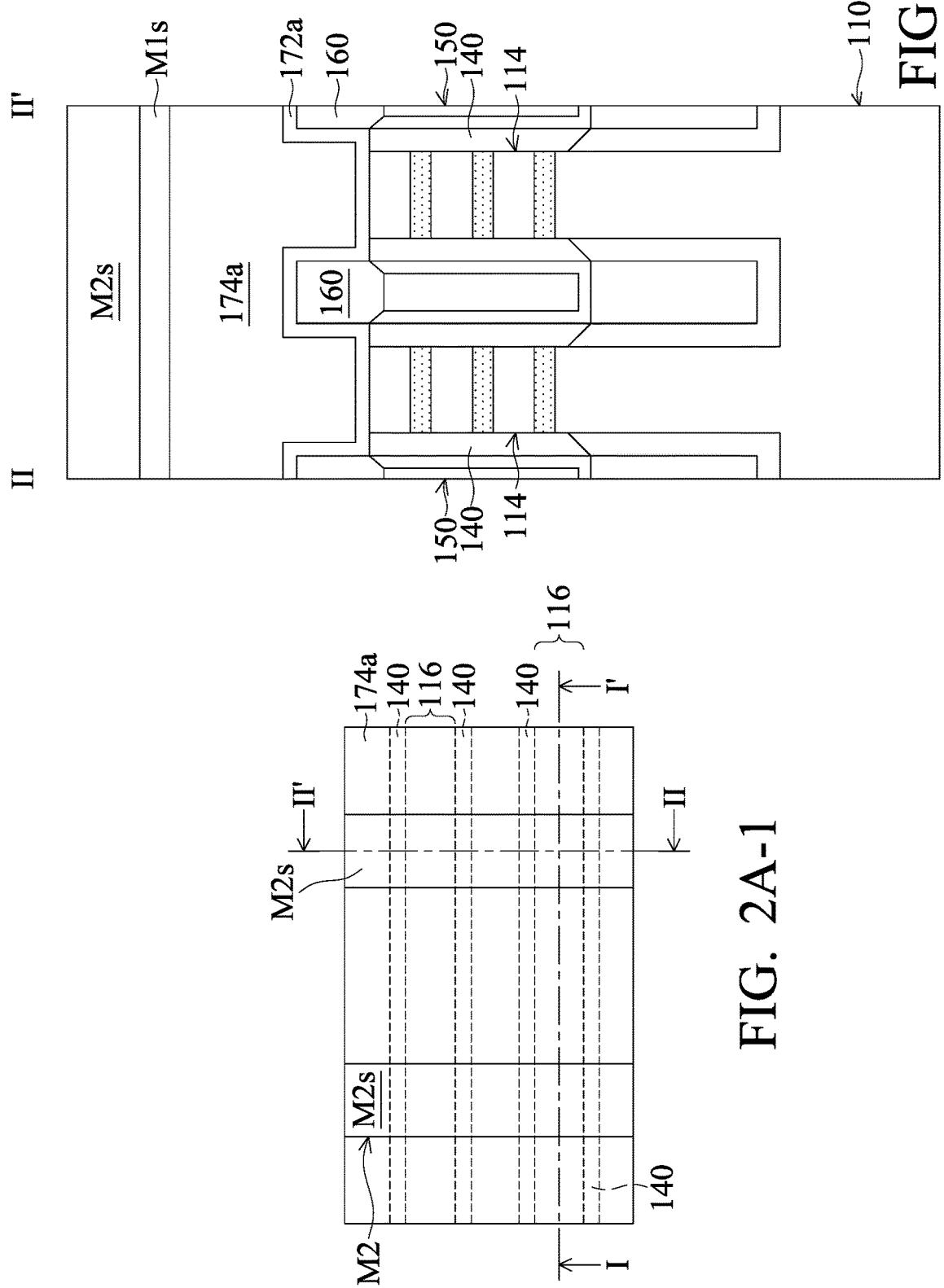

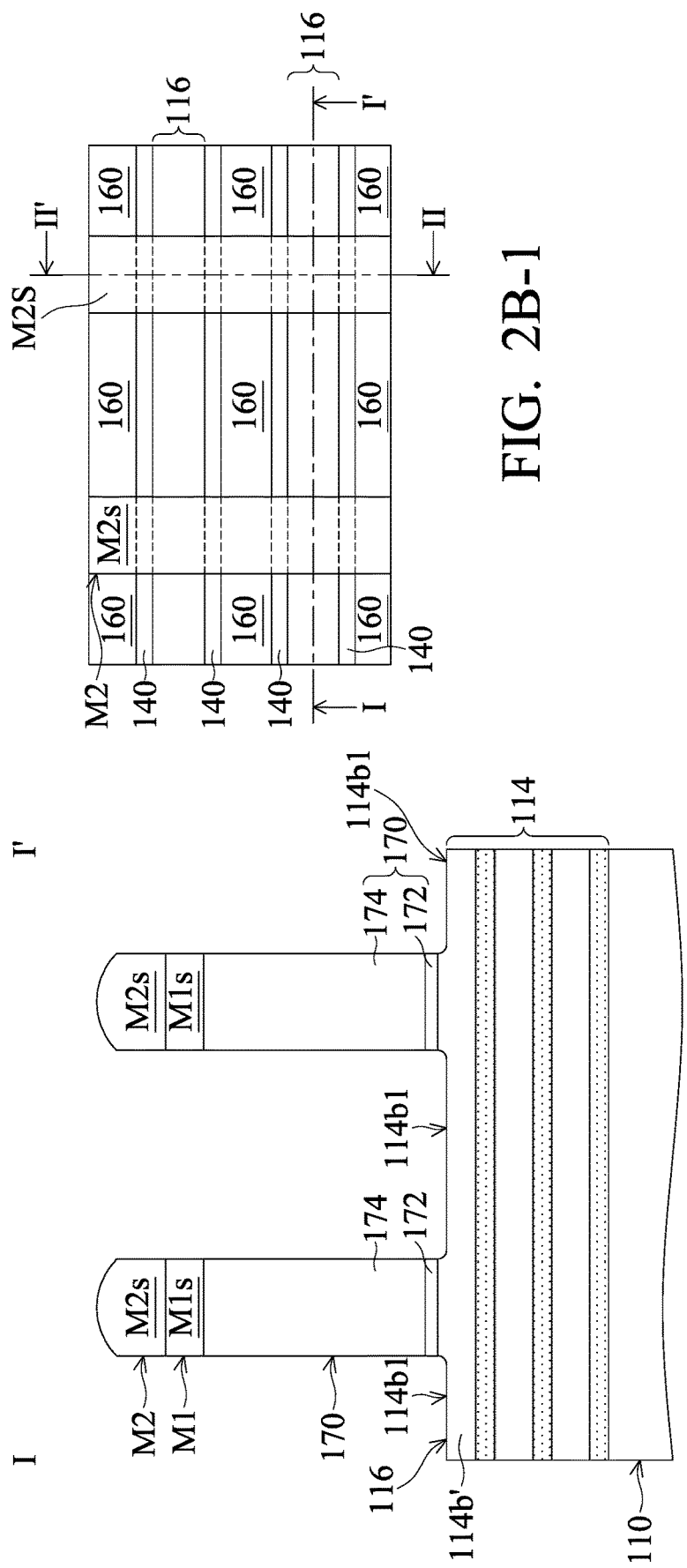

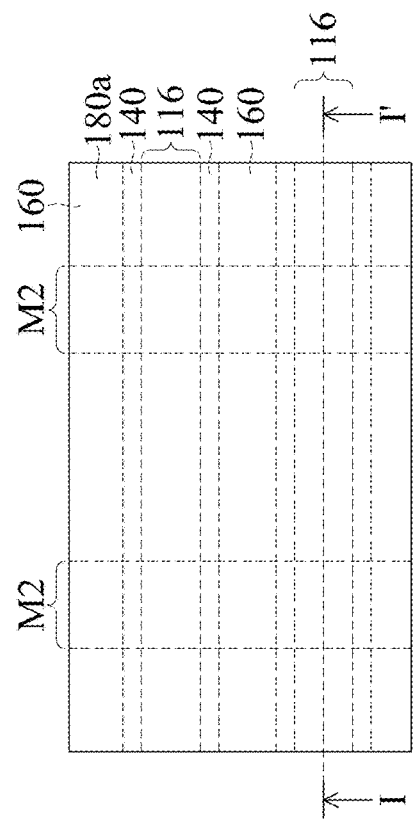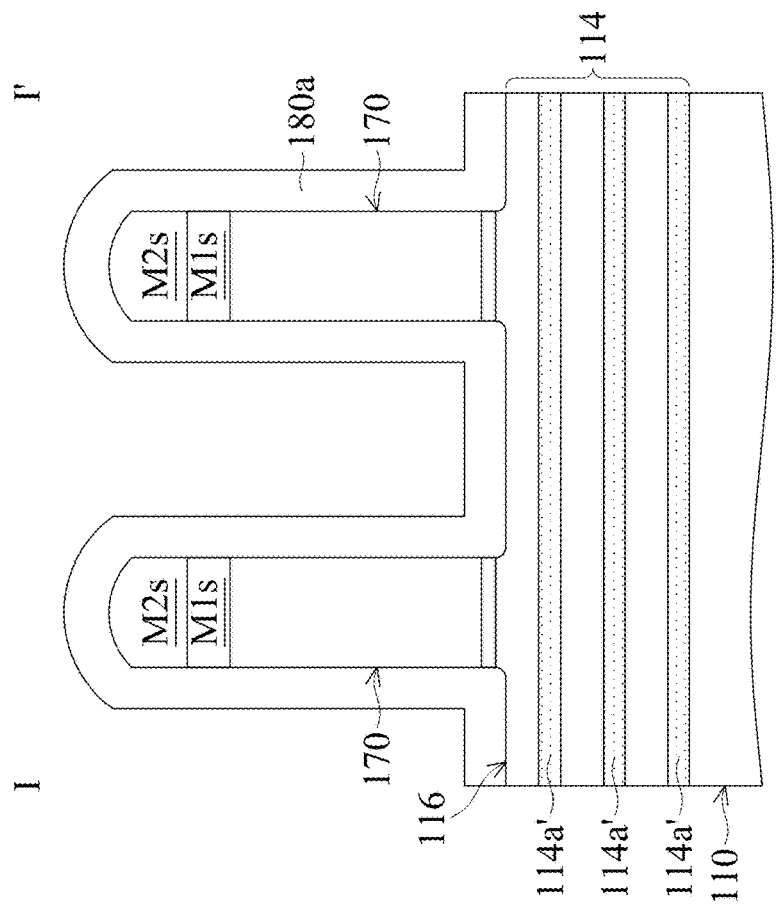
FIG. 2C-1
FIG. 2C

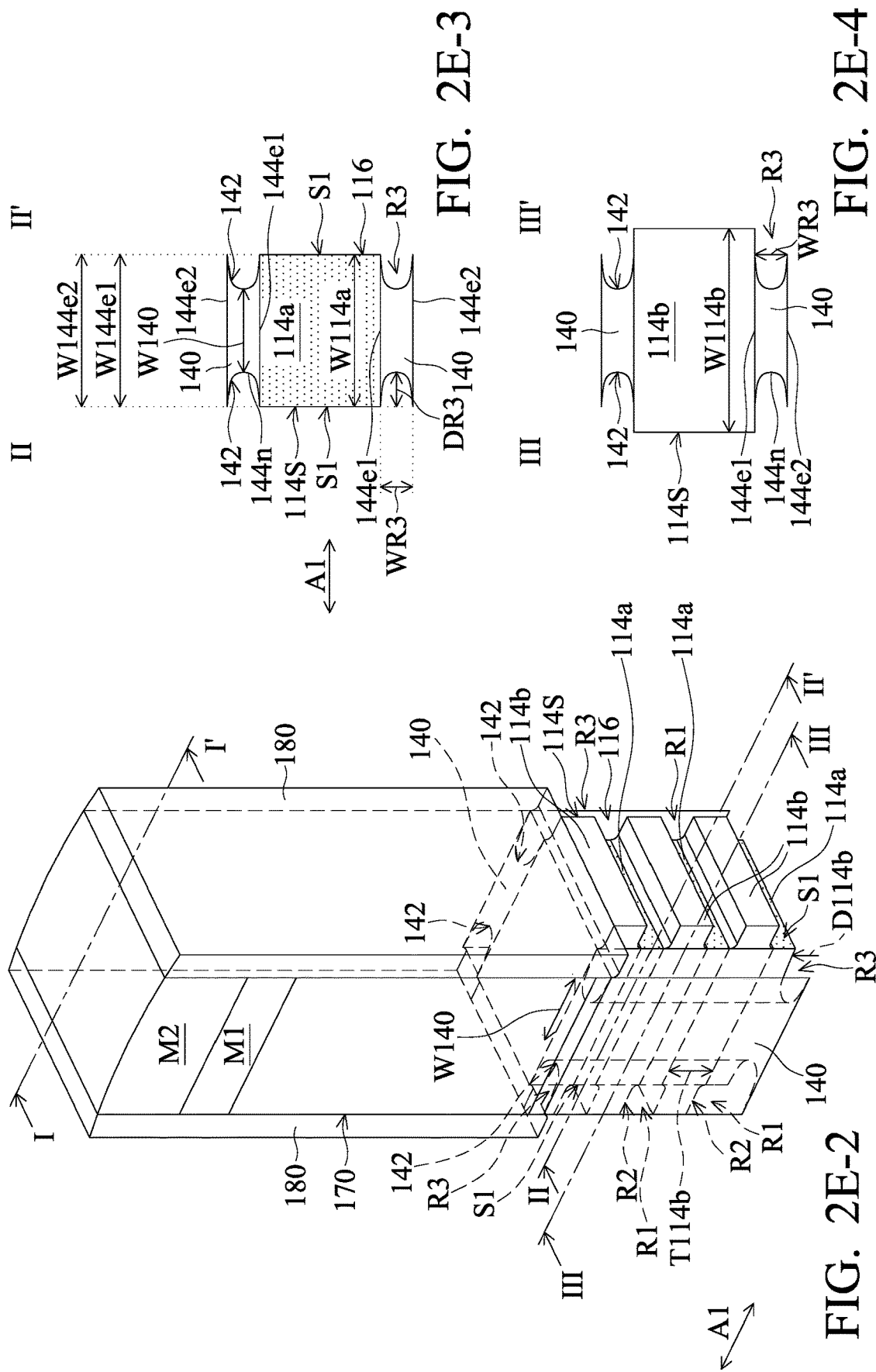

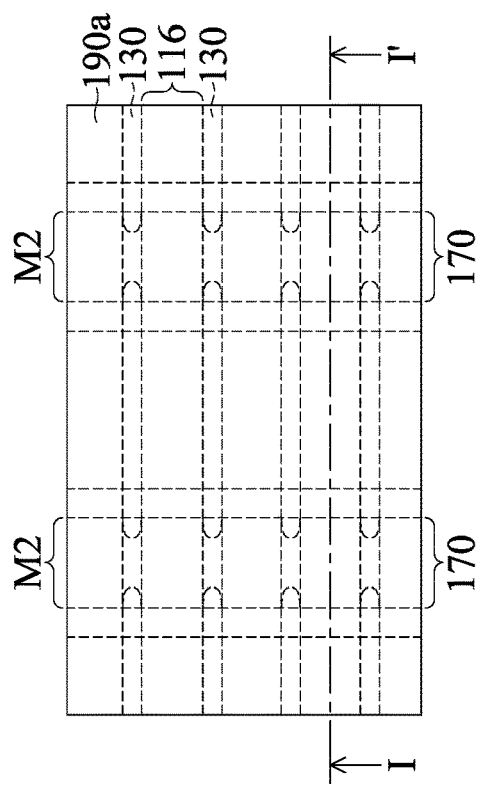
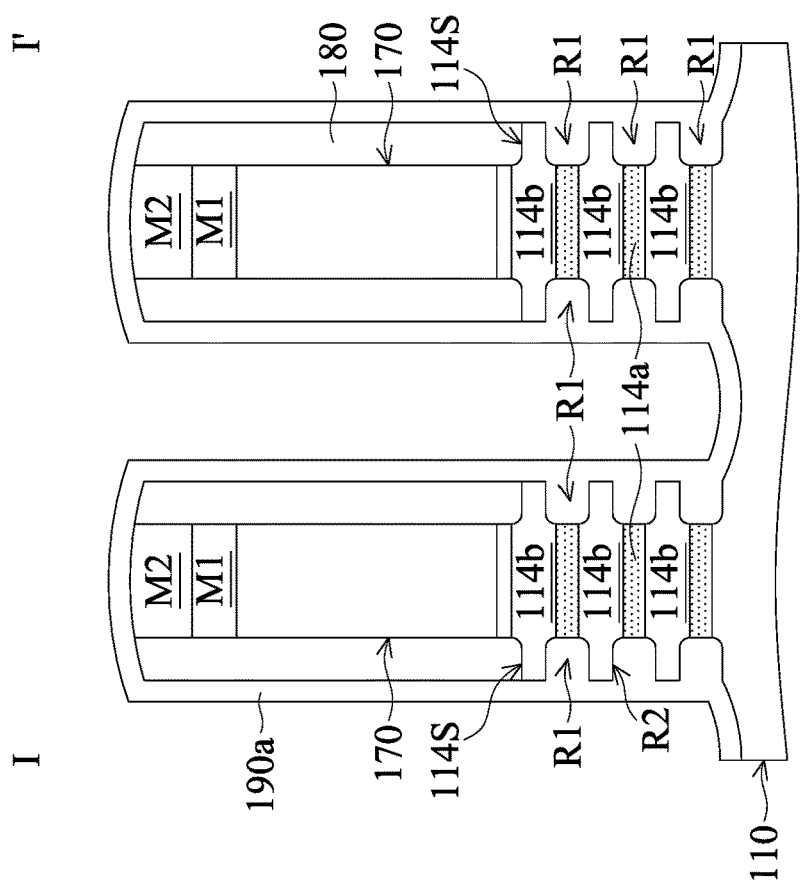
FIG. 2F-1
FIG. 2F

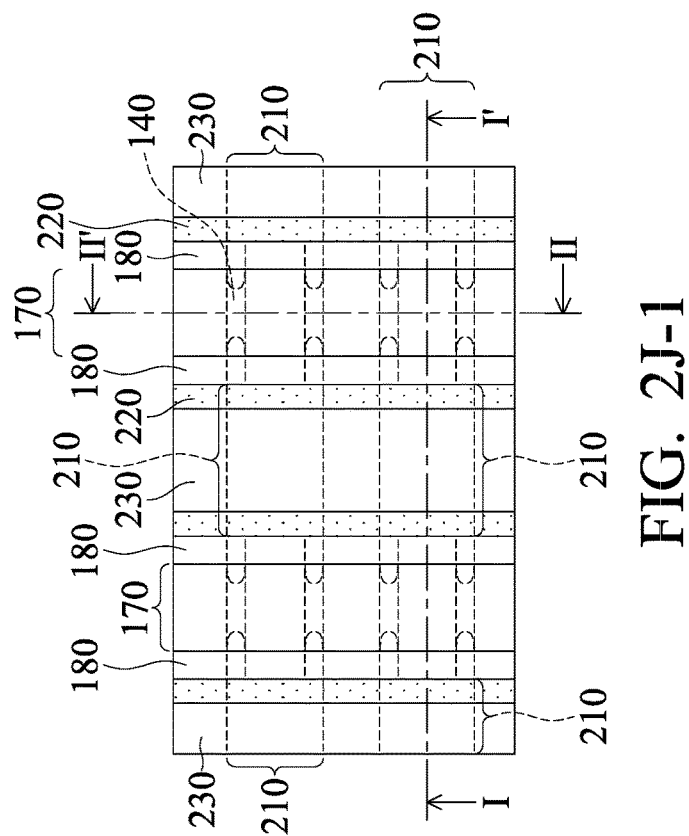
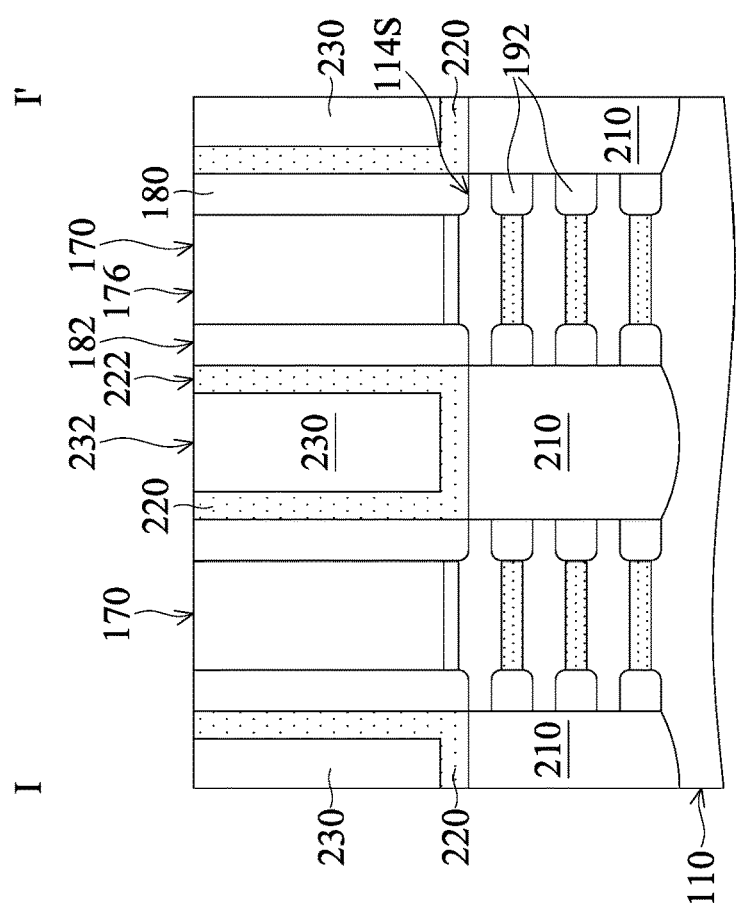
FIG. 2J-1
FIG. 2J

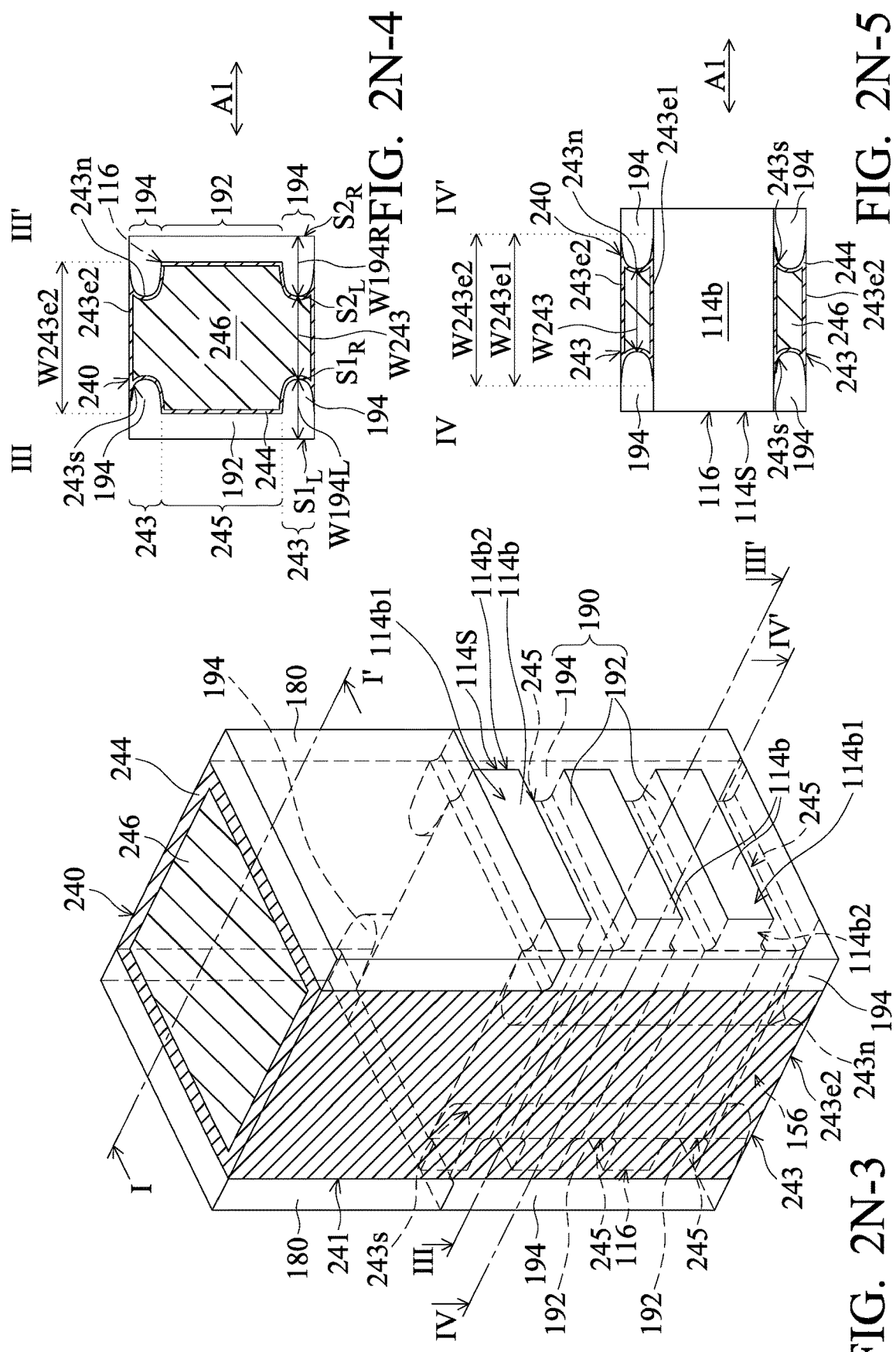

SEMICONDUCTOR DEVICE STRUCTURE WITH GATE STACK AND METHOD FOR FORMING THE SAME

PRIORITY CLAIM AND CROSS-REFERENCE

This Application claims the benefit of U.S. Provisional Application No. 63/255,640, filed on Oct. 14, 2021, and entitled "SEMICONDUCTOR DEVICE STRUCTURE AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1J are cross-sectional views of various stages of a process for forming a semiconductor device structure, in accordance with some embodiments.

FIGS. 1A-1 to 1D-1 are perspective views of the semiconductor device structure of FIGS. 1A to 1D, in accordance with some embodiments.

FIGS. 1J-1 is a perspective view of the semiconductor device structure of FIG. 1J, in accordance with some embodiments.

FIG. 1J-2 is a top view of the semiconductor device structure of FIG. 1J, in accordance with some embodiments.

FIGS. 2A-1 to 2O-1 are top views of the semiconductor device structure of FIGS. 2A to 2O, in accordance with some embodiments.

FIGS. 2A-2 and 2B-2 are cross-sectional views illustrating the semiconductor device structure along a sectional line II-II' in FIGS. 2A-1 and 2B-1, in accordance with some embodiments.

FIGS. 2J-2 to 2O-2 are cross-sectional views illustrating the semiconductor device structure along a sectional line II-II' in FIGS. 2J-1 to 2O-1, in accordance with some embodiments.

FIGS. 2D-2, 2E-2, 2G-2, and 2N-3 are perspective views of a portion of the semiconductor device structure of FIGS. 2D, 2E, 2G and 2N, in accordance with some embodiments.

FIG. 2E-3 is a cross-sectional view illustrating the semiconductor device structure along a sectional line II-II' in FIG. 2E-2, in accordance with some embodiments.

FIG. 2E-4 is a cross-sectional view illustrating the semiconductor device structure along a sectional line III-III' in FIG. 2E-2, in accordance with some embodiments.

FIG. 2G-3 is a cross-sectional view illustrating the semiconductor device structure along a sectional line II-II' in FIG. 2G-2, in accordance with some embodiments.

FIG. 2G-4 is a cross-sectional view illustrating the semiconductor device structure along a sectional line III-III' in FIG. 2G-2, in accordance with some embodiments.

FIG. 2N-4 is a cross-sectional view illustrating the semiconductor device structure along a sectional line III-III' in FIG. 2N-3, in accordance with some embodiments.

FIG. 2N-5 is a cross-sectional view illustrating the semiconductor device structure along a sectional line IV-IV' in FIG. 2N-3, in accordance with some embodiments.

DETAILED DESCRIPTION

Figures 1, 1A:
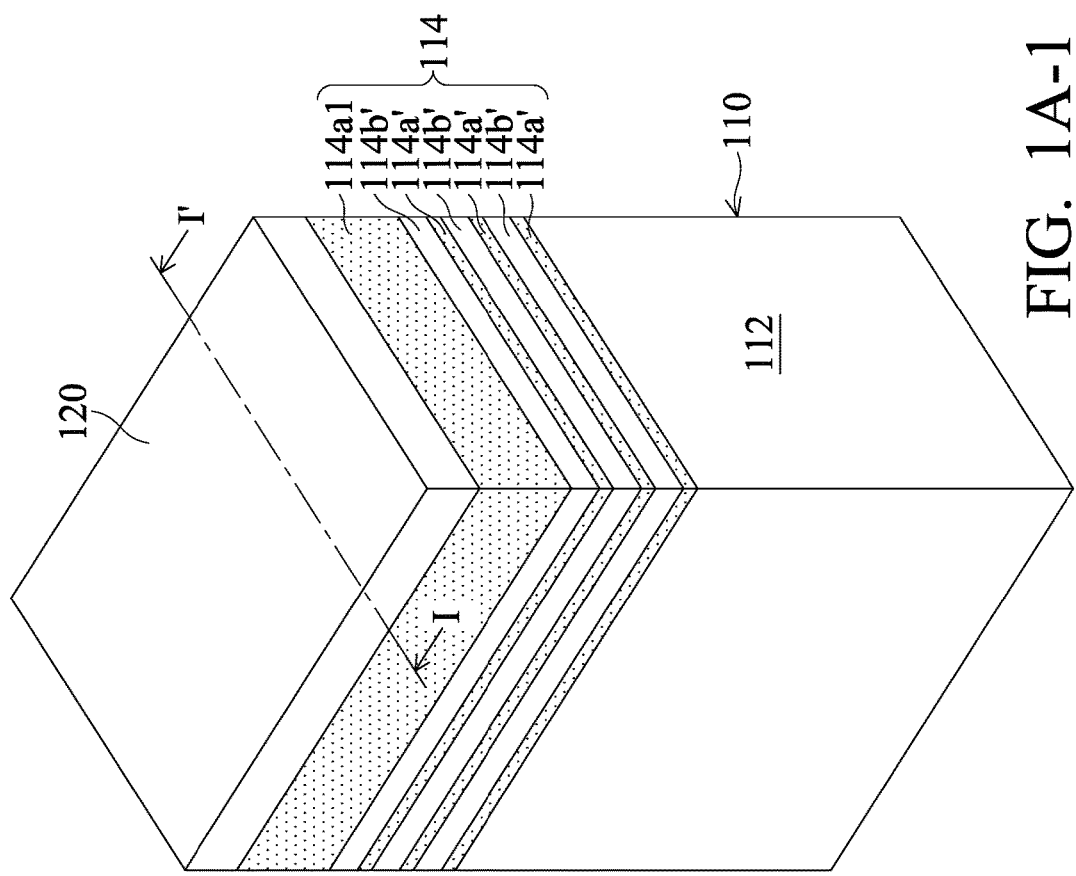
Figure 1A:
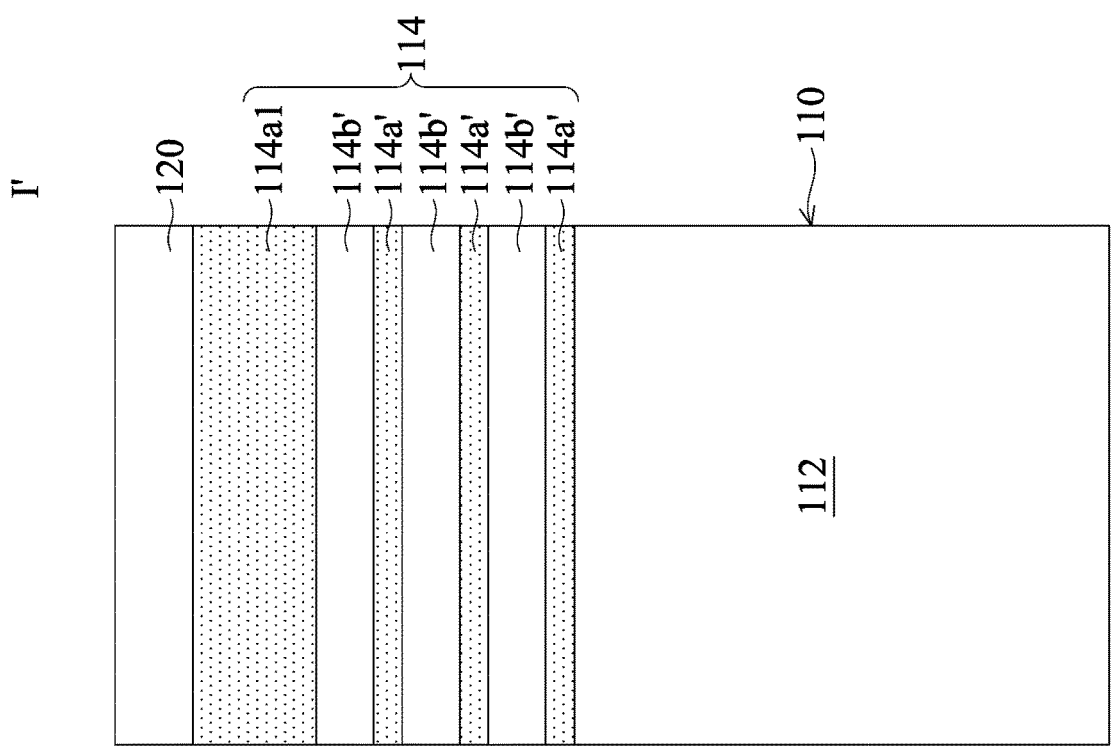

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figures 1, 1B:
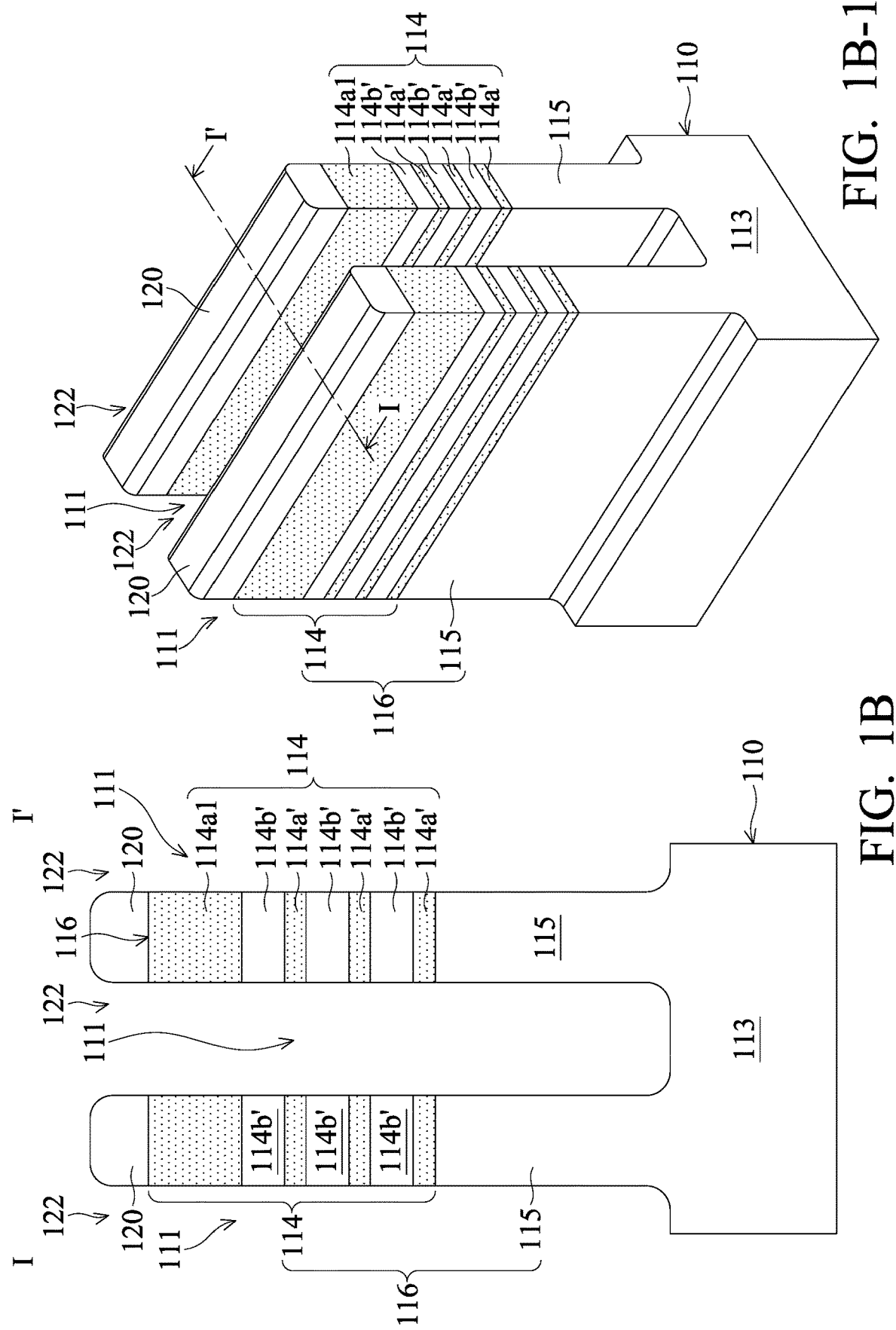
Figures 1, 1C:
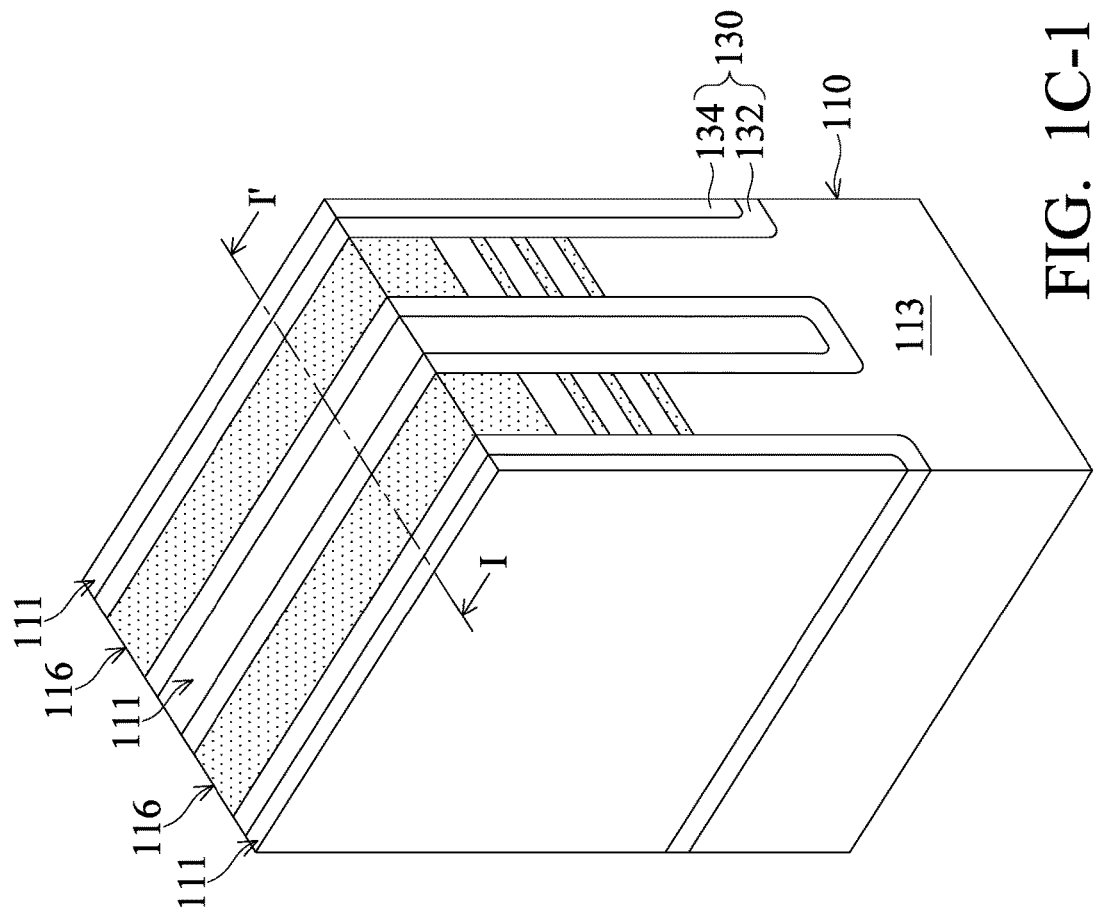
Figure 1C:
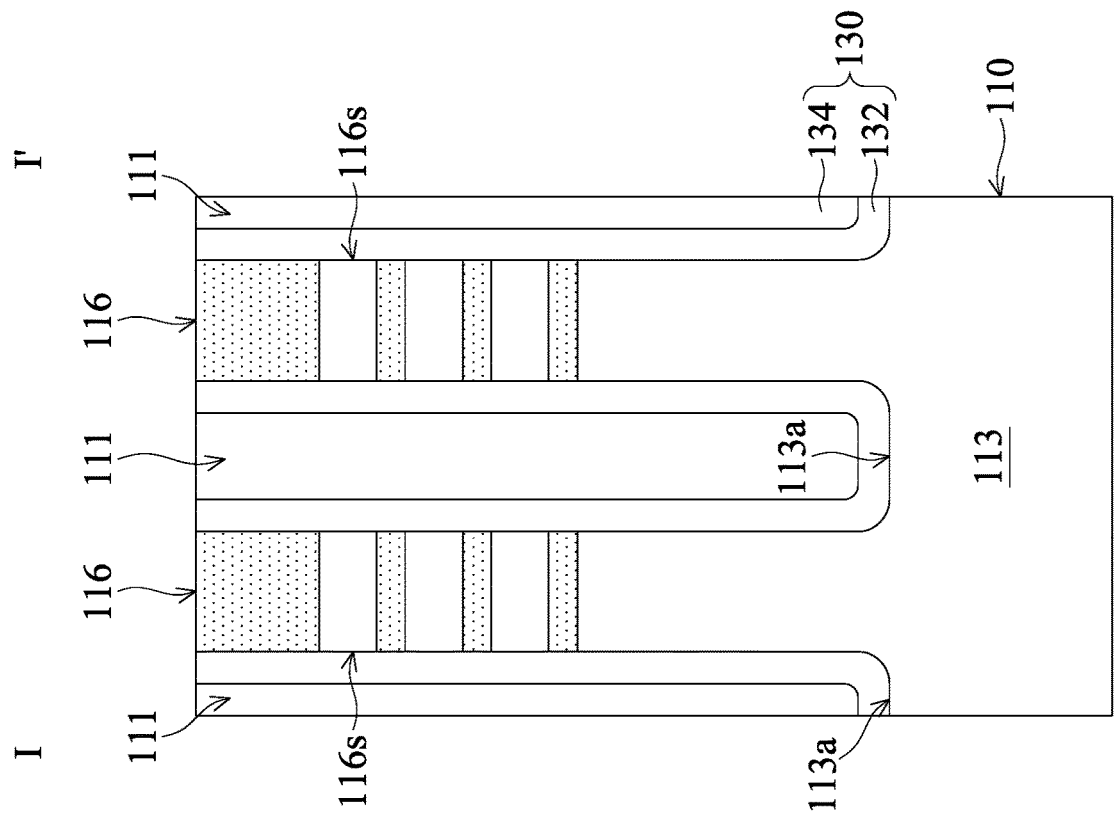
Figures 1, 1D:
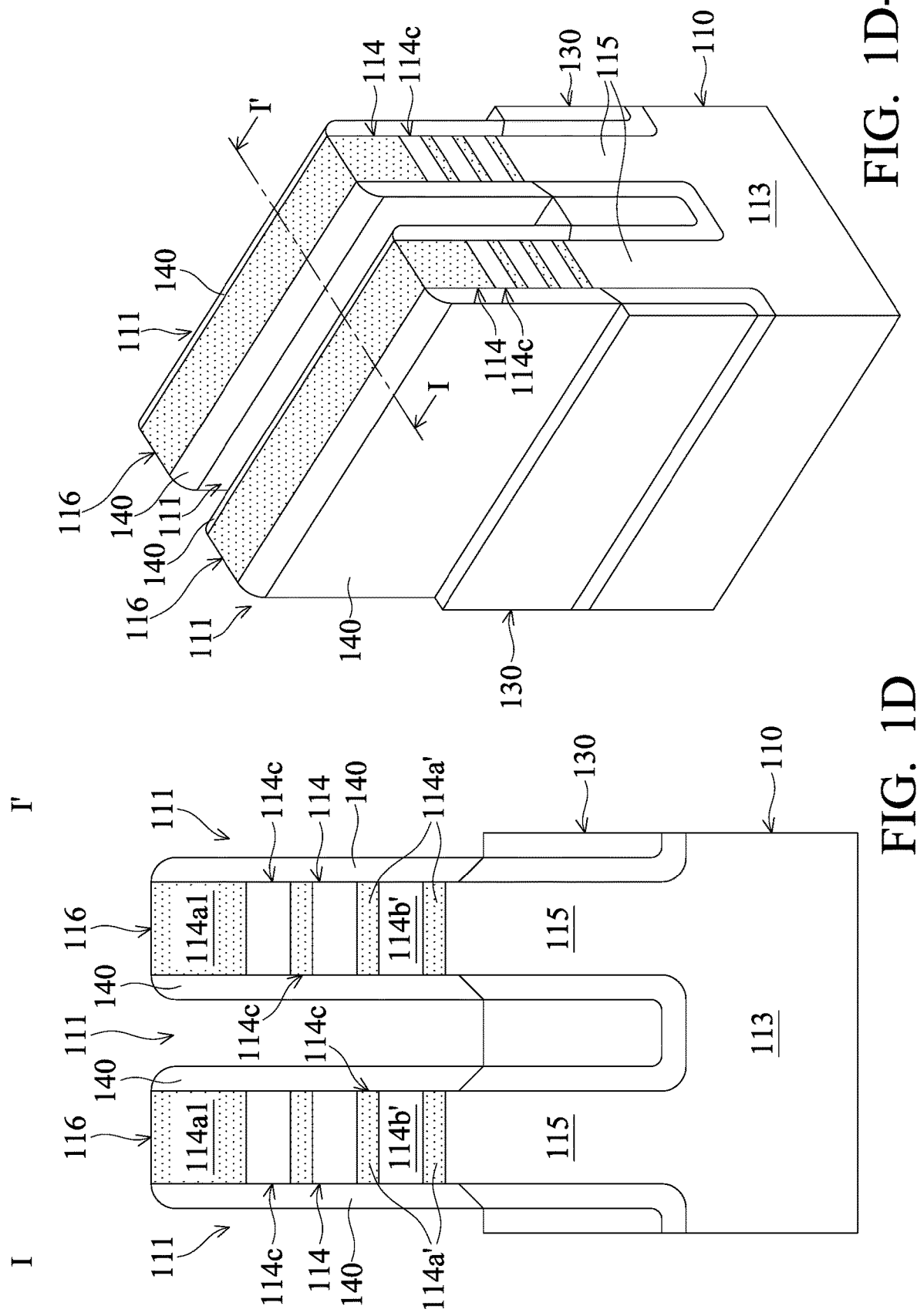

FIGS. 1A-1J are cross-sectional views of various stages of a process for forming a semiconductor device structure, in accordance with some embodiments. FIGS. 1A-1 to 1D-1 are perspective views of the semiconductor device structure of FIGS. 1A to 1D, in accordance with some embodiments.

As shown in FIGS. 1A and 1A-1, a substrate 110 is provided, in accordance with some embodiments. The substrate 110 includes a lower portion 112 and a multilayer structure 114, in accordance with some embodiments. The multilayer structure 114 is formed over the lower portion 112, in accordance with some embodiments.

The lower portion 112 includes, for example, a semiconductor substrate. The semiconductor substrate includes, for example, a semiconductor wafer (such as a silicon wafer) or a portion of a semiconductor wafer. In some embodiments, the lower portion 112 is made of an elementary semiconductor material including silicon or germanium in a single crystal, polycrystal, or amorphous structure.

In some other embodiments, the lower portion 112 is made of a compound semiconductor, such as silicon carbide, gallium arsenide, gallium phosphide, indium phosphide, indium arsenide, an alloy semiconductor, such as SiGe, or GaAsP, or a combination thereof. The lower portion 112 may also include multi-layer semiconductors, semiconductor on insulator (SOI) (such as silicon on insulator or germanium on insulator), or a combination thereof.

In some embodiments, the lower portion 112 is a device wafer that includes various device elements. In some embodiments, the various device elements are formed in and/or over the lower portion 112. The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the lower portion 112. The isolation features are used to define active regions and electrically isolate various device elements formed in and/or over the lower portion 112 in the active regions. In some embodiments, the isolation features include shallow trench isolation (STI) features, local oxidation of silicon (LOCOS) features, other suitable isolation features, or a combination thereof.

The multilayer structure 114 is also referred to a super lattice structure or a super lattice epitaxial growth structure, in accordance with some embodiments. The multilayer structure 114 includes sacrificial layers 114a', a thick sacrificial layer 114a1, and channel layers 114b', in accordance with some embodiments. The thick sacrificial layer 114a1 is over the sacrificial layers 114a' and the channel layers 114b', in accordance with some embodiments.

The thick sacrificial layer 114a1 is thicker than the sacrificial layer 114a', in accordance with some embodiments. The thick sacrificial layer 114a1 is thicker than the channel layer 114b', in accordance with some embodiments. The thick sacrificial layer 114a1 and the sacrificial layer 114a' are used to reserve a space for a gate stack formed in the subsequent process, in accordance with some embodiments.

The sacrificial layers 114a' and the channel layers 114b' are alternately arranged as illustrated in FIG. 1A, in accordance with some embodiments. It should be noted that, for the sake of simplicity, FIG. 1A shows three layers of the sacrificial layers 114a' and three layers of the channel layers 114b' for illustration, but does not limit the invention thereto. In some embodiments, the number of the sacrificial layers 114a' or the channel layers 114b' is between 2 and 10.

The sacrificial layers 114a' and the thick sacrificial layer 114a1 are made of a same first material, such as a first semiconductor material, in accordance with some embodiments. The channel layers 114b' are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial layers 114a' and the thick sacrificial layer 114a1 are made of SiGe, and the channel layers 114b' are made of Si. The atomic percentage of Ge in the sacrificial layers 114a' or the thick sacrificial layer 114a1 ranges from about 5% to 40%, in accordance with some embodiments.

In some other embodiments, the sacrificial layers 114a' or the channel layers 114b' are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof.

The channel layers 114b' and the lower portion 112 are made of the same material such as Si, in accordance with some embodiments. The material of the sacrificial layers 114a' and the thick sacrificial layer 114a1 is different from the material of the lower portion 112, in accordance with some embodiments. In some other embodiments, the sacrificial layers 114a', the thick sacrificial layer 114a1, the channel layers 114b', and the lower portion 112 are made of different materials, in accordance with some embodiments.

The sacrificial layers 114a', the thick sacrificial layer 114a1, and the channel layers 114b' are formed using an epitaxial growth process such as a molecular beam epitaxy (MBE) process, a metal-organic chemical vapor deposition (MOCVD) process, and/or another suitable epitaxial growth process. The epitaxial growth process is performed under about 350° C. to about 950° C. temperature and about 5 Torr to about 25 Torr pressure for about 10 seconds to about 40 seconds, in accordance with some embodiments.

As shown in FIGS. 1A and 1A-1, a mask layer 120 is formed over the multilayer structure 114, in accordance with some embodiments. The mask layer 120 is made of an oxide material such as silicon dioxide ($SiO_2$), a nitride material such as silicon nitride ($Si_3N_4$), or another suitable material, which is different from the materials of the substrate 110 (or the multilayer structure 114), in accordance with some embodiments. The mask layer 120 is formed using a deposition process (e.g., a physical vapor deposition process or a chemical vapor deposition process), in accordance with some embodiments.

As shown in FIGS. 1B and 1B-1, portions of the mask layer 120 are removed to form trenches 122 in the mask layer 120, in accordance with some embodiments. The trenches 122 pass through the mask layer 120, in accordance with some embodiments. The removal process includes a photolithography process and an etching process (e.g., a dry etching process), in accordance with some embodiments.

As shown in FIGS. 1B and 1B-1, portions of the substrate 110 exposed by the trenches 122 are removed through the trenches 122, in accordance with some embodiments. The removal process forms trenches 111 in the substrate 110, in accordance with some embodiments.

After the removal process, the remaining portion of the substrate 110 includes a base 113 and fin structures 116, in accordance with some embodiments. The fin structures 116 are over the base 113, in accordance with some embodiments. The base 113 is formed from the lower portion 112 (as shown in FIG. 1A), in accordance with some embodiments.

Each fin structure 116 includes a bottom portion 115 and a portion of the multilayer structure 114, in accordance with some embodiments. The portion of the multilayer structure 114 includes portions of the sacrificial layers 114a', the thick sacrificial layer 114a1, and the channel layers 114b', in accordance with some embodiments.

The bottom portion 115 is formed from the lower portion 112 (as shown in FIG. 1A), in accordance with some embodiments. The fin structures 116 are separated from each other by the trenches 111, in accordance with some embodiments.

As shown in FIGS. 1C and 1C-1, the mask layer 120 is removed, in accordance with some embodiments. As shown in FIGS. 1C and 1C-1, a liner layer 132 is conformally formed over sidewalls 116s of the fin structures 116 and a top surface 113a of the base 113, in accordance with some embodiments. As shown in FIGS. 1C and 1C-1, a dielectric layer 134 is formed over the liner layer 132 and in the trenches 111, in accordance with some embodiments. The liner layer 132 and the dielectric layer 134 together form an isolation structure 130, in accordance with some embodiments.

The liner layer 132 is made of oxides (e.g., silicon oxide), nitrides (e.g., silicon nitride), or another suitable dielectric material, in accordance with some embodiments. The dielectric layer 134 is made of oxide (such as silicon oxide), fluorosilicate glass (FSG), a low-k dielectric material, and/or another suitable dielectric material. In some embodiments, the liner layer 132 and the dielectric layer 134 are made of different materials.

The removal of the mask layer 120 and the formation of the liner layer 132 and the dielectric layer 134 include: conformally depositing a liner material layer (not shown) over the substrate 110; depositing a dielectric material layer (not shown) over the liner material layer; and performing a planarization process to remove the liner material layer and the dielectric material layer outside of the trenches 111 and the mask layer 120, in accordance with some embodiments.

The liner material layer may be deposited by an atomic layer deposition (ALD) process, a chemical vapor deposition (CVD) process, or another applicable process. The dielectric material layer may be deposited by a chemical vapor deposition process, an atomic layer deposition process, a physical vapor deposition (PVD) process, or another applicable process.

As shown in FIGS. 1D and 1D-1, an upper portion of the isolation structure 130 is removed to expose sidewalls 114c of the multilayer structure 114, in accordance with some embodiments. The removal process includes an etching process such as a dry etching process or a wet etching process, in accordance with some embodiments.

As shown in FIGS. 1D and 1D-1, a cladding layer 140 is formed over the sidewalls 114c of the multilayer structure 114, in accordance with some embodiments.

The cladding layer 140 is used to reserve a space for a gate stack formed in the subsequent process, in accordance with some embodiments.

The sacrificial layers 114a', the thick sacrificial layer 114a1, and the cladding layer 140 are made of the same first material, in accordance with some embodiments. The channel layers 114b' are made of a second material, in accordance with some embodiments. The first material is different from the second material, in accordance with some embodiments.

The cladding layer 140 is made of a semiconductor material such as SiGe, Si, and/or germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof, in accordance with some embodiments.

The cladding layer 140 is formed using an epitaxial growth process such as a molecular beam epitaxy (MBE) process, a metal-organic chemical vapor deposition (MOCVD) process, and/or another suitable epitaxial growth process.

Figure 1F:
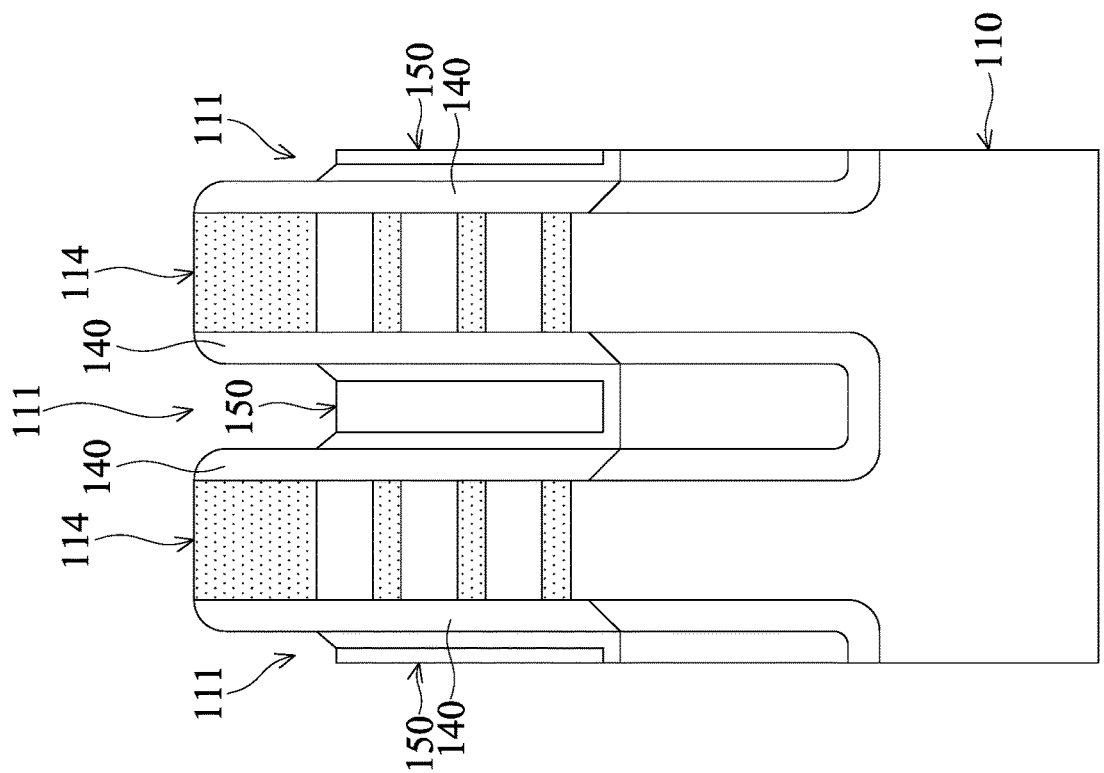
Figure 1E:
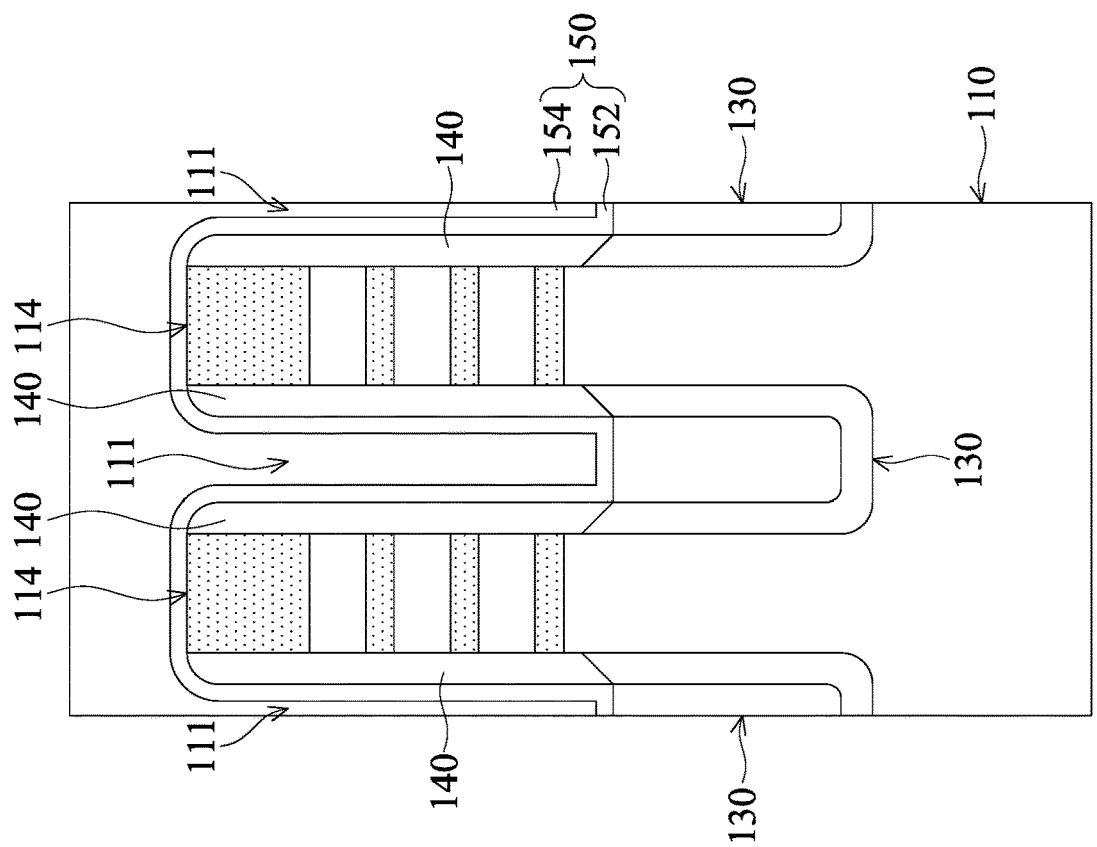

As shown in FIG. 1E, a liner layer 152 is conformally formed over the isolation structure 130, the cladding layer 140, and the multilayer structure 114, in accordance with some embodiments. As shown in FIG. 1E, a dielectric layer 154 is formed over the liner layer 152 and in the trenches 111, in accordance with some embodiments. The liner layer 152 and the dielectric layer 154 together form an isolation structure 150, in accordance with some embodiments.

The liner layer 152 is made of oxides (e.g., silicon oxide), nitrides (e.g., silicon nitride), or another suitable dielectric material, in accordance with some embodiments. The dielectric layer 154 is made of oxide (such as silicon oxide), fluorosilicate glass (FSG), a low-k dielectric material, and/or another suitable dielectric material. In some embodiments, the liner layer 152 and the dielectric layer 154 are made of different materials.

The liner layer 152 may be deposited by an atomic layer deposition (ALD) process, a chemical vapor deposition (CVD) process, or another applicable process. The dielectric layer 154 may be deposited by a chemical vapor deposition process, an atomic layer deposition process, a physical vapor deposition (PVD) process, or another applicable process.

As shown in FIG. 1F, an upper portion of the isolation structure 150 is removed, in accordance with some embodiments. The removal process includes an etching process such as a dry etching process or a wet etching process, in accordance with some embodiments.

Figure 1H:
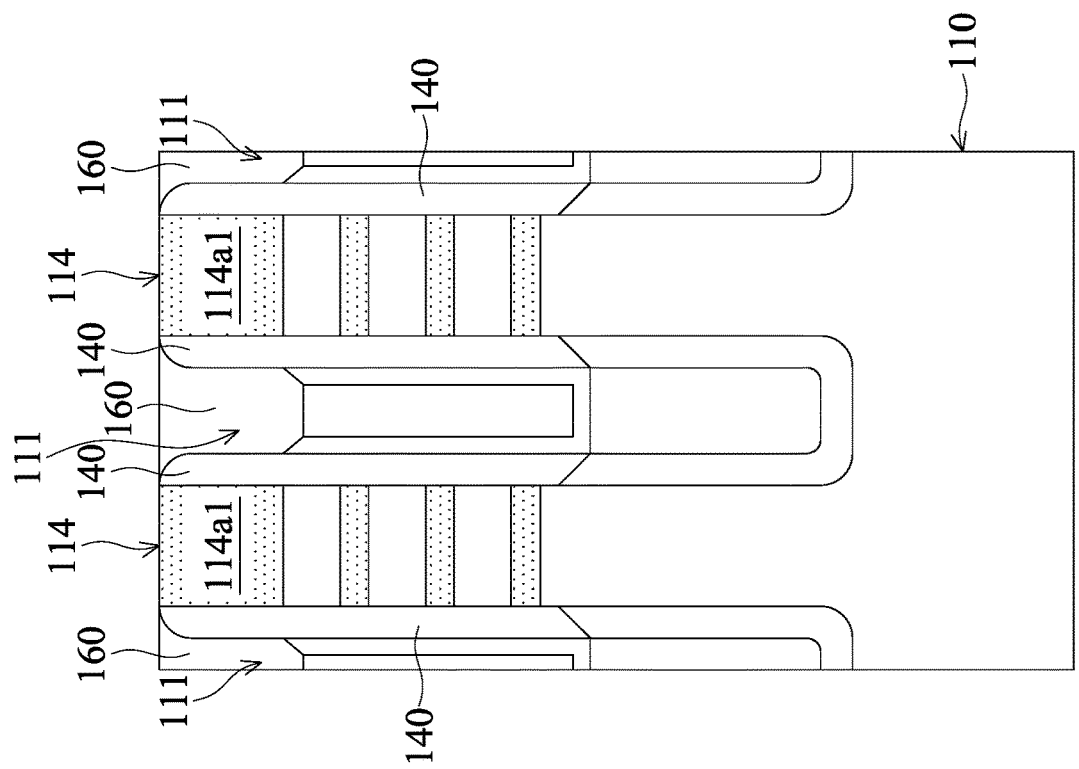
Figure 1G:
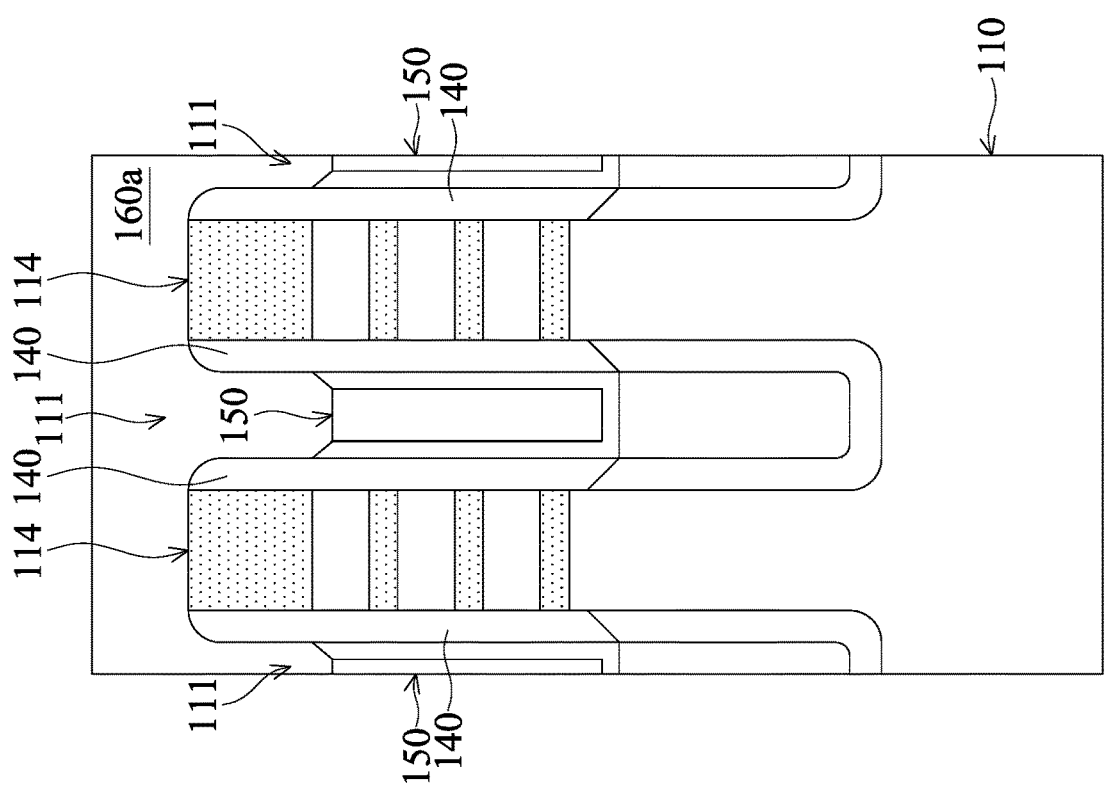

As shown in FIG. 1G, a dielectric layer 160a is formed over the isolation structure 150, the cladding layer 140, and the multilayer structure 114 and in the trenches 111, in accordance with some embodiments. The dielectric layer 160a is made of a dielectric material, such as a high dielectric constant (high-k) material, in accordance with some embodiments. The term "high-k material" means a material having a dielectric constant greater than the dielectric constant of silicon dioxide, in accordance with some embodiments.

The high-k material includes metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina ($HfO_2$—$Al_2O_3$) alloy, other suitable high-k dielectric materials, or combinations thereof, in accordance with some embodiments.

In some other embodiments, the high-k material includes metal nitrides, metal silicates, transition metal-oxides, transition metal-nitrides, transition metal-silicates, oxynitrides of metals, other suitable materials, or combinations thereof.

The dielectric layer 160a is formed using a deposition process such as a physical vapor deposition process, a chemical vapor deposition process, an atomic layer deposition process, or the like, in accordance with some embodiments.

As shown in FIGS. 1G and 1H, portions of the dielectric layer 160a outside of the trenches 111 are removed, in accordance with some embodiments. After the removal process, the remaining dielectric layer 160a in the trenches 111 forms dielectric fins 160, in accordance with some embodiments. The removal process includes a planarization process such as a chemical mechanical polishing process, in accordance with some embodiments.

Figure 1J:
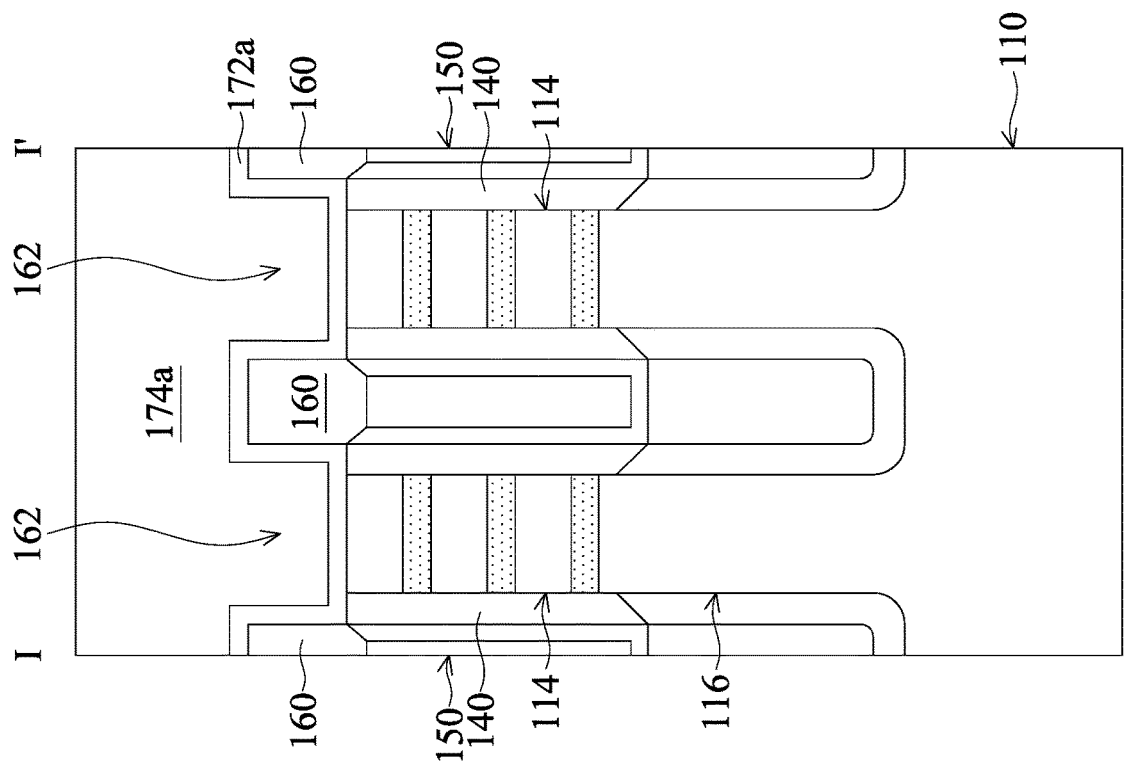
Figure 1I:
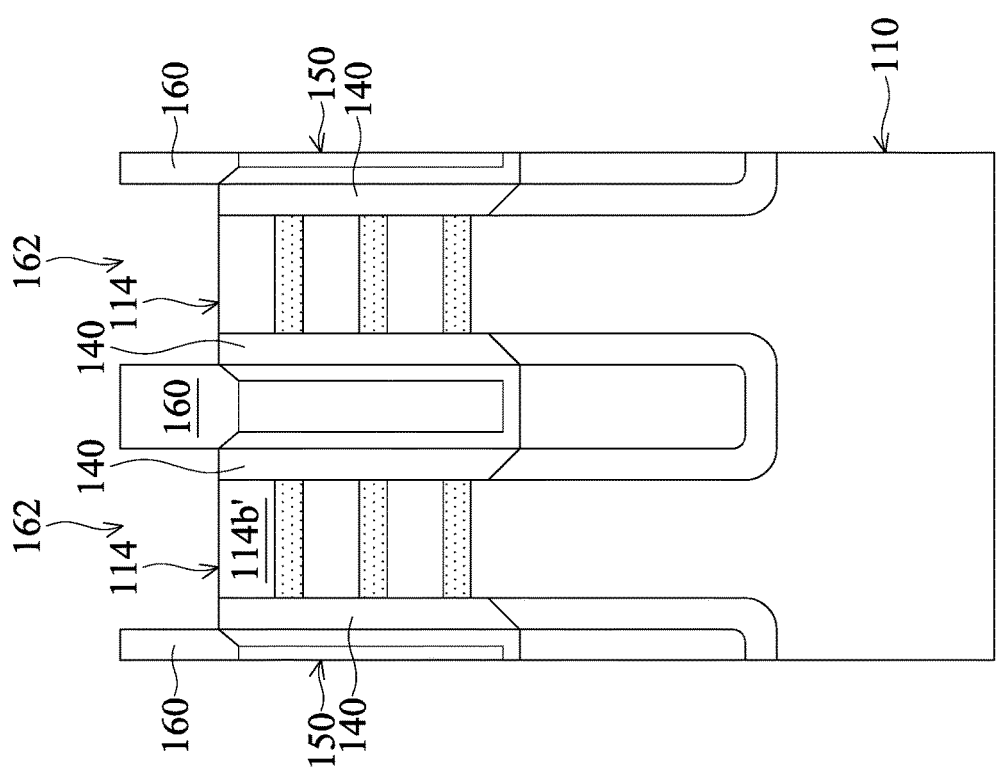

As shown in FIG. 1I, the thick sacrificial layer 114a1 and upper portions of the cladding layer 140 are removed, in accordance with some embodiments. After the removal process, trenches 162 are formed between the dielectric fins 160, in accordance with some embodiments. The trenches 162 expose the multilayer structure 114 and the cladding layer 140 thereunder, in accordance with some embodiments. The removal process includes an etching process such as a wet etching process or a dry etching process, in accordance with some embodiments.

Figures 1, 1J, 2:
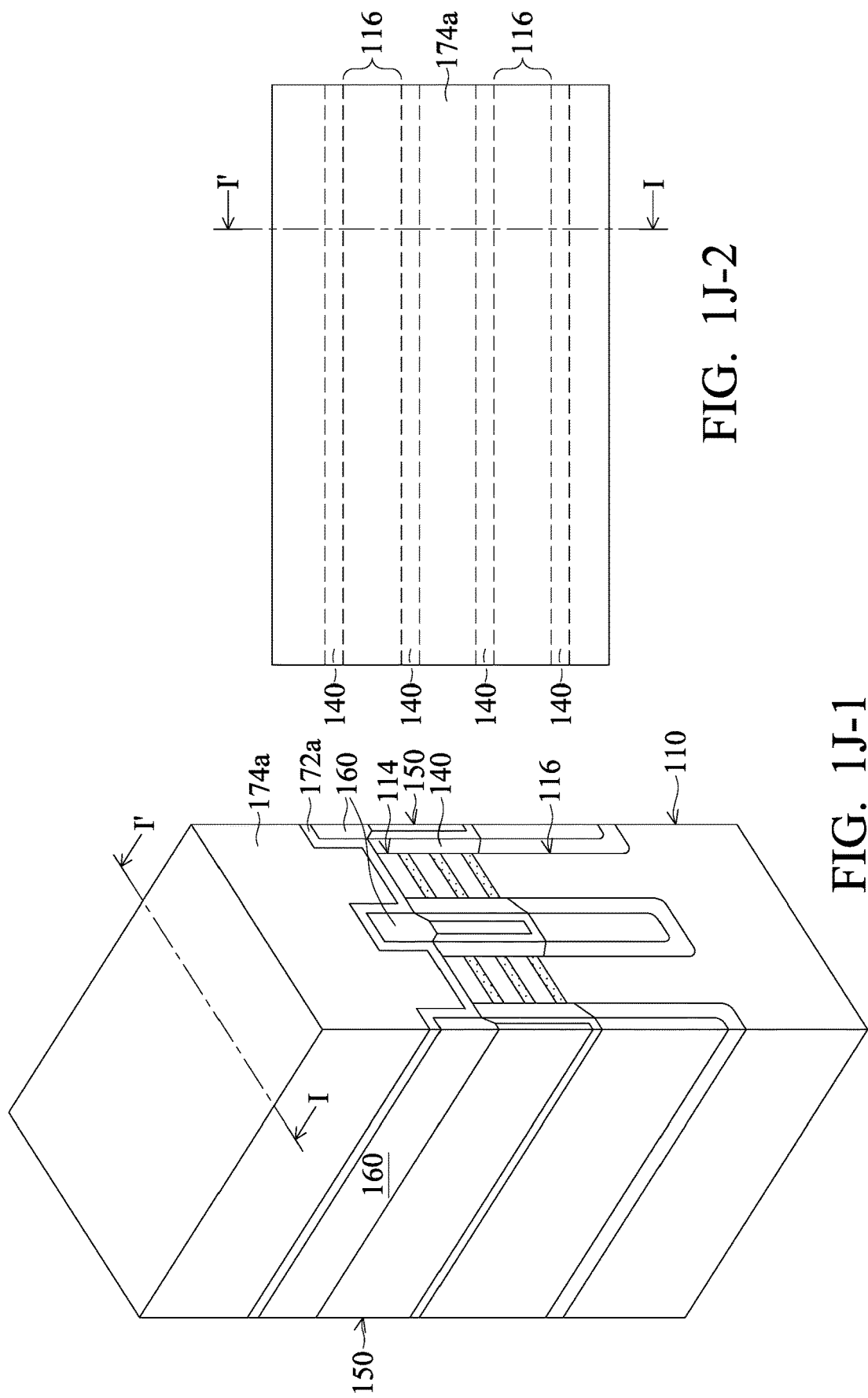

FIGS. 1J-1 is a perspective view of the semiconductor device structure of FIG. 1J, in accordance with some embodiments. FIG. 1J-2 is a top view of the semiconductor device structure of FIG. 1J, in accordance with some embodiments. FIG. 1J is a cross-sectional view illustrating the semiconductor device structure along a sectional line I-I' in FIG. 1J-1 or FIG. 1J-2, in accordance with some embodiments.

As shown in FIGS. 1J, 1J-1, and 1J-2, a gate dielectric material layer 172a is conformally formed over the dielectric fins 160, the multilayer structure 114, and the cladding layer 140, in accordance with some embodiments. The gate dielectric material layer 172a is made of an insulating material, such as oxide (e.g., silicon oxide), in accordance with some embodiments.

The gate dielectric material layer 172a is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a physical vapor deposition (PVD) process, or another applicable process.

As shown in FIGS. 1J, 1J-1, and 1J-2, a gate electrode layer 174a is formed over the gate dielectric material layer 172a, in accordance with some embodiments. The gate electrode layer 174a is made of a semiconductor material (e.g. polysilicon) or a conductive material (e.g., metal or alloy), in accordance with some embodiments.

The gate electrode layer 174a is formed by a deposition process, such as a physical vapor deposition (PVD) process, a chemical vapor deposition (CVD) process, or another applicable process, in accordance with some embodiments.

Figure 2A:
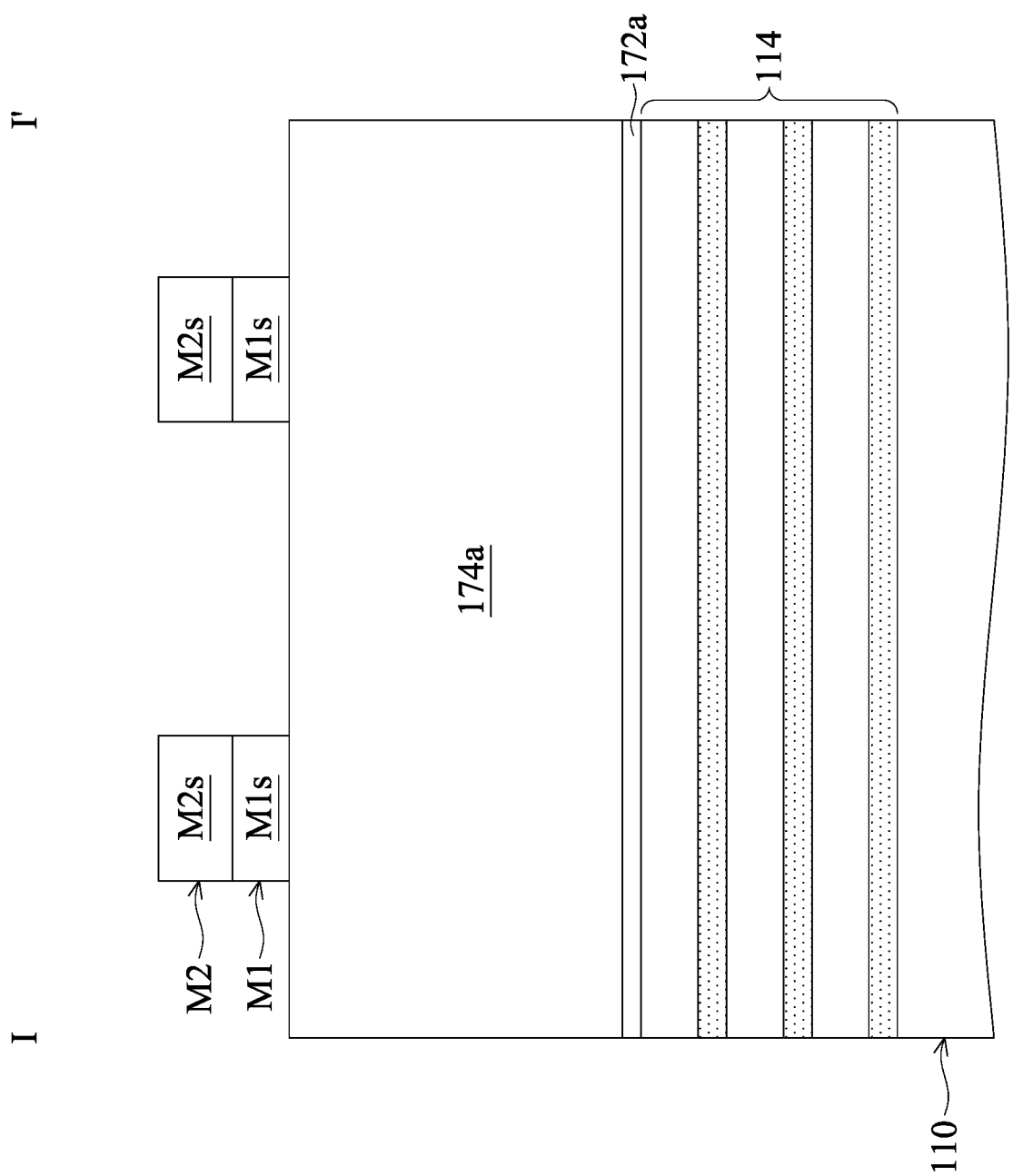
FIGS. 2A-2O are cross-sectional views of various stages of a process for forming a semiconductor device structure, in accordance with some embodiments.
Figures 2, 2B:
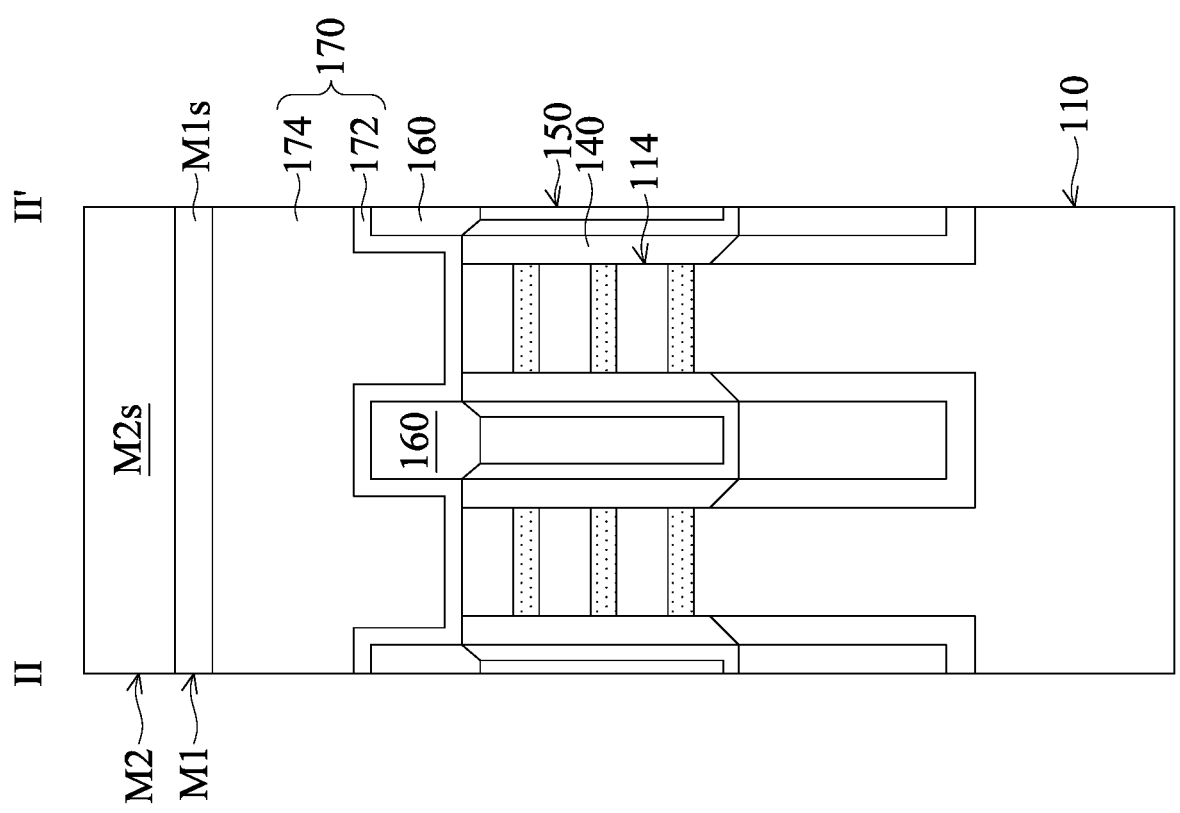
Figure 2D:
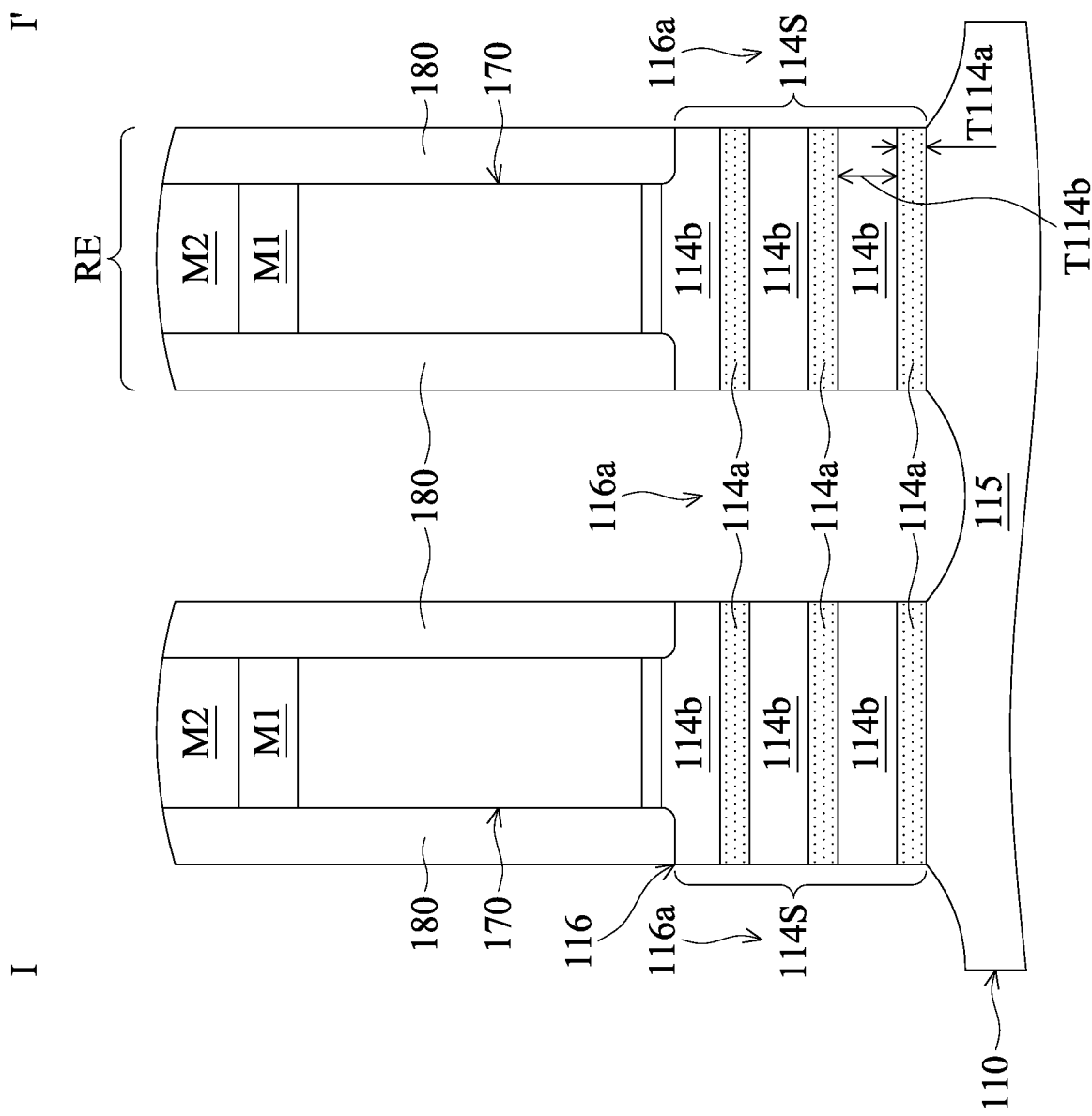
Figures 1, 2D:
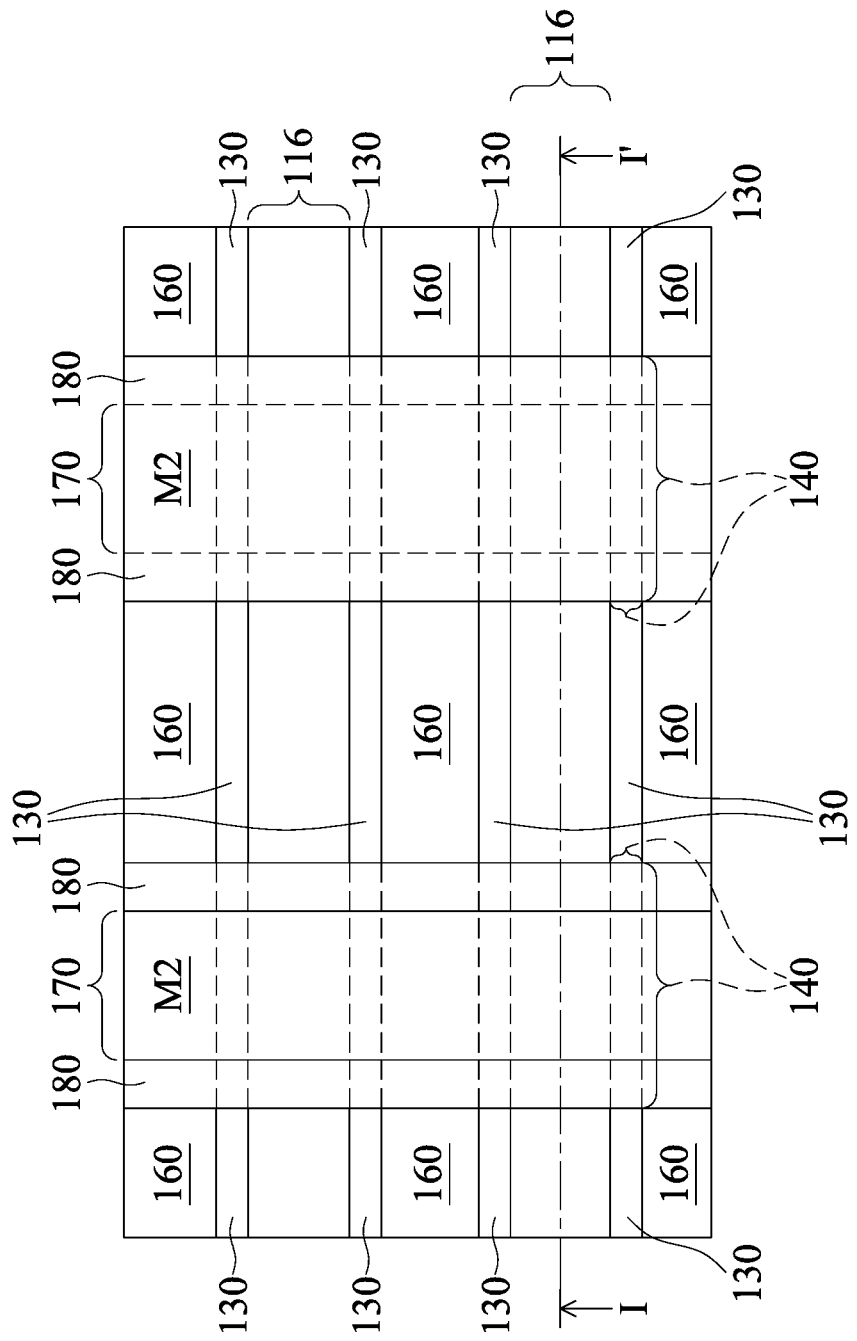
Figures 2, 2D:
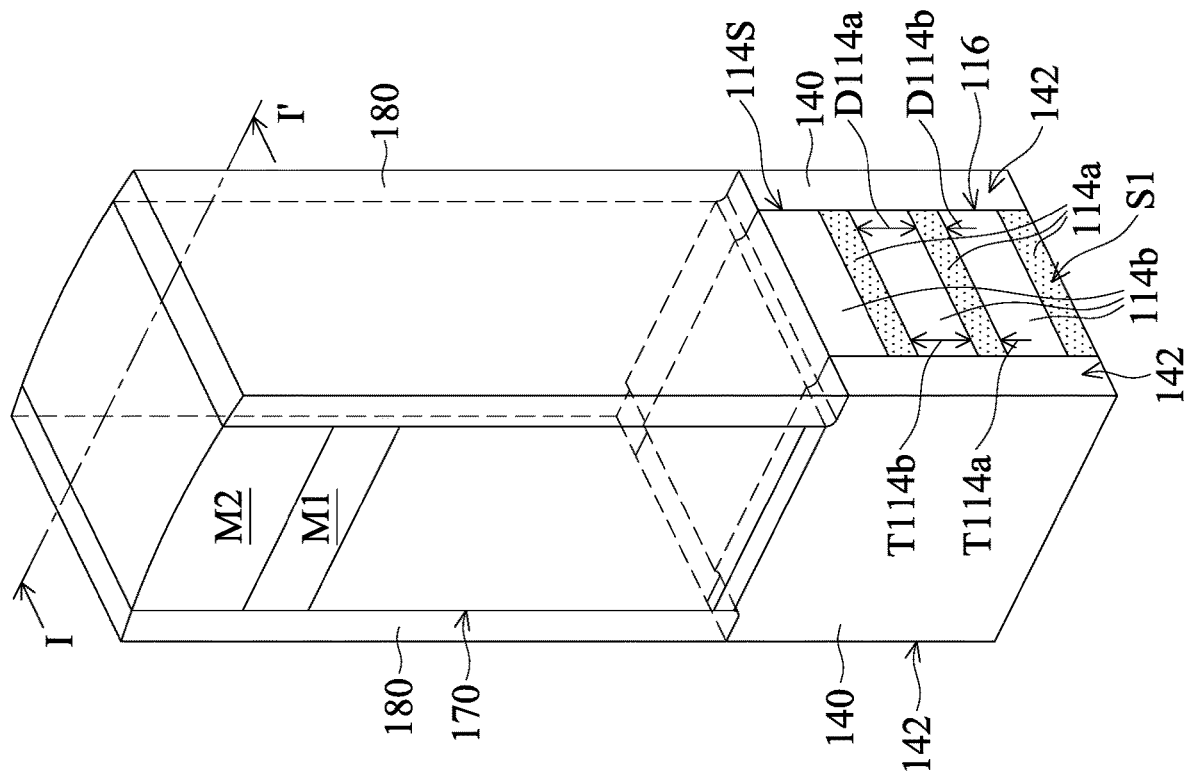
Figure 2E:
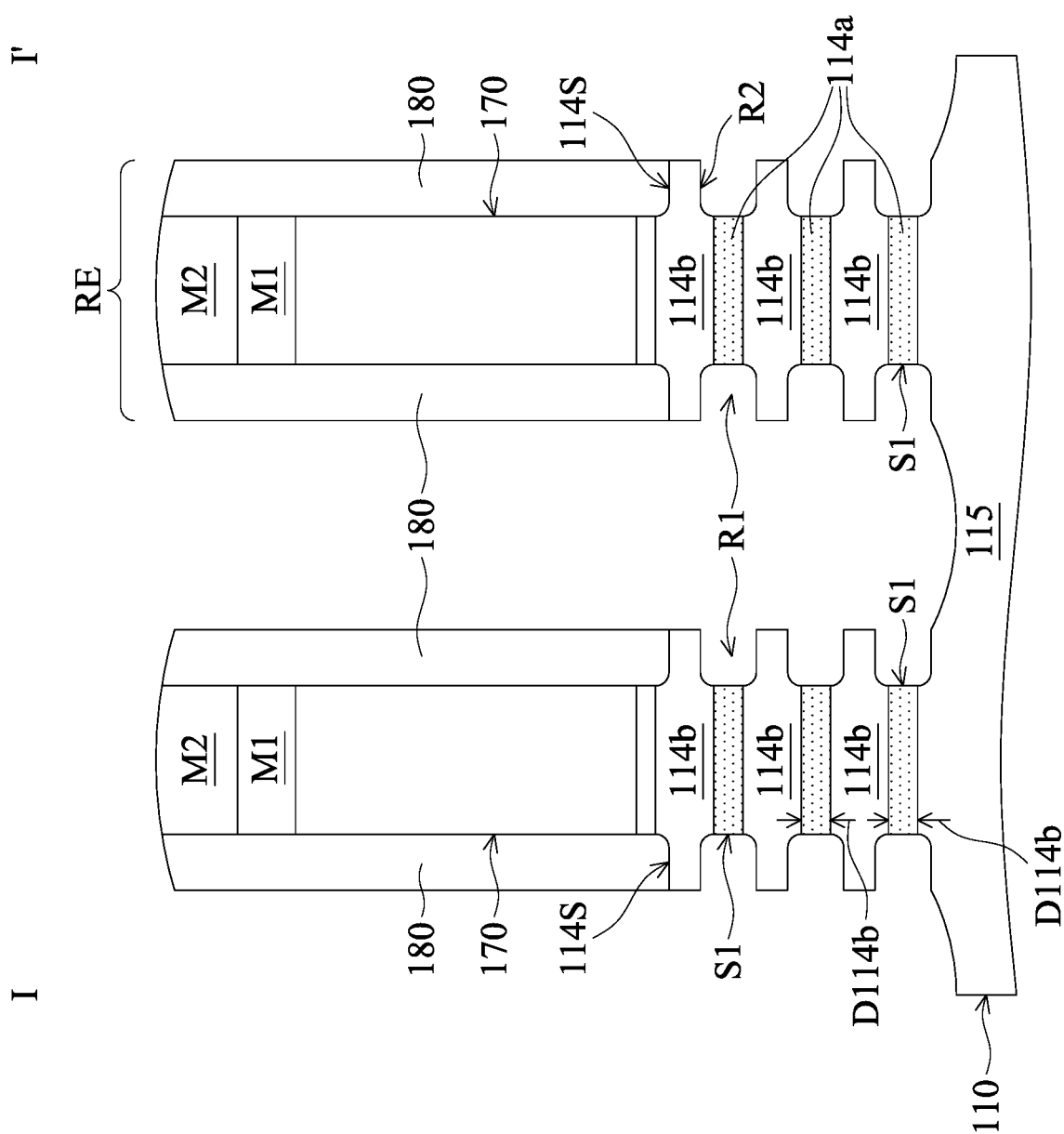
Figures 1, 2E:
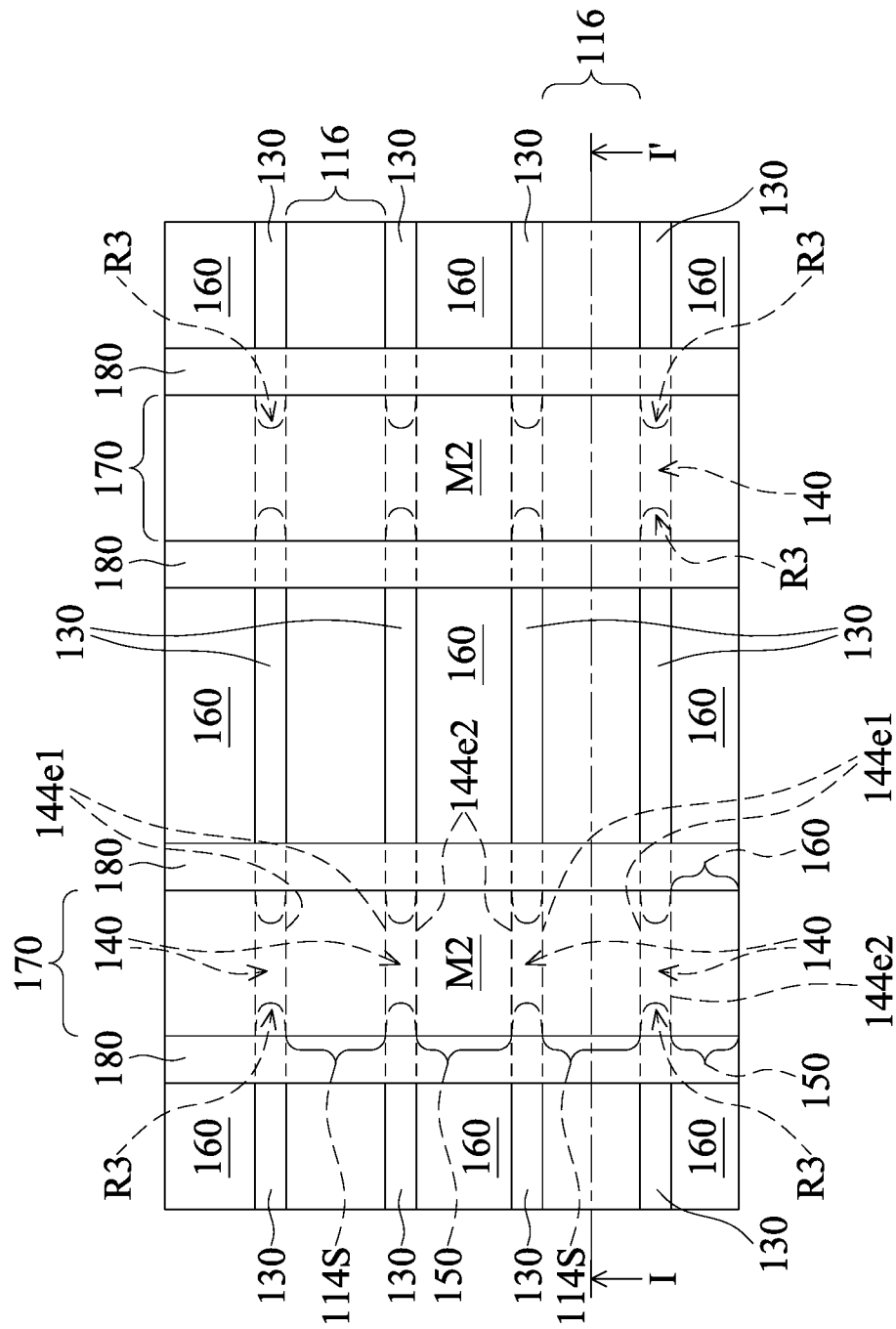
Figure 2G:
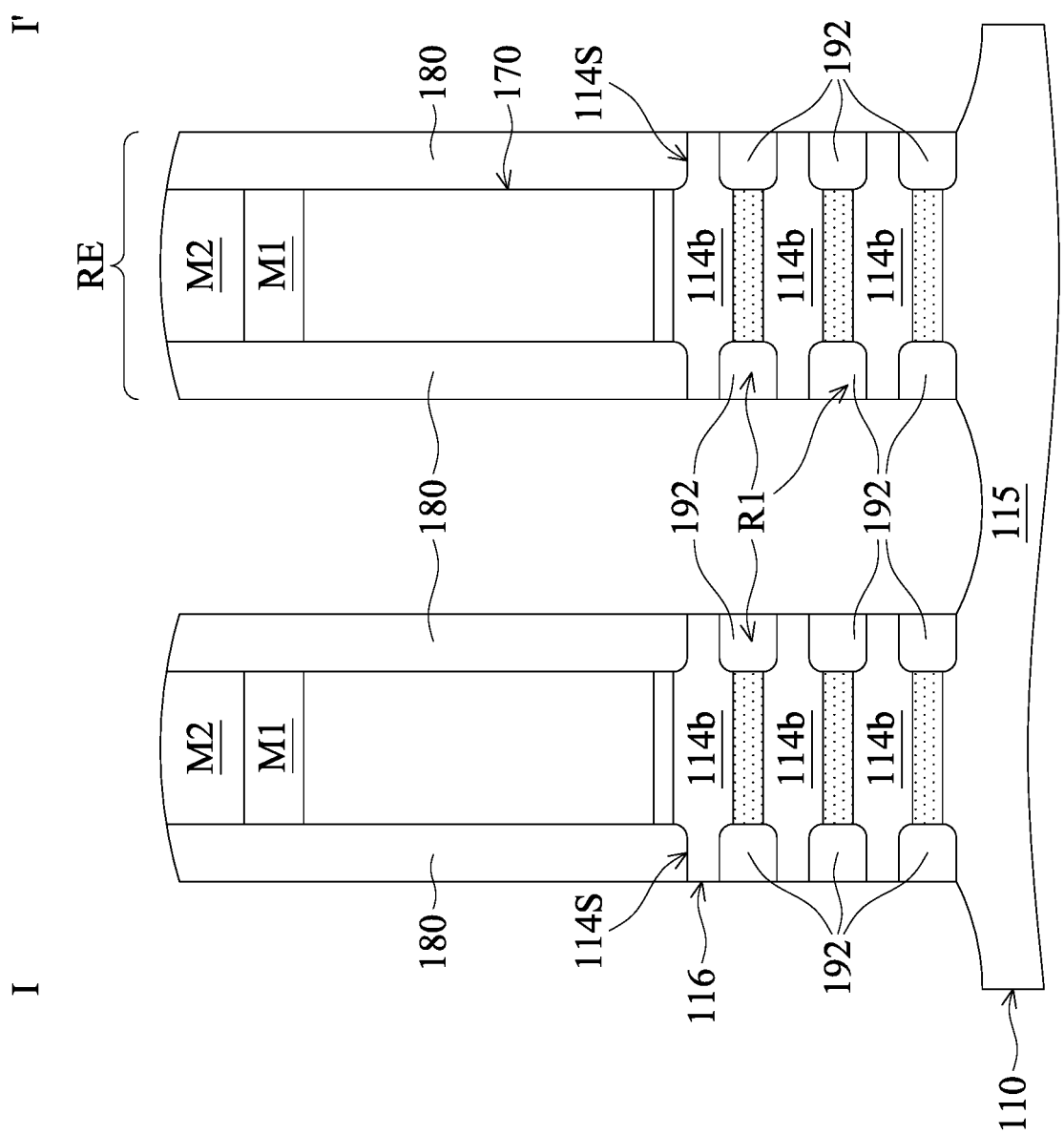
Figures 1, 2G:
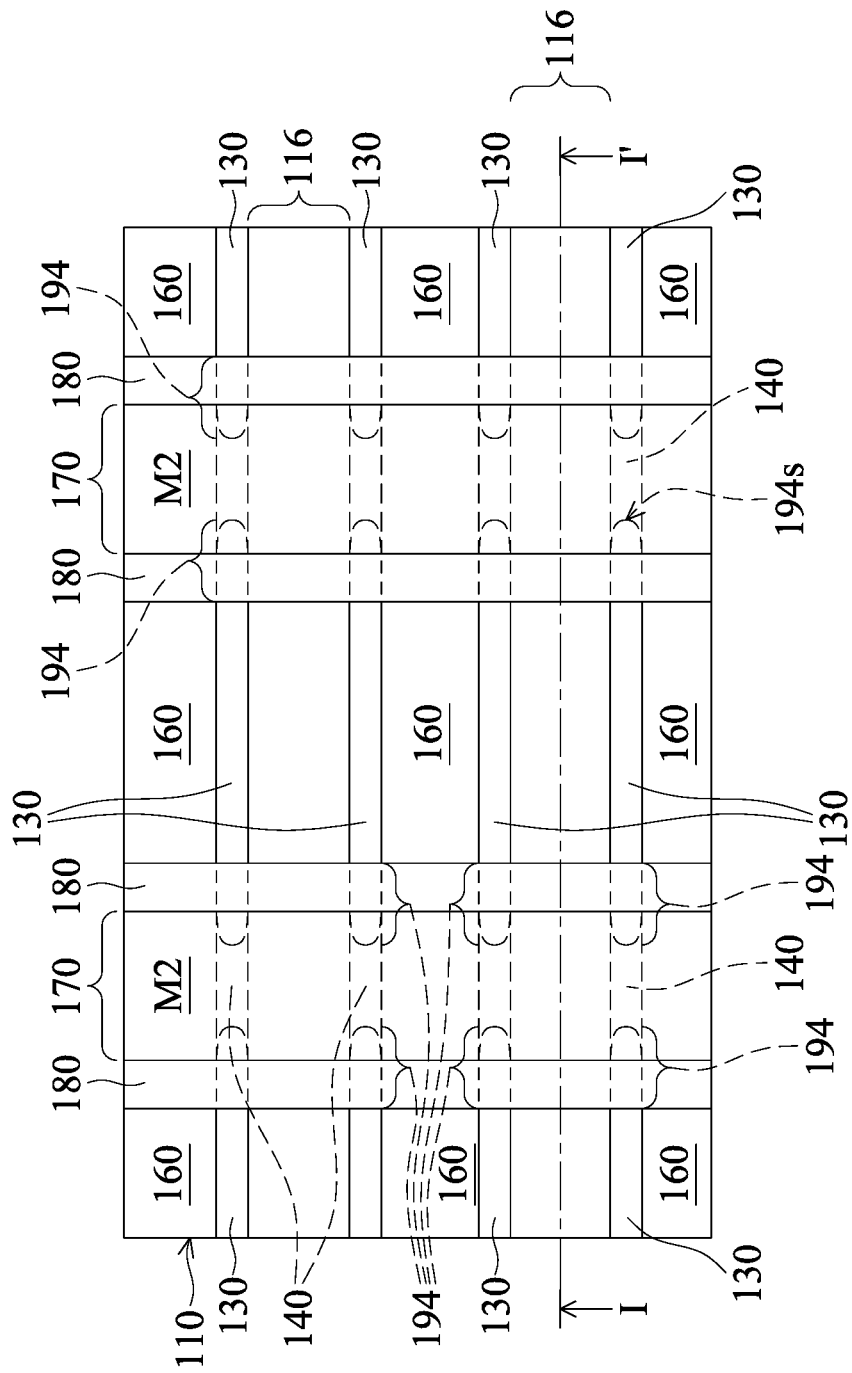
Figures 2, 2G, 3:
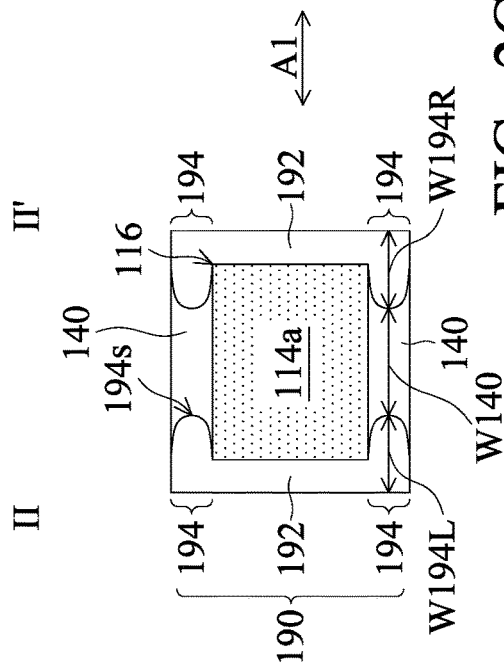
Figures 2, 2G, 3, 4:
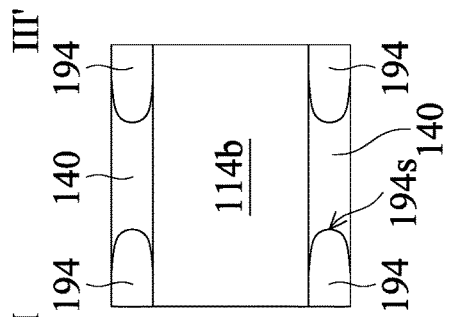
Figures 2, 2G:
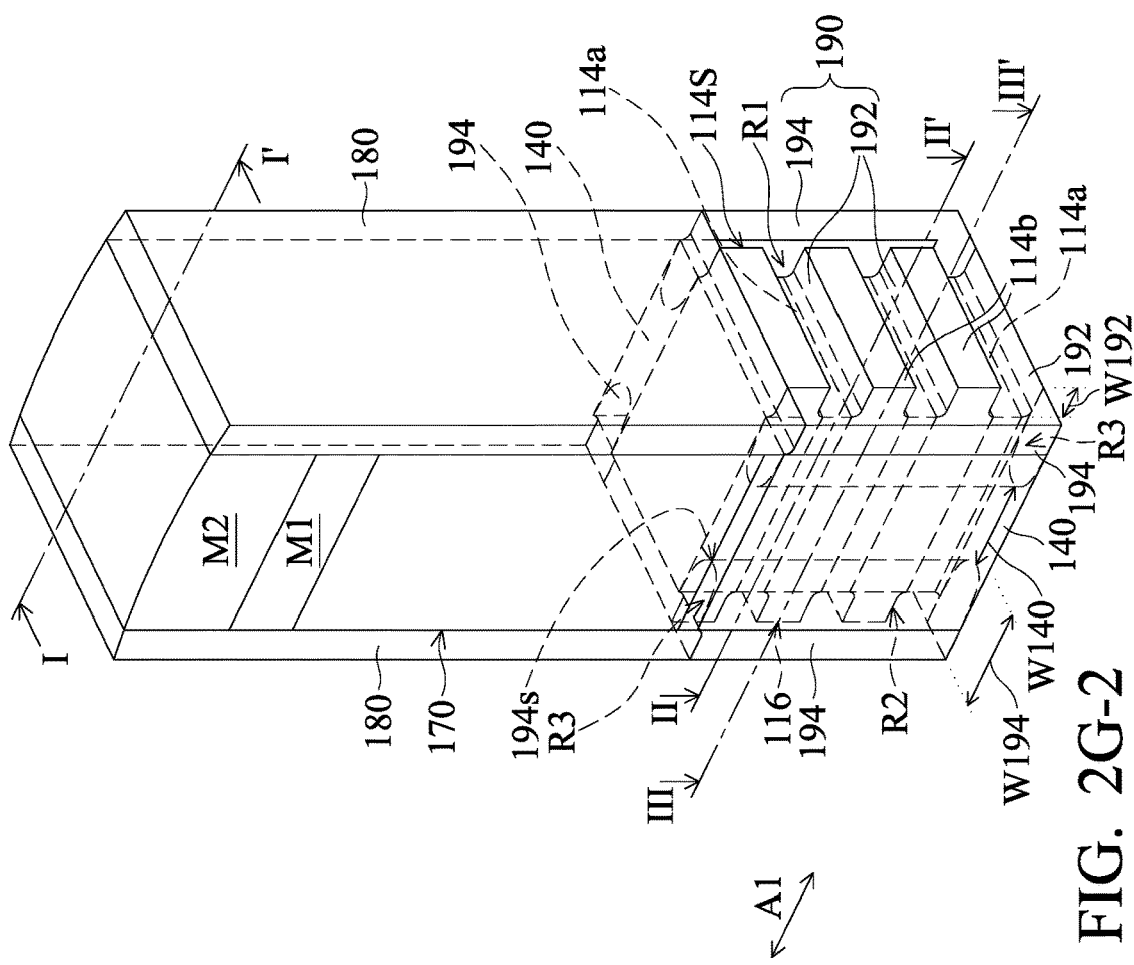
Figure 2H:
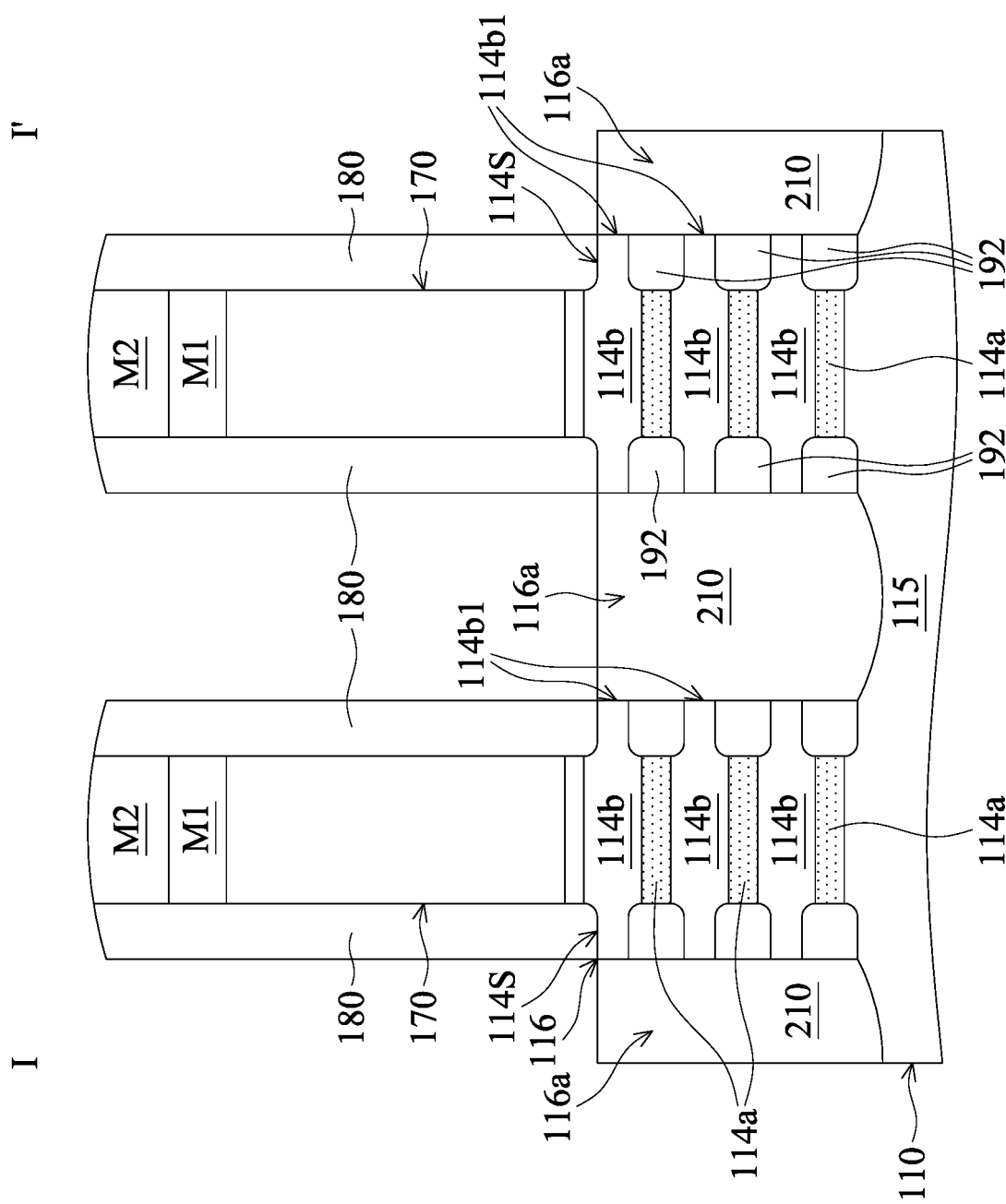
Figures 1, 2H:
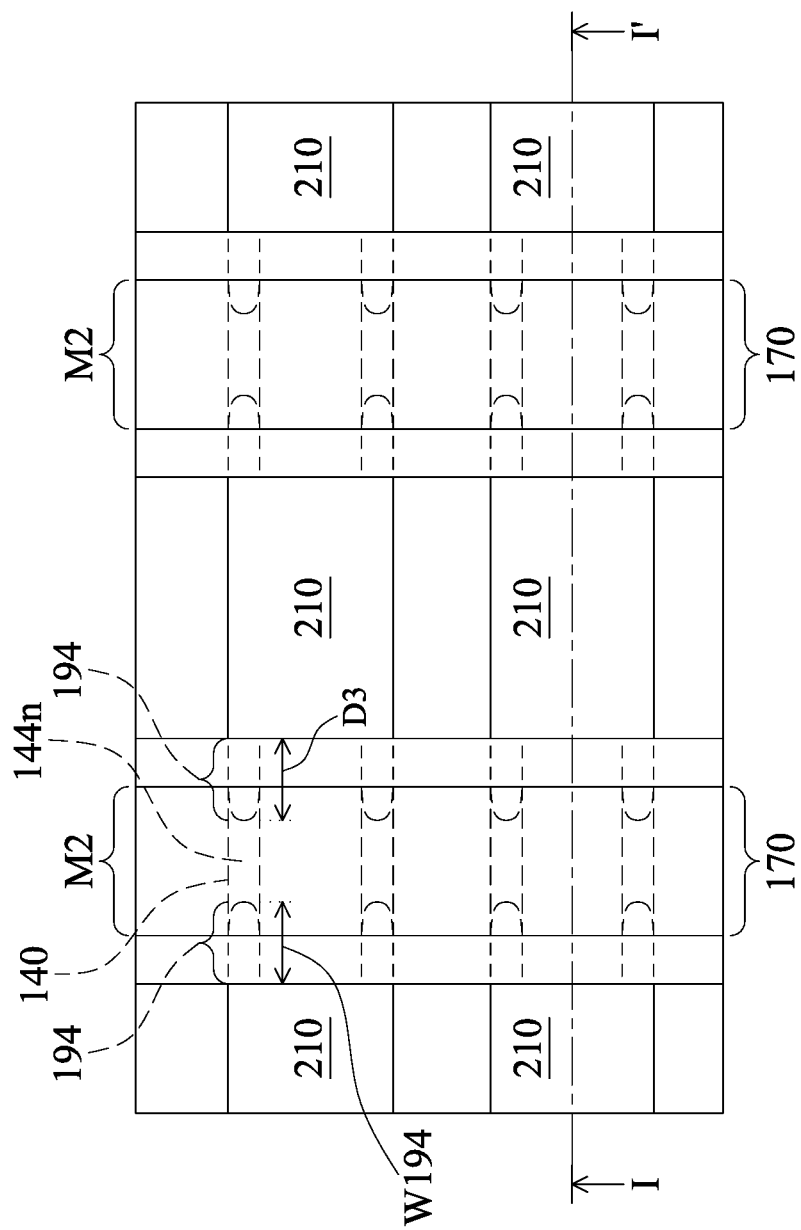
Figures 1, 2I:
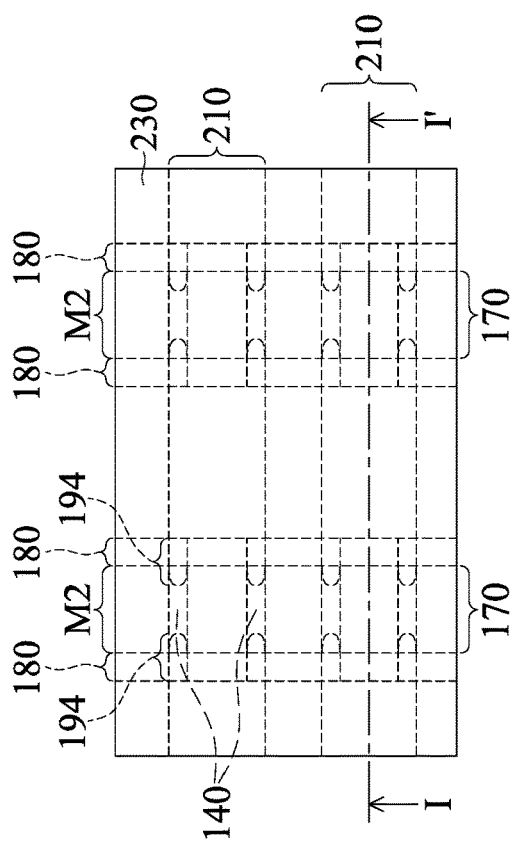
Figure 2I:
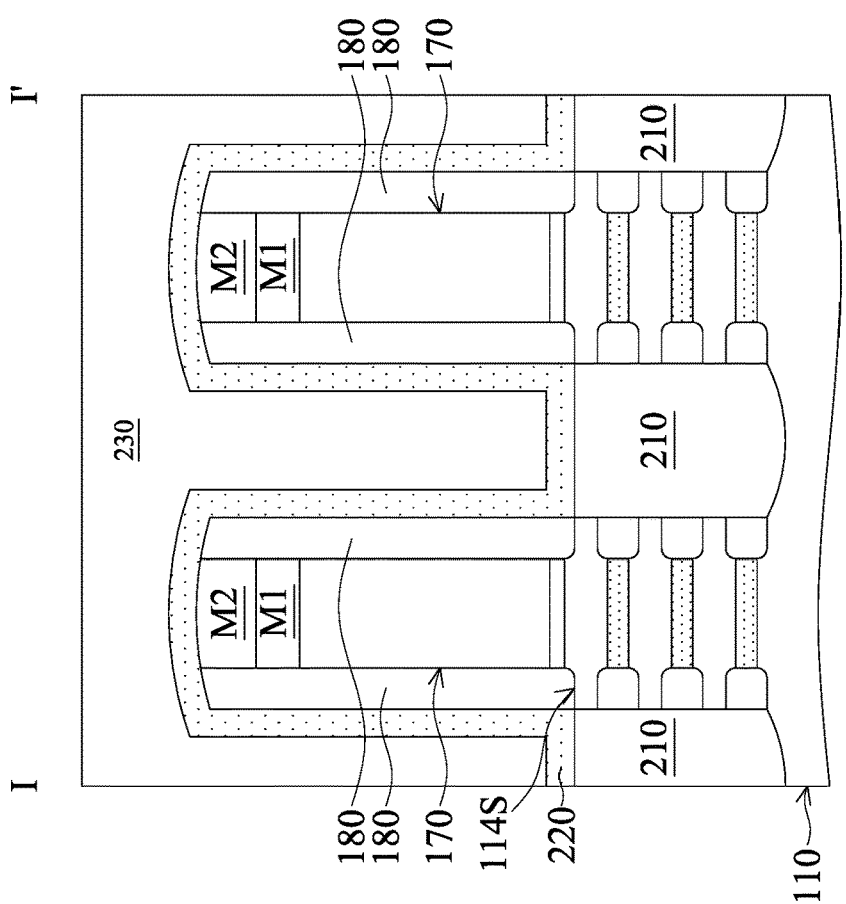
Figures 2, 2J:
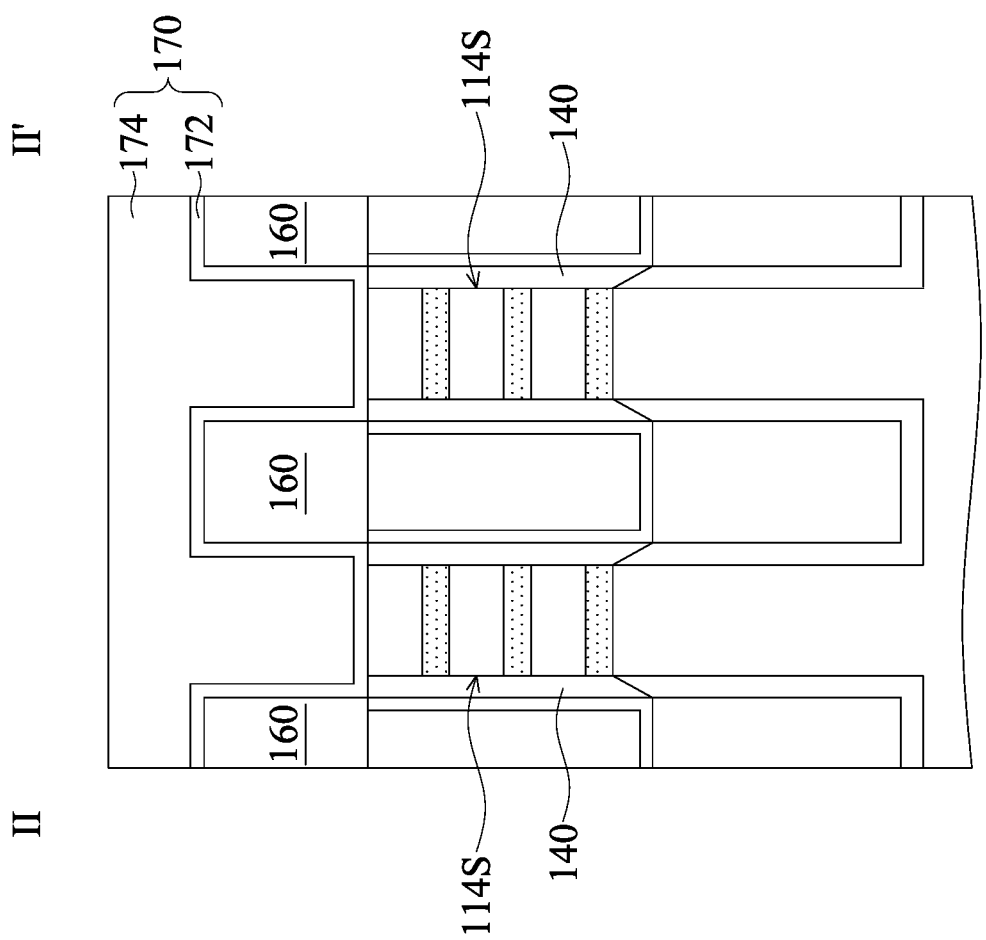
Figure 2K:
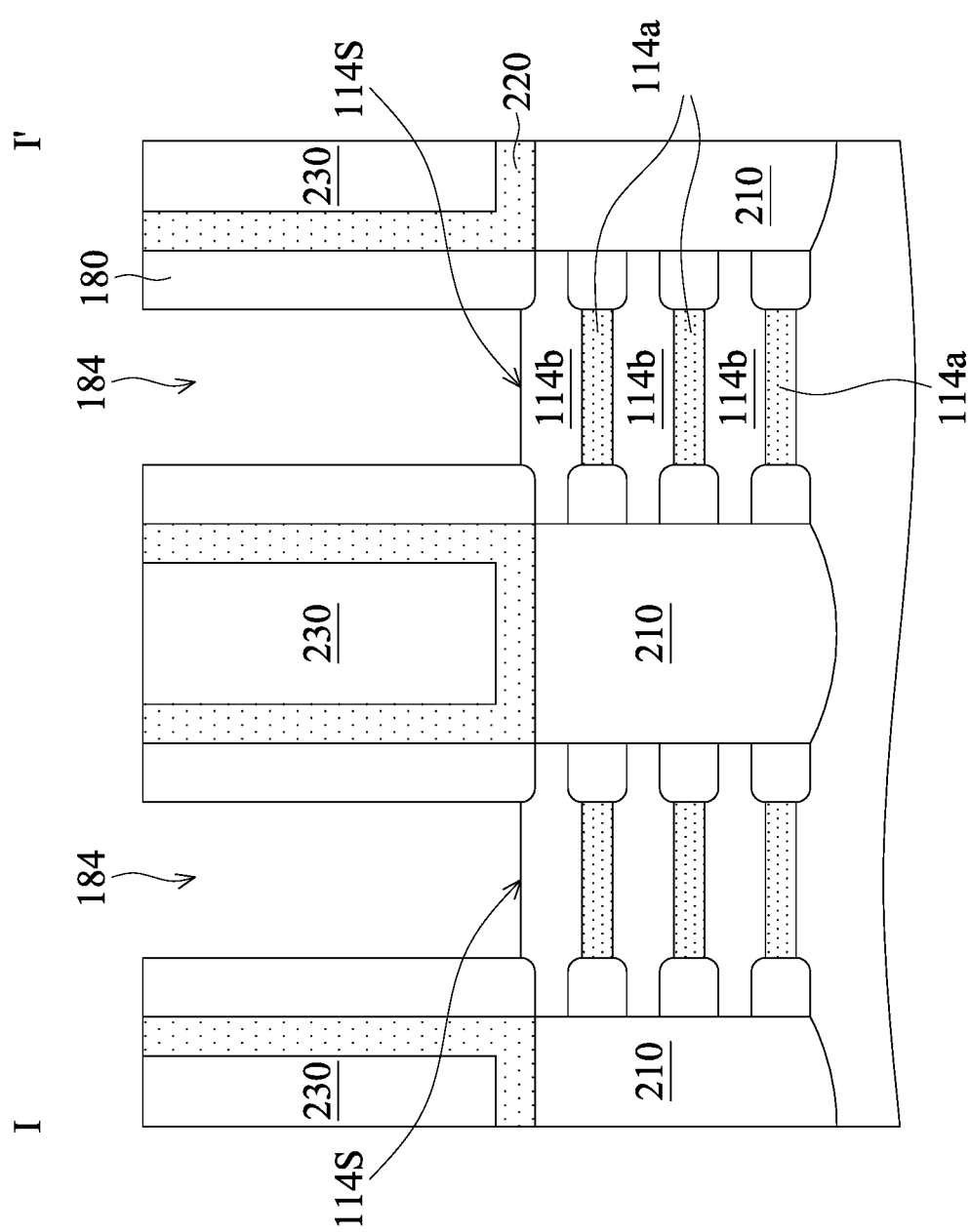
Figures 1, 2K:
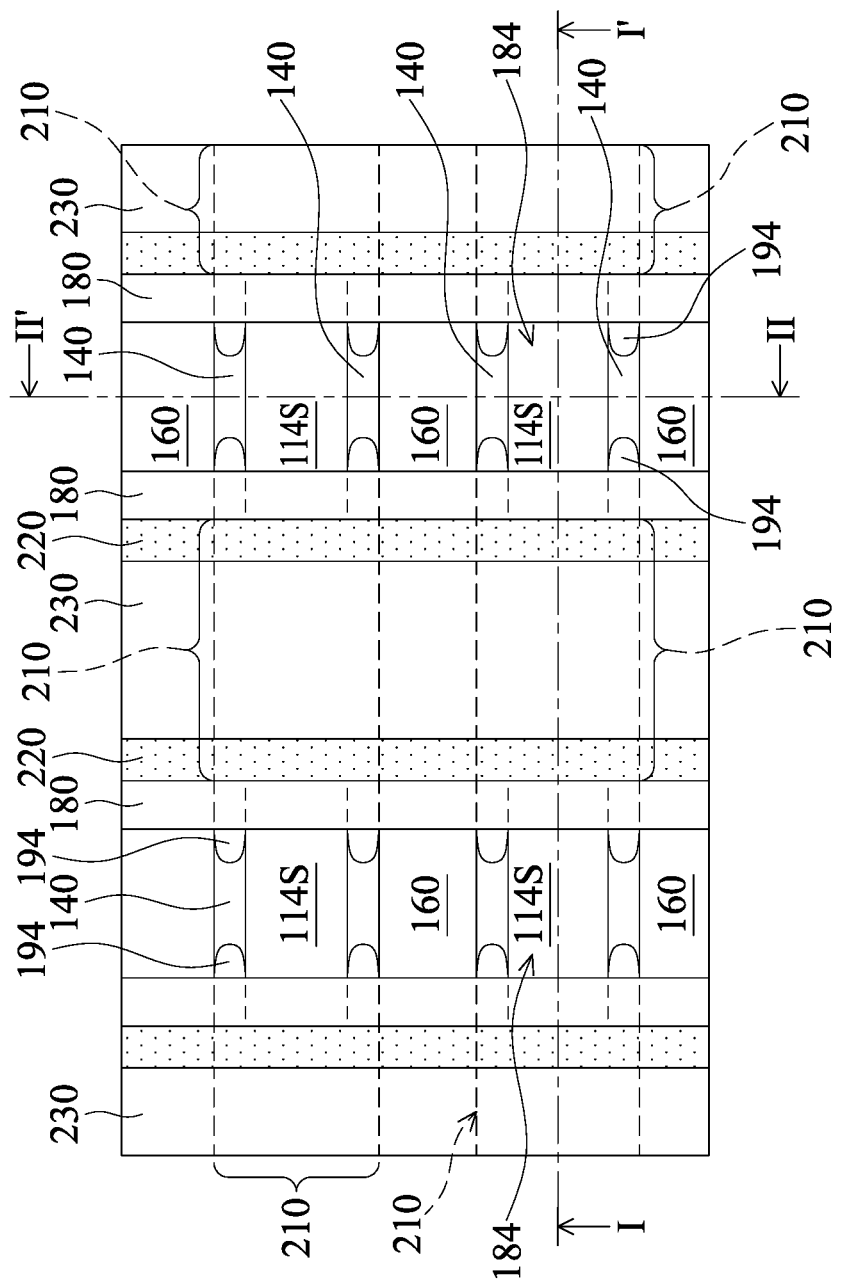
Figures 2, 2K:
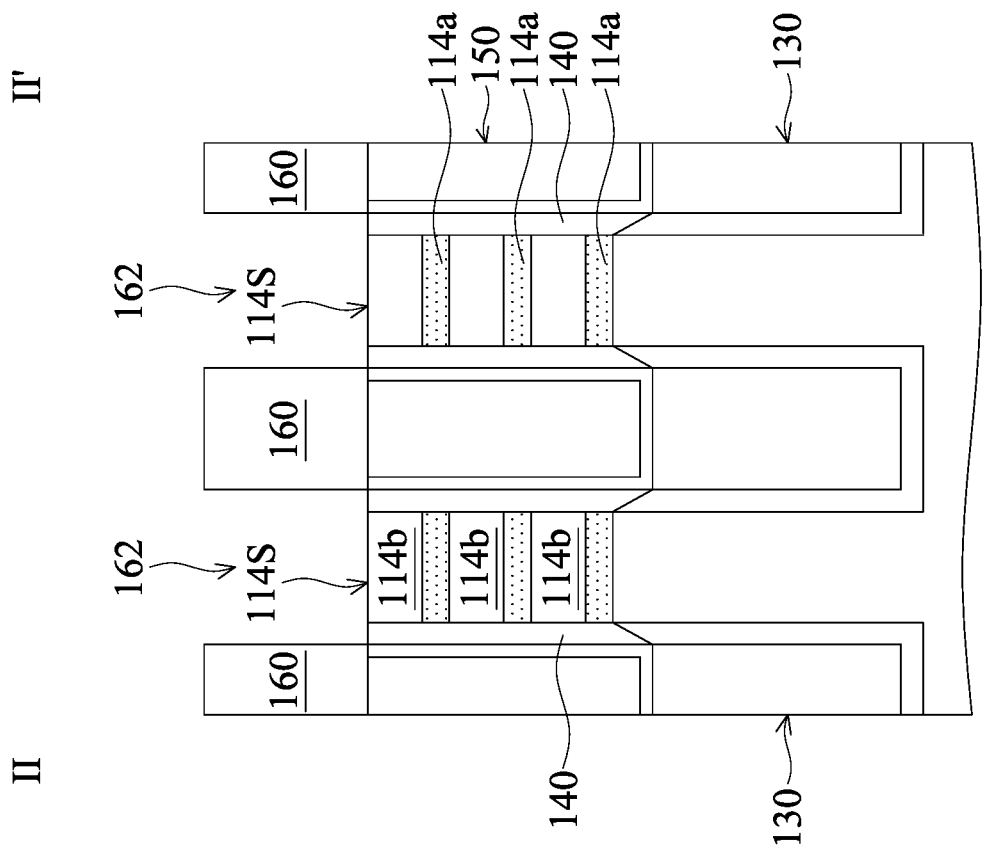
Figure 2L:
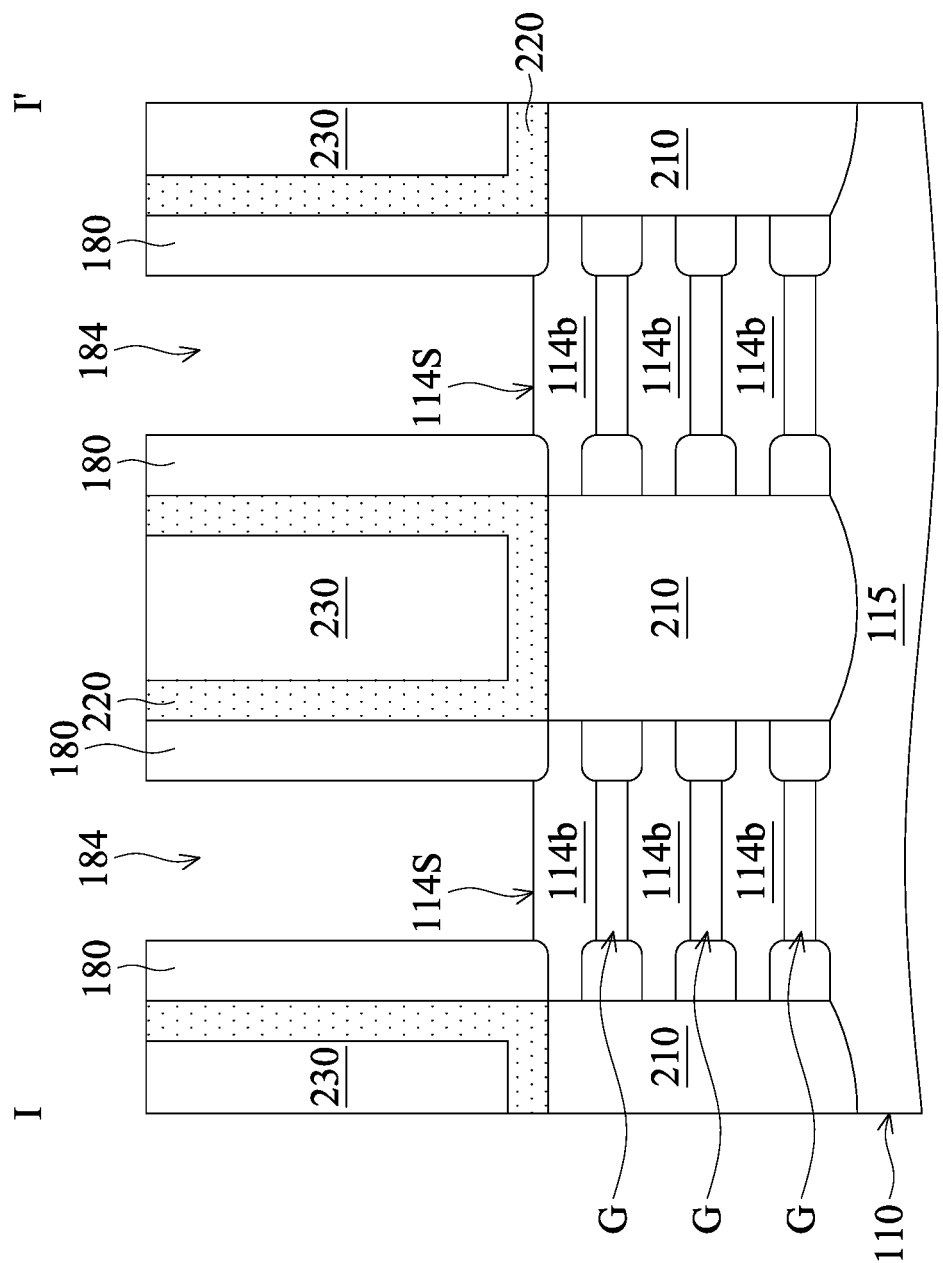
Figures 1, 2L:
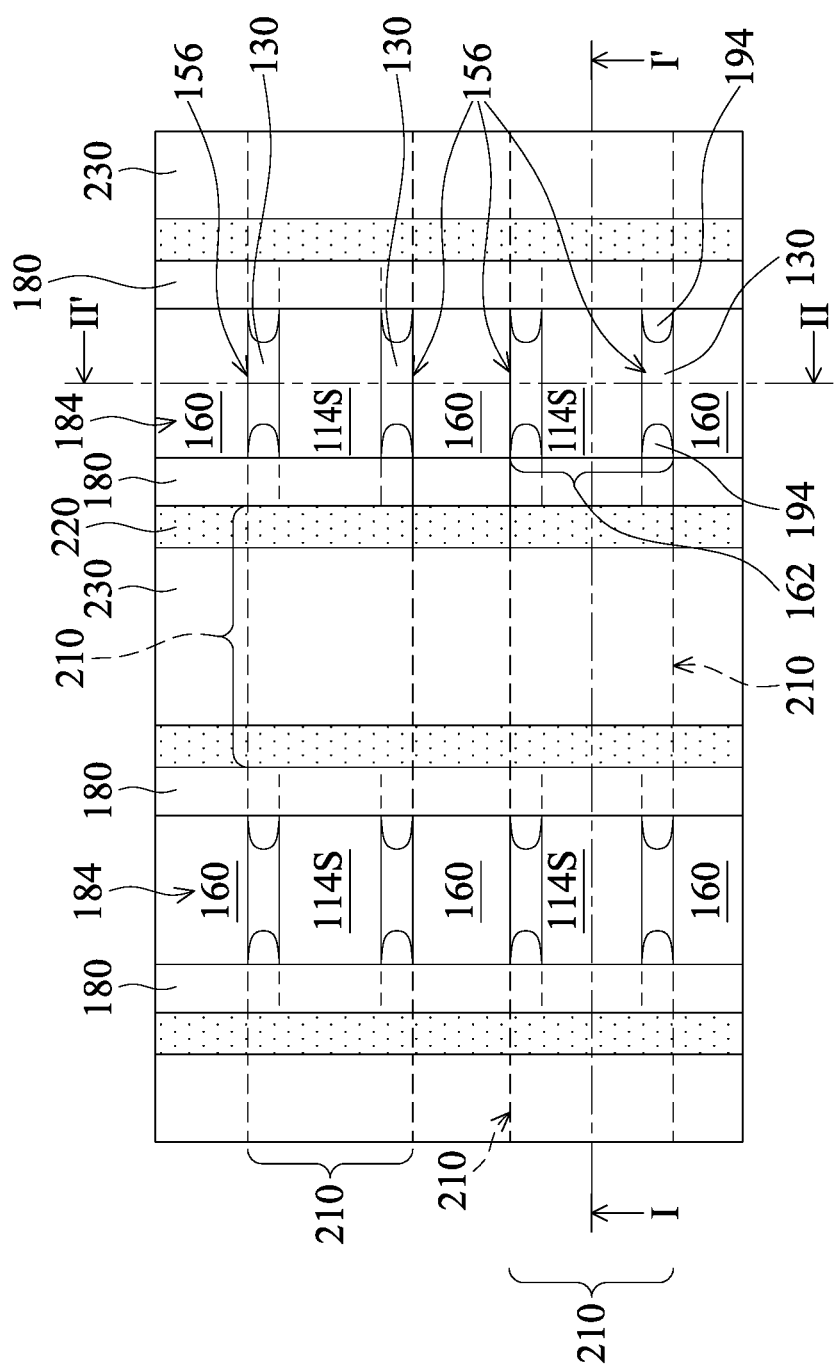
Figures 2, 2L:
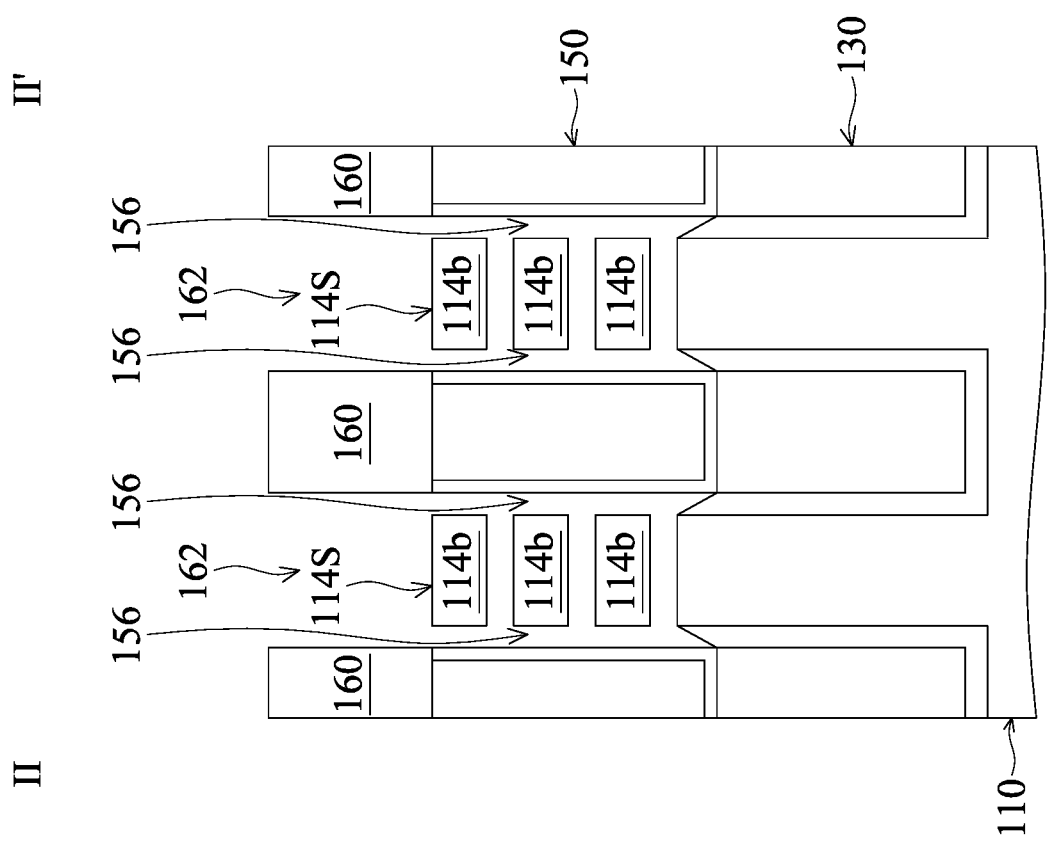
Figure 2M:
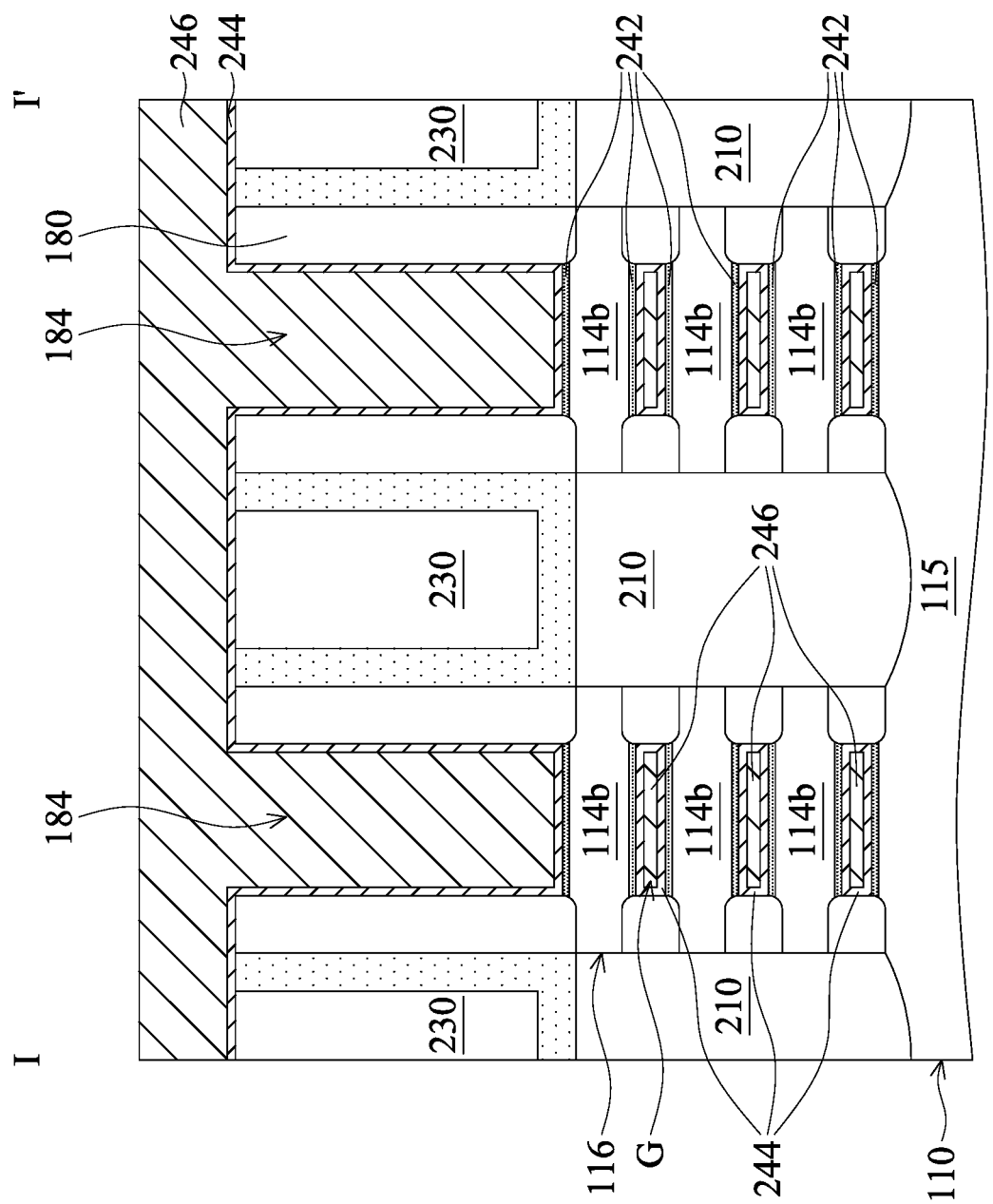
Figures 1, 2M:
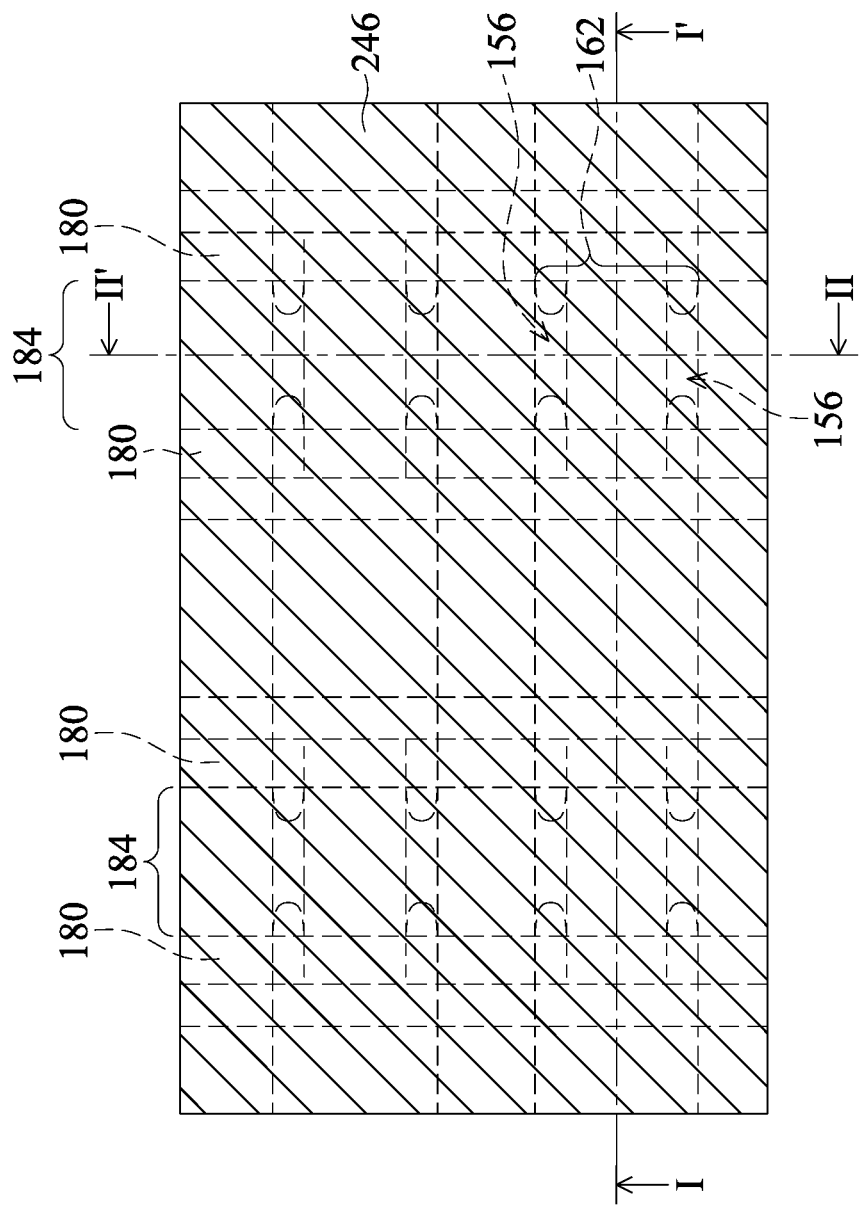
Figures 2, 2M:
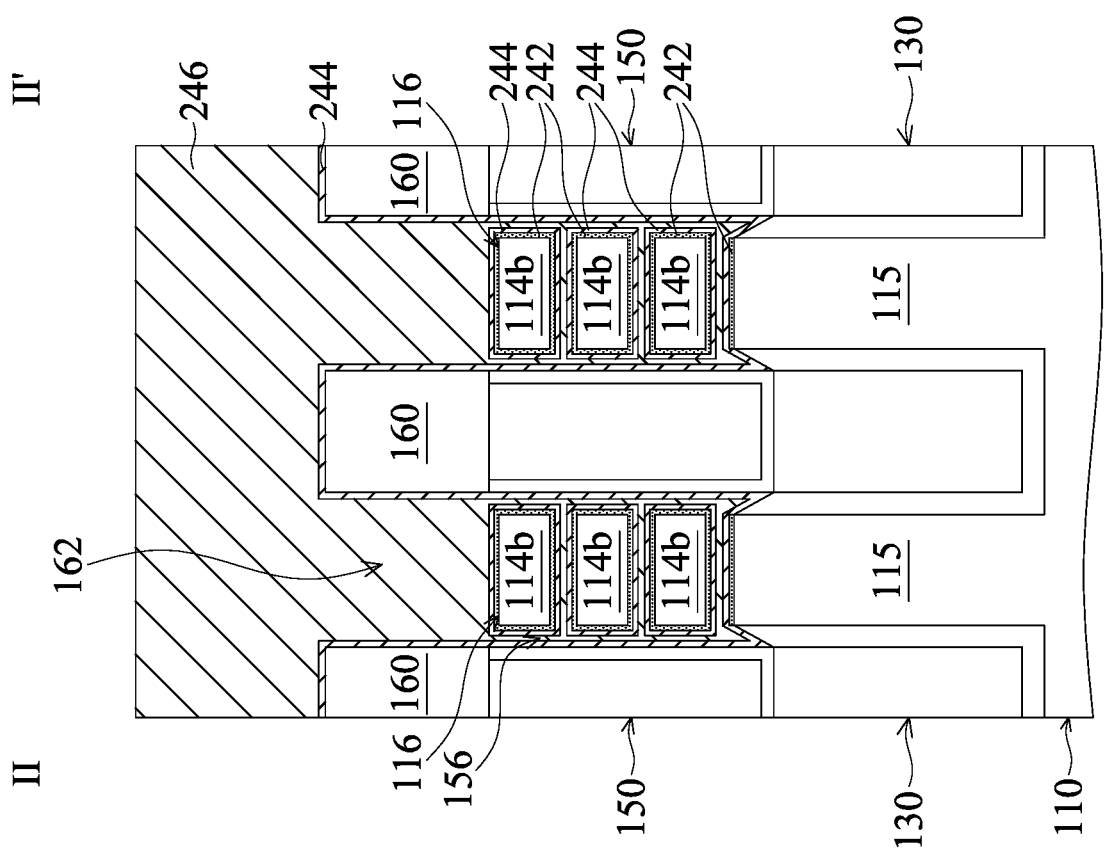
Figure 2N:
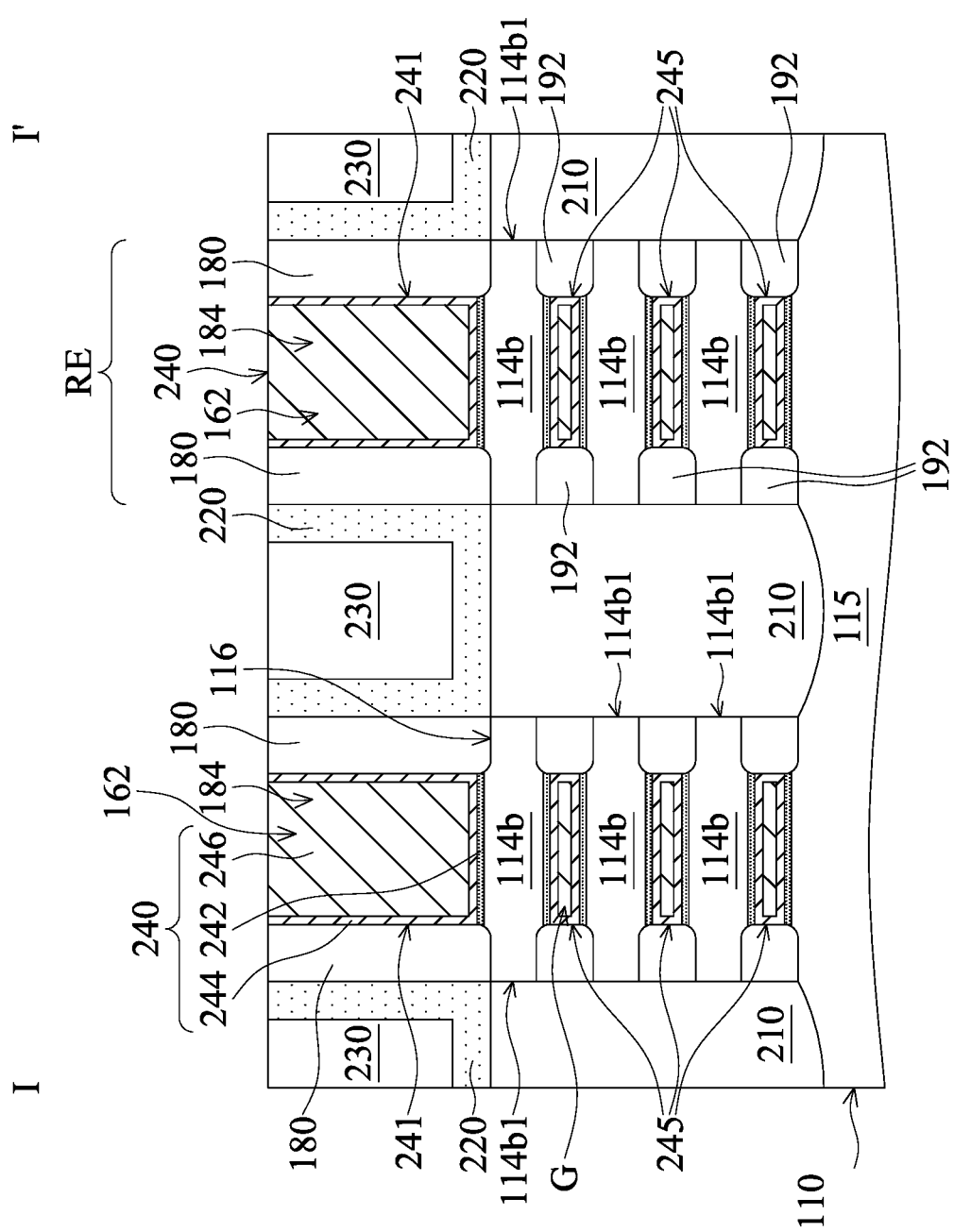
Figures 1, 2N:
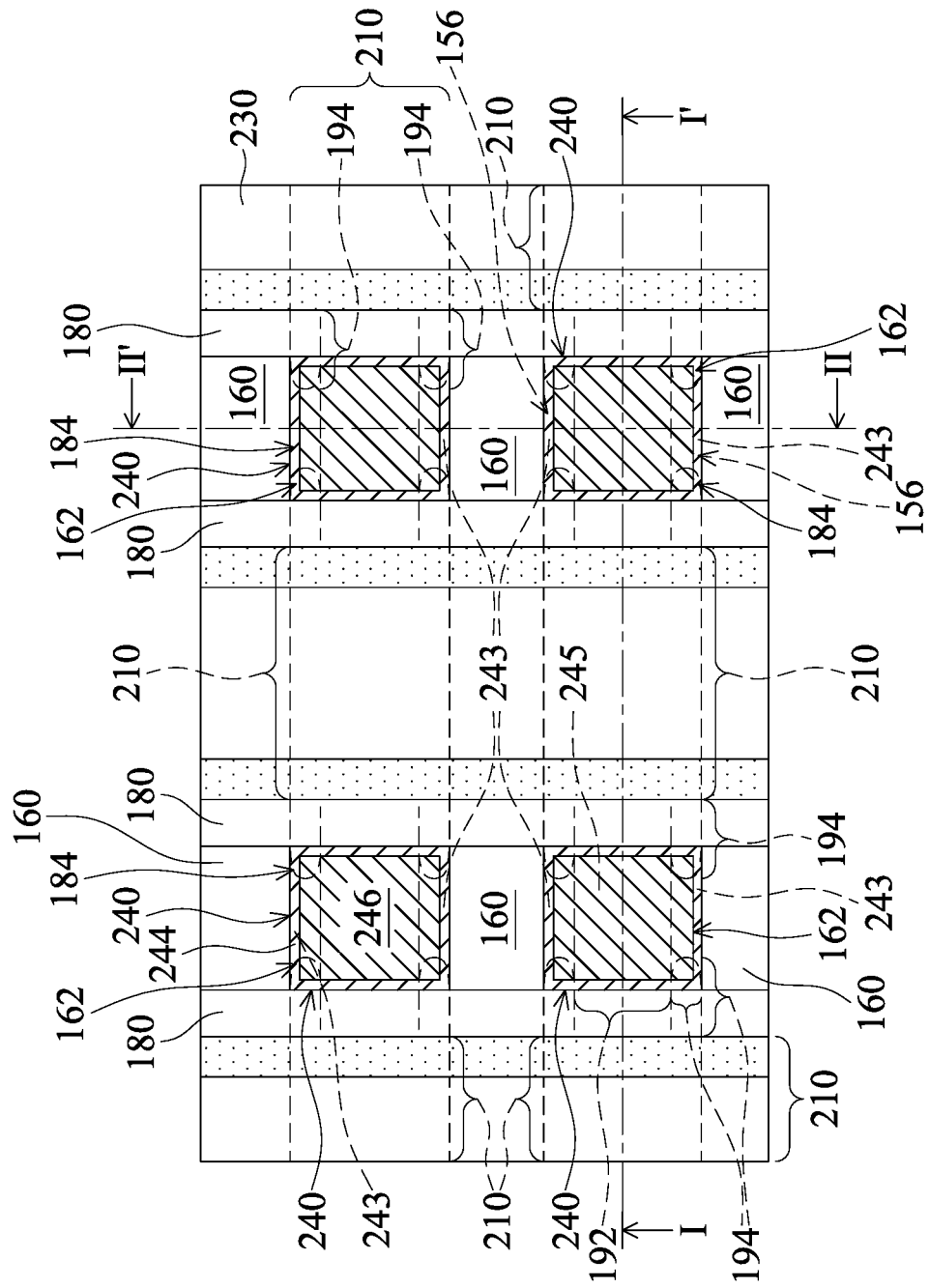
Figures 2, 2N:
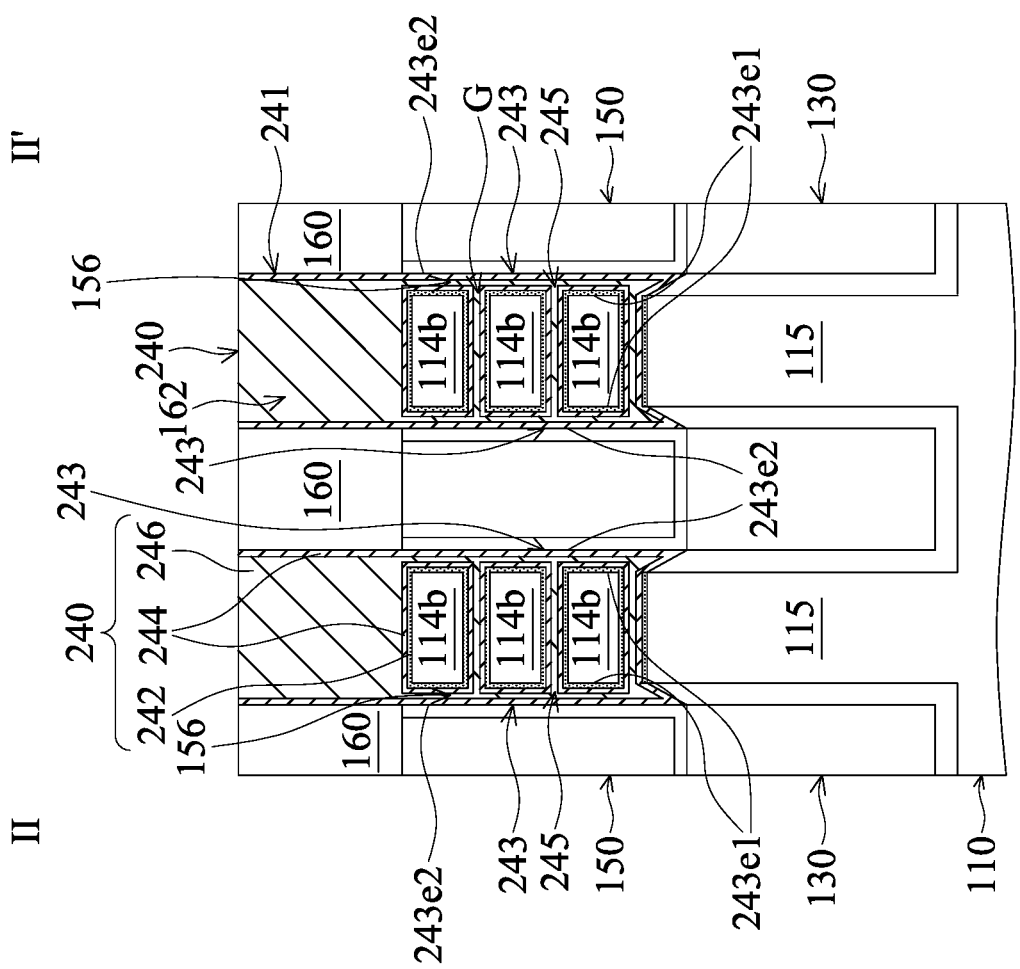
Figure 2O:
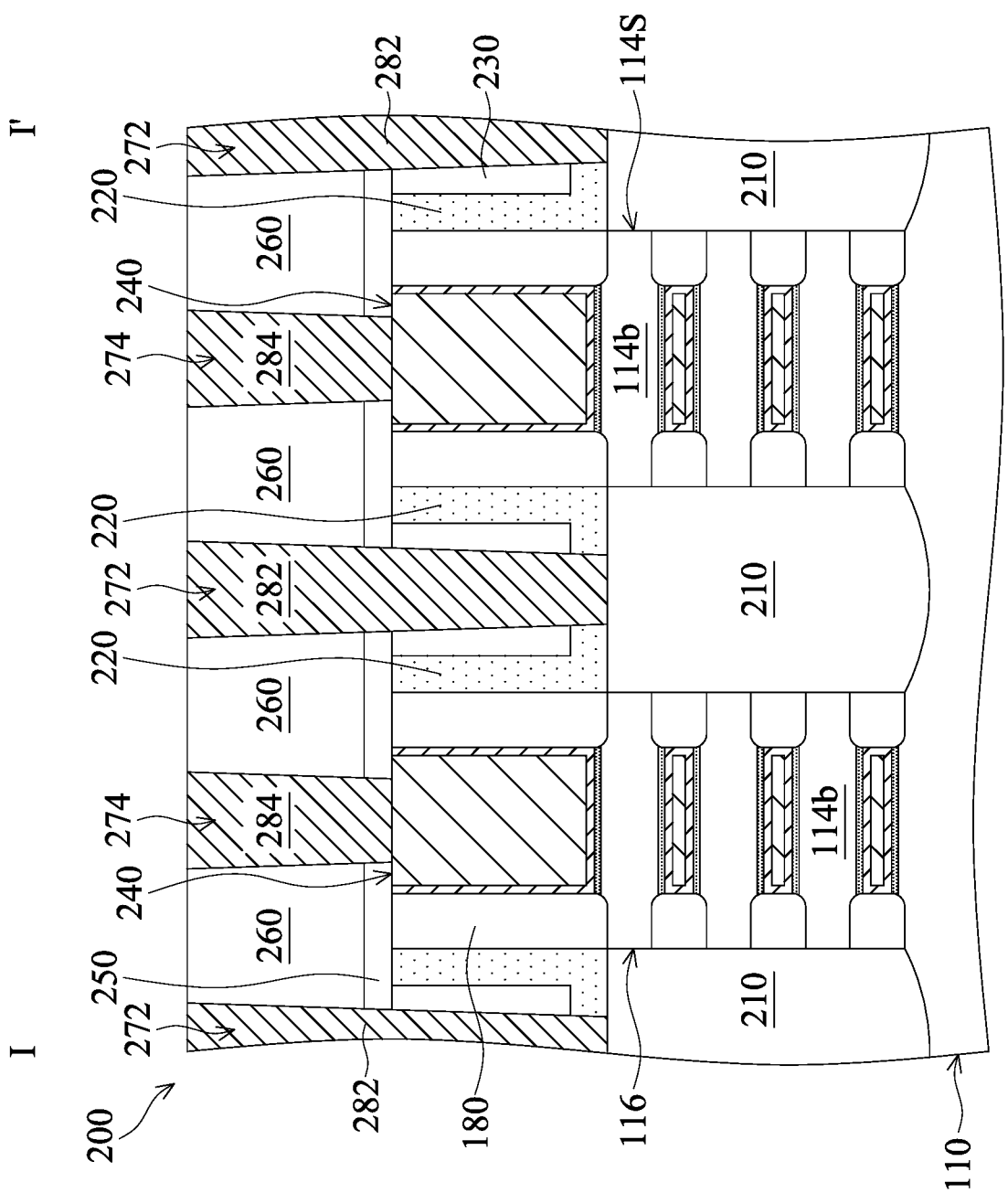
Figures 1, 2O:
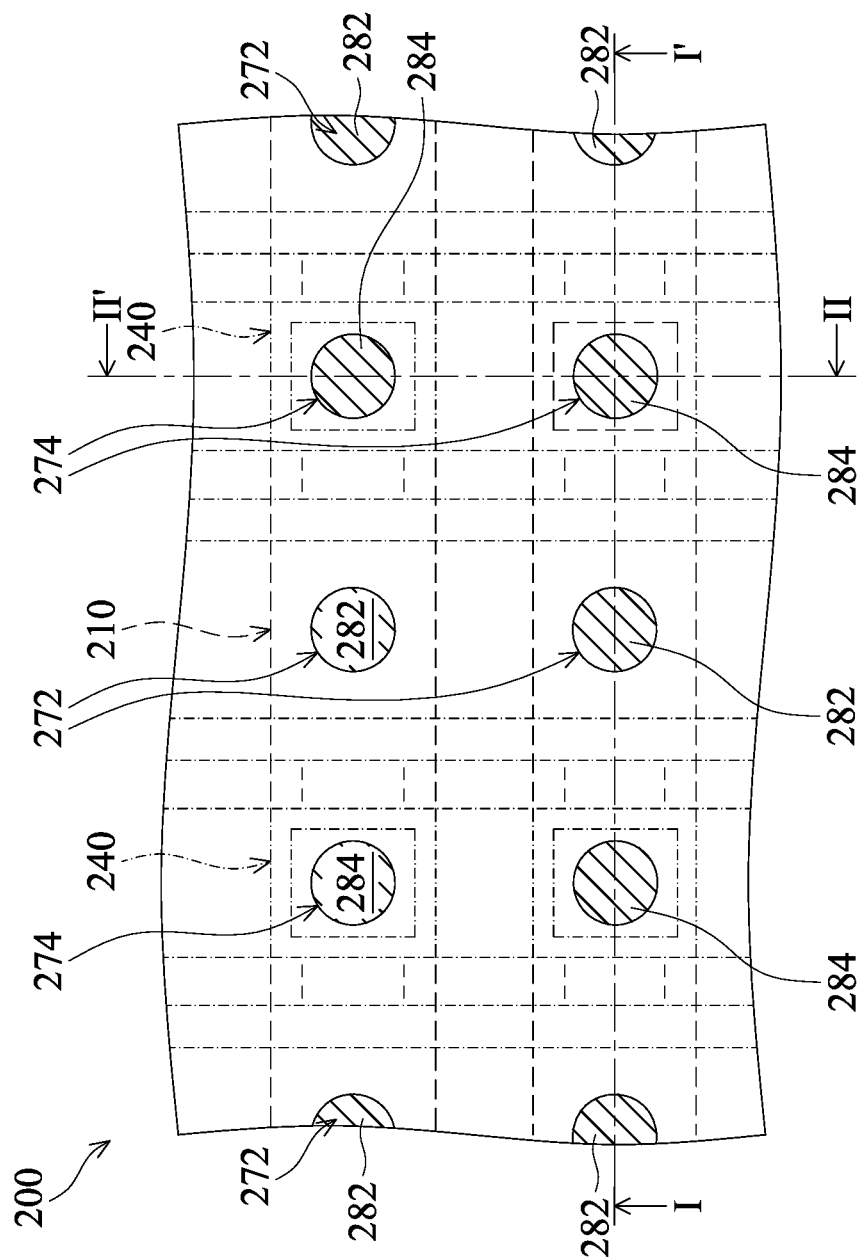
Figures 2, 2O:
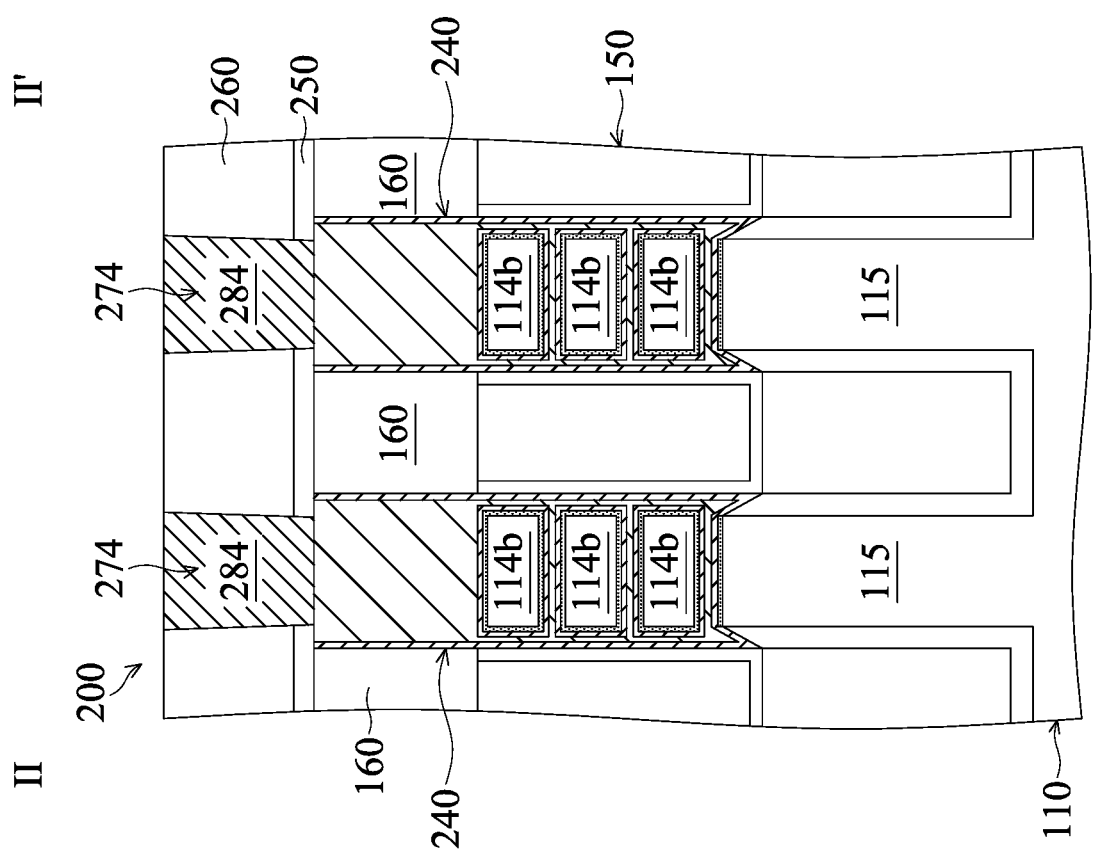

FIGS. 2A-2O are cross-sectional views of various stages of a process for forming a semiconductor device structure, in accordance with some embodiments. FIGS. 2A-1 to 2O-1 are top views of the semiconductor device structure of FIGS. 2A to 2O, in accordance with some embodiments.

FIGS. 2A-2O are cross-sectional views illustrating the semiconductor device structure along a sectional line I-I' in FIGS. 2A-1 to 2O-1, in accordance with some embodiments. FIGS. 2A-2 and 2B-2 are cross-sectional views illustrating the semiconductor device structure along a sectional line II-II' in FIGS. 2A-1 and 2B-1, in accordance with some embodiments.

After the step of FIG. 1J, as shown in FIGS. 2A, 2A-1, and 2A-2, mask layers M1 and M2 are sequentially formed over the gate electrode layer 174a, in accordance with some embodiments. The mask layer M1 has strip portions M1s, in accordance with some embodiments. The mask layer M2 has strip portions M2s, in accordance with some embodiments.

The mask layers M1 and M2 expose portions of the gate electrode layer 174a, in accordance with some embodiments. In some embodiments, the mask layer M1 serves a buffer layer or an adhesion layer that is formed between the underlying gate electrode layer 174a and the overlying mask layer M2. The mask layer M1 may also be used as an etch stop layer when the mask layer M2 is removed or etched.

In some embodiments, the mask layer M1 is made of an oxide-containing insulating material (e.g., silicon oxide), a nitride-containing insulating material (e.g., silicon nitride, silicon oxynitride, silicon oxycarbonitride, or silicon carbonitride), silicon carbide, or a metal oxide material (e.g., aluminum oxide).

In some embodiments, the mask layer M2 is made of an oxide-containing insulating material (e.g., silicon oxide), a nitride-containing insulating material (e.g., silicon nitride, silicon oxynitride, silicon oxycarbonitride, or silicon carbonitride), silicon carbide, or a metal oxide material (e.g., aluminum oxide). The mask layers M1 and M2 are made of different materials, in accordance with some embodiments.

The formation of the mask layers M1 and M2 includes: forming a first mask material layer (not shown) over the gate electrode layer 174a; forming a second mask material layer (not shown) over the first mask material layer; and patterning the first mask material layer and the second mask material layer by a photolithography process and an etching process, in accordance with some embodiments.

In some embodiments, the first mask material layer is formed by a deposition process, such as a chemical vapor deposition (CVD) process, a low-pressure chemical vapor deposition (LPCVD) process, a plasma enhanced chemical vapor deposition (PECVD) process, or a high-density plasma chemical vapor deposition (HDPCVD) process, a spin-on process, or another applicable process.

In some embodiments, the second mask material layer is formed by a deposition process, such as a chemical vapor deposition (CVD) process, a low-pressure chemical vapor deposition (LPCVD) process, a plasma enhanced chemical vapor deposition (PECVD) process, or a high-density plasma chemical vapor deposition (HDPCVD) process, a spin-on process, or another applicable process.

As shown in FIGS. 2A, 2B, 2B-1, and 2B-2, portions of the gate dielectric material layer 172a and the gate electrode layer 174a, which are not covered by the mask layers M1 and M2, are removed, in accordance with some embodiments.

After the removal process, the remaining gate dielectric material layer 172a forms a gate dielectric layer 172, and the remaining gate electrode layer 174a forms a gate electrode 174, in accordance with some embodiments. Under one of the strip portions M1s of the mask layer M1, the gate electrode 174 and the gate dielectric layer 172 thereunder together form a gate stack 170, in accordance with some embodiments.

In some embodiments, the removal process further removes an upper portion of the topmost channel layer 114b' and therefore recesses 114b1 are formed in the topmost channel layer 114b'. The removal process includes an etching process, such as an anisotropic etching process (e.g., a dry etching process), in accordance with some embodiments.

As shown in FIGS. 2C and 2C-1, a spacer layer 180a is formed over the fin structures 116, the cladding layer 140, the dielectric fins 160, and the mask layers M1 and M2, in accordance with some embodiments.

The spacer layer 180a is made of an oxide-containing insulating material, such as silicon oxide. In some other embodiments, the spacer layer 180a is made of a nitride-containing insulating material, such as silicon nitride (SiN), silicon oxynitride (SiON), silicon oxycarbonitride (SiOCN), or silicon carbonitride (SiCN).

In some embodiments, the spacer layer 180a is a single-layered structure. In some embodiments, the spacer layer 180a is a multi-layered structure. The spacer layer 180a is formed using a deposition process, such as a chemical vapor deposition (CVD) process, an atomic layer deposition (ALD) process, or a physical vapor deposition (PVD) process, in accordance with some embodiments.

FIG. 2D-2 is a perspective view of a portion of the semiconductor device structure in a region RE of FIG. 2D, in accordance with some embodiments. FIG. 2D is a cross-sectional view illustrating the semiconductor device structure along a sectional line I-I' in FIG. 2D-1 or FIG. 2D-2, in accordance with some embodiments.

As shown in FIGS. 2C, 2D, 2D-1 and 2D-2, portions of the spacer layer 180a and upper portions of the fin structures 116 and the cladding layer 140, which are not covered by the gate stacks 170 and the spacer layer 180a over sidewalls of the gate stacks 170, are removed, in accordance with some embodiments.

After the removal process, the spacer layer 180a remaining over opposite sidewalls of the gate stacks 170 and opposite sidewalls of the mask layers M1 and M2 forms a spacer 180, in accordance with some embodiments. After the removal process, the cladding layer 140 remains under the gate stacks 170 and the spacer 180, in accordance with some embodiments.

As shown in FIG. 2D, the removal process forms recesses 116a in the fin structures 116, in accordance with some embodiments. In one of the fin structures 116, the multilayer structure 114 is divided into multilayer stacks 114S by the recesses 116a, in accordance with some embodiments.

In each multilayer stack 114S, the remaining sacrificial layers 114a' form sacrificial nanostructures 114a, and the remaining channel layers 114b' form channel nanostructures 114b, in accordance with some embodiments. Each multilayer stack 114S includes three sacrificial nanostructures 114a and three channel nanostructures 114b, in accordance with some embodiments. The sacrificial nanostructures 114a and the channel nanostructures 114b include nanowires and/or nanosheets, in accordance with some embodiments.

The sacrificial nanostructure 114a is thinner than the channel nanostructure 114b, in accordance with some embodiments. That is, the thickness T114a of the sacrificial nanostructure 114a is less than the thickness T114b of the channel nanostructure 114b, in accordance with some embodiments.

The thickness T114a is less than or equal to 5 nm, in accordance with some embodiments. The thickness T114a ranges from about 1 nm to about 5 nm, in accordance with some embodiments. The thickness T114b ranges from about 7 nm to about 15 nm, in accordance with some embodiments. In some embodiments, a ratio of the thickness T114b to the thickness T114a ranges from about 1.8 to about 3.

As shown in FIG. 2D-2, the distance D114b between the channel nanostructures 114b (or between the channel nanostructure 114b and the bottom portion 115) is substantially equal to the thickness T114a, in accordance with some embodiments. The distance D114b ranges from about 1 nm to about 5 nm, in accordance with some embodiments.

The distance D114a between the sacrificial nanostructures 114a is substantially equal to the thickness T114b, in accordance with some embodiments. The distance D114a ranges from about 7 nm to about 15 nm, in accordance with some embodiments. The distance D114b is less than the distance D114a, in accordance with some embodiments.

The embodiments are able to control an etching rate of the sacrificial nanostructures 114a in a subsequent etching process by adjusting the thickness T114a or the distance D114b, in accordance with some embodiments. If the thickness T114a or the distance D114b is reduced, the structural obstruction caused by the channel nanostructures 114b is increased, and therefore the etching rate of the sacrificial nanostructures 114a is reduced, in accordance with some embodiments.

The removal process for forming the recesses 116a includes an etching process, such as an anisotropic etching process (e.g., a dry etching process), in accordance with some embodiments.

FIG. 2E-2 is a perspective view of a portion of the semiconductor device structure in a region RE of FIG. 2E, in accordance with some embodiments. FIG. 2E is a cross-sectional view illustrating the semiconductor device structure along a sectional line I-I' in FIG. 2E-1 or FIG. 2E-2, in accordance with some embodiments.

As shown in FIGS. 2D-2, 2E, 2E-1, and 2E-2, portions of the sacrificial nanostructures 114a and the cladding layer 140 are removed from sidewalls S1 of the sacrificial nanostructures 114a and sidewalls 142 of the cladding layer 140, in accordance with some embodiments.

Therefore, the removal process forms recesses R1 in the multilayer stacks 114S, in accordance with some embodiments. Each recess R1 is surrounded by the corresponding sacrificial nanostructure 114a and the corresponding channel nanostructures 114b, in accordance with some embodiments.

In some embodiments, the removal process further removes portions of the channel nanostructures 114b adjacent to the recesses R1 and therefore forms recesses R2 in the channel nanostructures 114b.

As shown in FIG. 2E-2, the removal process forms recesses R3, in accordance with some embodiments. Each recess R3 is surrounded by the cladding layer 140, the corresponding gate stack 170, and the corresponding multilayer stack 114S, in accordance with some embodiments. The recesses R3 are on opposite sides of the cladding layer 140, in accordance with some embodiments.

FIG. 2E-3 is a cross-sectional view illustrating the semiconductor device structure along a sectional line II-II' in FIG. 2E-2, in accordance with some embodiments. FIG. 2E-4 is a cross-sectional view illustrating the semiconductor device structure along a sectional line III-III' in FIG. 2E-2, in accordance with some embodiments.

As shown in FIGS. 2E-1, 2E-2, 2E-3, and 2E-4, the recesses R3 extend from opposite sides of the cladding layer 140 into the cladding layer 140, in accordance with some embodiments. The cladding layer 140 has ends 144e1 and 144e2, in accordance with some embodiments. The end 144e1 is connected to the multilayer stack 114S, in accordance with some embodiments. The end 144e2 is connected to the isolation structure 150, in accordance with some embodiments.

The removal speed (or the etching rate) of the ends 144e1 and 144e2 is lower than that of the middle portion of the cladding layer 140 because of the structural obstruction caused by the multilayer stack 114S and the isolation structure 150, in accordance with some embodiments. Therefore, the cladding layer 140 has a neck 144n after the removal process, in accordance with some embodiments.

The neck 144n is connected between the ends 144e1 and 144e2, in accordance with some embodiments. The neck 144n is narrower than the end 144e1, in accordance with some embodiments. The neck 144n is narrower than the end 144e2, in accordance with some embodiments. That is, as shown in FIG. 2E-3, the width W140 of the neck 144n is less than the width W144e1 of the end 144e1 as measured along a longitudinal axis A1 of the fin structure 116, in accordance with some embodiments. The width W140 is less than the width W144e2 of the end 144e2 as measured along the longitudinal axis A1, in accordance with some embodiments.

The width W144e1 ranges from about 8 nm to about 17 nm, in accordance with some embodiments. The width W144e2 ranges from about 8 nm to about 17 nm, in accordance with some embodiments. The width W140 ranges from about 5 nm to about 14 nm, in accordance with some embodiments.

The width W140 is also referred to as a minimum width of the remaining cladding layer 140 as measured along the longitudinal axis A1, in accordance with some embodiments. The width WR3 of the recess R3 ranges from about 5 nm to about 10 nm, in accordance with some embodiments. The depth DR3 of the recess R3 ranges from about 1 nm to about 3 nm, in accordance with some embodiments.

After the removal process, the sidewalls 142 become curved sidewalls, in accordance with some embodiments. The curvature radius of the sidewall 142 ranges from about 2.5 nm to about 6 nm, in accordance with some embodiments. The curvature radius of the sidewall 142 ranges from about 2.5 nm to about 4 nm, in accordance with some embodiments.

Since the distance D114b between the channel nanostructures 114b (or between the channel nanostructure 114b and the bottom portion 115) is small (≤5 nm), the removal speed (or the etching rate) of the sacrificial nanostructures 114a is lower than the removal speed (or the etching rate) of the cladding layer 140, in accordance with some embodiments.

Therefore, after the removal process is performed, the remaining cladding layer 140 is substantially narrower than the remaining sacrificial nanostructure 114a, in accordance with some embodiments. That is, as shown in FIG. 2E-3, the (minimum) width W140 of the remaining cladding layer 140 is less than the width W114a of the sacrificial nanostructures 114a, in accordance with some embodiments.

In some embodiments, a difference between the widths W114a and W140 ranges from about 2 nm to about 6 nm. The difference between the widths W114a and W140 ranges from about 2 nm to about 4 nm, in accordance with some embodiments. The width W114a ranges from about 8 nm to about 17 nm, in accordance with some embodiments.

The removal process includes etching processes, such as dry etching processes and wet etching processes, in accordance with some embodiments. In some embodiments, the removal process includes a first dry etching process, a first wet etching process, a second dry etching process, and a second wet etching process, which are performed sequentially.

The first dry etching process includes a plasma etching process, in accordance with some embodiments. The first dry etching process uses He gas of about 300 sccm to about 2200 sccm, Ar gas of about 80 sccm to about 1100 sccm, and $NF_3$ gas of about 5 sccm to about 200 sccm under about 0° C. to about 30° C. temperature and about 0.5 Torr to about 15 Torr pressure for about 30 seconds to about 80 seconds, in accordance with some embodiments.

The first wet etching process uses a dilute hydrofluoric acid (HF) solution, in accordance with some embodiments. The volume percentage concentration of the dilute hydrofluoric acid solution ranges from about 0.5% to about 2%, in accordance with some embodiments.

The second dry etching process uses He gas of about 300 sccm to about 2200 sccm, Ar gas of about 80 sccm to about 1100 sccm, and $NF_3$ gas of about 5 sccm to about 200 sccm under about 0° C. to about 30° C. temperature and about 0.5 Torr to about 15 Torr pressure for about 10 seconds to about 50 seconds, in accordance with some embodiments.

The second wet etching process uses a dilute hydrofluoric acid solution, in accordance with some embodiments. The volume percentage concentration of the dilute hydrofluoric acid solution ranges from about 0.5% to about 2%, in accordance with some embodiments.

FIG. 2F is a cross-sectional view illustrating the semiconductor device structure along a sectional line I-I' in FIG. 2F-1, in accordance with some embodiments. As shown in FIGS. 2E-2, 2F, and 2F-1, an inner spacer layer 190a is formed over the spacer layer 180, the mask layer M2, and the substrate 110 and in the recesses R1, R2, and R3, in accordance with some embodiments.

In some embodiments, the inner spacer layer 190a is made of an oxide-containing insulating material, such as silicon oxide, or a nitride-containing insulating material, such as silicon nitride (SiN), silicon oxynitride (SiON), silicon oxycarbonitride (SiOCN), or silicon carbonitride (SiCN), in accordance with some embodiments. The inner spacer layer 190a is formed using a deposition process such as an atomic layer deposition (ALD) process, a chemical vapor deposition (CVD) process, or another applicable process.

FIG. 2G-1 is a top view of the semiconductor device structure of FIG. 2G, in accordance with some embodiments. FIG. 2G-2 is a perspective view of a portion of the semiconductor device structure in a region RE of FIG. 2G, in accordance with some embodiments. FIG. 2G is a cross-sectional view illustrating the semiconductor device structure along a sectional line I-I' in FIG. 2G-1 or FIG. 2G-2, in accordance with some embodiments.

As shown in FIGS. 2F, 2G, 2G-1, and 2G-2, portions of the inner spacer layer 190a outside of the recesses R1, R2, and R3 are removed, in accordance with some embodiments. The remaining inner spacer layer 190a includes inner spacers 192 and 194, in accordance with some embodiments. The inner spacers 192 are in the recesses R1 and R2 of the multilayer stacks 114S, in accordance with some embodiments.

The inner spacers 194 are in the recesses R3, which are surrounded by the cladding layer 140, the corresponding gate stack 170, and the corresponding multilayer stack 114S, in accordance with some embodiments.

FIG. 2G-3 is a cross-sectional view illustrating the semiconductor device structure along a sectional line II-II' in FIG. 2G-2, in accordance with some embodiments. FIG. 2G-4 is a cross-sectional view illustrating the semiconductor device structure along a sectional line III-III' in FIG. 2G-2, in accordance with some embodiments.

As shown in FIGS. 2G-1, 2G-2, 2G-3, and 2G-4, the inner spacer 194 has a curved sidewall 194s, in accordance with some embodiments. In some embodiments, a sum of a maximum width W194L of the left one of the inner spacers 194 and a maximum width W194R of the right one of the inner spacers 194 is greater than the minimum width W140 of the cladding layer 140 as measured along the longitudinal axis A1 of the fin structure 116, in accordance with some embodiments.

The inner spacers 192 and 194 together form an inner spacer structure 190, in accordance with some embodiments. The inner spacer structure 190 is a continuous structure, in accordance with some embodiments.

As shown in FIG. 2G-2, the inner spacer 194 is wider than the inner spacer 192, in accordance with some embodiments. That is, the width W194 of the inner spacer 194 is greater than the width W192 of the inner spacer 192 as measured along the longitudinal axis A1 of the fin structure 116, in accordance with some embodiments.

As shown in FIG. 2G-3, a portion of the cladding layer 140 is between the inner spacer 194 and the sacrificial nanostructure 114a, in accordance with some embodiments. As shown in FIG. 2G-4, a portion of the cladding layer 140 is between the inner spacers 194 and the channel nanostructure 114b, in accordance with some embodiments. The removal process includes an etching process, such as a dry etching process or a wet etching process, in accordance with some embodiments.

FIG. 2H is a cross-sectional view illustrating the semiconductor device structure along a sectional line I-I' in FIG. 2H-1, in accordance with some embodiments. As shown in FIGS. 2H and 2H-1, source/drain structures 210 are formed over the bottom portions 115 of the fin structures 116, in accordance with some embodiments.

The source/drain structures 210 are connected to the sidewalls 114b1 of the channel nanostructures 114b, in accordance with some embodiments. The source/drain structures 210 are also referred to as stressors, in accordance with some embodiments.

In some embodiments, the source/drain structures 210 are made of a semiconductor material (e.g., silicon germanium) with P-type dopants, such as the Group IIIA element, in accordance with some embodiments. The Group IIIA element includes boron or another suitable material.

In some other embodiments, the source/drain structures 210 are made of a semiconductor material (e.g., silicon) with N-type dopants, such as the Group VA element, in accordance with some embodiments. The Group VA element includes phosphor (P), antimony (Sb), or another suitable Group VA material. The source/drain structures 210 are formed using an epitaxial process, in accordance with some embodiments.

Since the etching rate of the sacrificial nanostructures 114a is lower than the etching rate of the cladding layer 140, the sacrificial nanostructures 114a are able to keep enough width while the cladding layer 140 is greatly narrowed after the removal process of FIG. 2E, in accordance with some embodiments. Therefore, the distance D3 between the neck 144n (i.e., the main portion) of the cladding layer 140 and the source/drain structures 210 is increased, in accordance with some embodiments.

The cladding layer 140 is used to reserve a space for a gate stack formed in the subsequent process, in accordance with some embodiments. Therefore if the distance D3 is increased, the distance between the gate stack and the source/drain structures 210 is increased. As a result, the parasitic capacitance between the gate stack and the source/drain structures 210 is reduced, which improves the performance of the semiconductor device structure with the gate stack and the source/drain structures 210, in accordance with some embodiments.

Furthermore, if the distance D3 is increased, the width W194 of the inner spacer 194 is increased as well, which is able to avoid short circuit between the gate stack and the source/drain structures 210 and reduce the leakage current between the gate stack and the source/drain structures 210, in accordance with some embodiments. Therefore, the yield of the semiconductor device structure with the (wide) inner spacer 194 is improved, in accordance with some embodiments.

As shown in FIGS. 2I and 2I-1, an etch stop layer 220 is formed over the source/drain structures 210, the spacer layer 180, and the mask layer M2, in accordance with some embodiments. The etch stop layer 220 is made of a dielectric material such as a nitride-containing material including silicon nitride (SiN), silicon oxynitride (SiON), or silicon carbonitride (SiCN), in accordance with some embodiments.

Thereafter, as shown in FIGS. 2I and 2I-1, a dielectric layer 230 is formed over the etch stop layer 220, in accordance with some embodiments. The etch stop layer 220 is between the dielectric layer 230 and the source/drain structures 210 to separate the dielectric layer 230 from the source/drain structures 210, in accordance with some embodiments.

The dielectric layer 230 is made of an insulating material such as an oxide-containing material including silicon oxide, or a nitride-containing material including silicon nitride, silicon oxynitride, silicon oxycarbonitride, or silicon carbonitride, in accordance with some embodiments.

FIGS. 2J-2 to 2O-2 are cross-sectional views illustrating the semiconductor device structure along a sectional line II-II' in FIGS. 2J-1 to 2O-1, in accordance with some embodiments. FIGS. 2J to 2O are cross-sectional views illustrating the semiconductor device structure along a sectional line I-I' in FIGS. 2J-1 to 2O-1, in accordance with some embodiments.

As shown in FIGS. 2I, 2J, 2J-1, and 2J-2, top portions of the etch stop layer 220, the dielectric layer 230, the spacer layer 180, and the gate stack 170 and the mask layers M1 and M2 are removed, in accordance with some embodiments. After the removal process, top surfaces 222, 232, 182, and 176 of the etch stop layer 220, the dielectric layer 230, the spacer layer 180, and the gate stack 170 are substantially level with each other, in accordance with some embodiments. The removal process includes a planarization process such as a chemical mechanical polishing process, in accordance with some embodiments.

As shown in FIGS. 2K, 2K-1, and 2K-2, the gate stacks 170 are removed to form trenches 184 in the spacer layer 180 and trenches 162 between the dielectric fins 160, in accordance with some embodiments. The removal process includes an etching process, such as a wet etching process or a dry etching process, in accordance with some embodiments.

As shown in FIGS. 2L, 2L-1, and 2L-2, the sacrificial nanostructures 114a and the cladding layer 140 are removed through the trenches 184 in the spacer layer 180 and the trenches 162 between the dielectric fins 160, in accordance with some embodiments. As shown in FIG. 2L, gaps G between the bottom portion 115 and the channel nanostructure 114b and between the channel nanostructures 114b are formed after removing the sacrificial nanostructures 114a, in accordance with some embodiments.

As shown in FIGS. 2L-1 and 2L-2, through holes 156 are formed in the isolation structure 150 after removing the cladding layer 140, in accordance with some embodiments. The through holes 156 expose the isolation structure 130 thereunder, in accordance with some embodiments. The removal process includes an etching process, such as a wet etching process or a dry etching process, in accordance with some embodiments.

As shown in FIGS. 2M, 2M-1, and 2M-2, a gate dielectric layer 242 is formed over the channel nanostructures 114b and the bottom portions 115 of the fin structures 116 exposed by the trenches 184 in the spacer layer 180 and the trenches 162 between the dielectric fins 160 in accordance with some embodiments.

The gate dielectric layer 242 is made of a dielectric material such as an oxide material (e.g., silicon oxide) or a high-K material, such as $HfO_2$, $ZrO_2$, $HfZrO_2$, or $Al_2O_3$, in accordance with some embodiments. The gate dielectric layer 242 is formed using an oxidation process, a selective deposition process, an atomic layer deposition process or another suitable process.

As shown in FIGS. 2M, 2M-1, and 2M-2, a work function metal layer 244 is conformally formed over the gate dielectric layer 242, the spacer layer 180, the dielectric fins 160, and the isolation structure 150 and in the trenches 184 and 162, in accordance with some embodiments. The work function metal layer 244 is made of titanium-containing material (e.g., TiN or TiSiN) or tantalum-containing material (e.g., TaN), or another suitable conductive material. The work function metal layer 244 is formed using an atomic layer deposition process or another suitable process.

As shown in FIGS. 2M, 2M-1, and 2M-2, a gate electrode layer 246 is formed over the work function metal layer 244, in accordance with some embodiments. The gate electrode layer 246 is made of W, Co, Al, or another suitable conductive material. The gate electrode layer 246 is formed using a physical vapor deposition process, an atomic layer deposition process, or another suitable process.

FIG. 2N-3 is a perspective view of a portion of the semiconductor device structure in a region RE of FIG. 2N, in accordance with some embodiments. As shown in FIGS. 2N, 2N-1, 2N-2, and 2N-3, the work function metal layer 244 and the gate electrode layer 246 outside of the trenches 184 and 162 and top portions of the spacer layer 180, the etch stop layer 220, and the dielectric layer 230 are removed, in accordance with some embodiments.

After the removal process, in one of the trenches 184 or 162, the gate dielectric layer 242, the remaining work function metal layer 244, and the remaining gate electrode layer 246 together form a gate stack 240, in accordance with some embodiments. The gate stack 240 is wrapped around the channel nanostructures 114b, in accordance with some embodiments. In some embodiments, a portion of the gate stack 240 is between the channel nanostructure 114b and the bottom portion 115.

As shown in FIGS. 2N, 2N-2, and 2N-3, each gate stack 240 has an upper portion 241, sidewall portions 243, and lower portions 245, in accordance with some embodiments. The upper portion 241 is over the channel nanostructures 114b, in accordance with some embodiments. The lower portions 245 are between the channel nanostructures 114b and between the channel nanostructure 114b and the bottom portion 115, in accordance with some embodiments.

FIG. 2N-4 is a cross-sectional view illustrating the semiconductor device structure along a sectional line III-III' in FIG. 2N-3, in accordance with some embodiments. FIG. 2N-5 is a cross-sectional view illustrating the semiconductor device structure along a sectional line IV-IV' in FIG. 2N-3, in accordance with some embodiments.

As shown in FIGS. 2N-2, 2N-3, 2N-4, and 2N-5, the sidewall portions 243 are over sidewalls 114b2 of the channel nanostructures 114b, in accordance with some embodiments. The sidewall portion 243 has a neck 243n and opposite ends 243e1 and 243e2, in accordance with some embodiments. The end 243e1 is connected to the multilayer stack 114S, in accordance with some embodiments. The end 243e2 is connected to the isolation structure 150, in accordance with some embodiments.

The neck 243n is connected between the ends 243e1 and 243e2, in accordance with some embodiments. The neck 243n is narrower than the end 243e1, in accordance with some embodiments. The neck 243n is narrower than the end 243e2, in accordance with some embodiments. That is, as shown in FIG. 2N-5, the width W243 of the neck 243n is less than the width W243e1 of the end 243e1 as measured along the longitudinal axis A1 of the fin structure 116, in accordance with some embodiments. The width W243 is less than the width W243e2 of the end 243e2 as measured along the longitudinal axis A1, in accordance with some embodiments.

The width W243e1 ranges from about 8 nm to about 17 nm, in accordance with some embodiments. The width W243e2 ranges from about 8 nm to about 17 nm, in accordance with some embodiments. The width W243 ranges from about 5 nm to about 14 nm, in accordance with some embodiments. The width W243 is also referred to as a minimum width of the gate stack 240 as measured along the longitudinal axis A1, in accordance with some embodiments.

The sidewall portion 243 has opposite sidewalls 243s, in accordance with some embodiments. The sidewalls 243s are curved concave sidewalls, in accordance with some embodiments. The curvature radius of the sidewall 243s ranges from about 2.5 nm to about 6 nm, in accordance with some embodiments. The curvature radius of the sidewall 243s ranges from about 2.5 nm to about 4 nm, in accordance with some embodiments.

The inner spacers 194 respectively extend from opposite sidewalls 243s of the sidewall portion 243 into the sidewall portion 243, in accordance with some embodiments. In some embodiments, as shown in FIG. 2N-5, a part of the sidewall portion 243 is between the inner spacer 194 and the channel nanostructure 114b. The inner spacer 194 is surrounded by the channel nanostructure 114b and the gate stack 240, in accordance with some embodiments.

In some embodiments, as shown in FIG. 2N-4, a sum of a maximum width W194L of the left one of the inner spacers 194 and a maximum width W194R of the right one of the inner spacers 194 is greater than the minimum width W243 of the sidewall portion 243 as measured along the longitudinal axis A1 of the fin structure 116.

Specifically, the maximum width W194L of the left one of the inner spacers 194 is the distance between the left sidewall $S1_L$ and the rightmost endpoint $S1_R$ of the (left) inner spacer 194, in accordance with some embodiments. The maximum width W194R of the right one of the inner spacers 194 is the distance between the right sidewall $S2_R$ and the leftmost endpoint $S2_L$ of the (right) inner spacer 194, in accordance with some embodiments. The minimum width W243 of the sidewall portion 243 is the distance between the rightmost endpoint $S1_R$ of the (left) inner spacer 194 and the leftmost endpoint $S2_L$ of the (right) inner spacer 194, in accordance with some embodiments.

As shown in FIG. 2N-4, the inner spacer 194 (the lower left one) is connected to the inner spacer 192 (the left one), and the inner spacers 192 and 194 together form a continuous structure having an L-like shape, in accordance with some embodiments.

As shown in FIG. 2N-3, the inner spacer 192 is under the channel nanostructures 114b and beside the lower portion 245 of the gate stack 240, in accordance with some embodiments. The upper portion 241 of the gate stack 240 is wider than the neck 243n of the sidewall portion 243 of the gate stack 240, in accordance with some embodiments.

As shown in FIGS. 2N-3 and 2N-4, the lower portion 245 is wider than the sidewall portion 243, in accordance with some embodiments. The lower portion 245 of the gate stack 240 is thinner than the channel nanostructures 114b, in accordance with some embodiments.

As shown in FIGS. 2N-1 and 2N-3, the inner spacers 192 are under the channel nanostructures 114b and between the lower portion 245 of the gate stack 240 and the source/drain structures 210, in accordance with some embodiments. The inner spacer 192 separates the source/drain structures 210 from the lower portions 245 of the gate stack 240, in accordance with some embodiments.

As shown in FIGS. 2N-1 and 2N-3, the inner spacer 194 separates the source/drain structures 210 from the sidewall portion 243 of the gate stack 240, in accordance with some embodiments. The inner spacers 194 are under the upper portion 241 of the gate stack 240 and beside the channel nanostructures 114b and the sidewall portions 243, in accordance with some embodiments. The removal process includes a planarization process such as a chemical mechanical polishing process, in accordance with some embodiments.

As shown in FIGS. 2O, 2O-1, and 2O-2, an etch stop layer 250 is formed over the spacer layer 180, the etch stop layer 220, the dielectric layer 230, and the gate stack 240, in accordance with some embodiments. The etch stop layer 250 is made of a dielectric material such as a nitride-containing material including silicon nitride (SiN), silicon oxynitride (SiON), or silicon carbonitride (SiCN), in accordance with some embodiments.

Thereafter, as shown in FIGS. 2O, 2O-1, and 2O-2, a dielectric layer 260 is formed over the etch stop layer 250, in accordance with some embodiments. The etch stop layer 250 is between the dielectric layers 260 and the dielectric layer 230 to separate the dielectric layer 260 from the dielectric layer 230, in accordance with some embodiments.

The dielectric layer 260 is made of an insulating material such as an oxide-containing material including silicon oxide, or a nitride-containing material including silicon nitride, silicon oxynitride, silicon oxycarbonitride, or silicon carbonitride, in accordance with some embodiments.

As shown in FIGS. 2O, 2O-1, and 2O-2, portions of the dielectric layer 230, the etch stop layer 220, the etch stop layer 250, and the dielectric layer 260 are removed to form through holes 272 passing through the dielectric layer 230, the etch stop layer 220, the etch stop layer 250, and the dielectric layer 260, in accordance with some embodiments. As shown in FIGS. 2O, 2O-1, and 2O-2, portions of the etch stop layer 250 and the dielectric layer 260 are removed to form through holes 274 passing through the etch stop layer 250 and the dielectric layer 260, in accordance with some embodiments.

As shown in FIGS. 2O, 2O-1, and 2O-2, contact structures 282 and 284 are respectively formed in the through holes 272 and 274, in accordance with some embodiments. In this step, a semiconductor device structure 200 is substantially formed, in accordance with some embodiments. The contact structure 282 is in direct contact with and is electrically connected to the source/drain structures 210 thereunder, in accordance with some embodiments.

The contact structure 284 is in direct contact with and is electrically connected to the gate stack 240 thereunder, in accordance with some embodiments. The contact structure 284 is in direct contact with the etch stop layer 250, the dielectric layer 260, and the gate stack 240, in accordance with some embodiments.

The contact structures 282 and 284 are made of tungsten (W), cobalt (Co), aluminum (Al), ruthenium (Ru), copper (Cu) or another suitable conductive material, in accordance with some embodiments. The formation of the contact structures 282 and 284 includes depositing a conductive material layer (not shown) over the dielectric layer 260 and in the through holes 272 and 274; and performing a chemical mechanical polishing (CMP) process over the conductive material layer to remove the conductive material layer outside of the through holes 272 and 274.

Figure 3A:
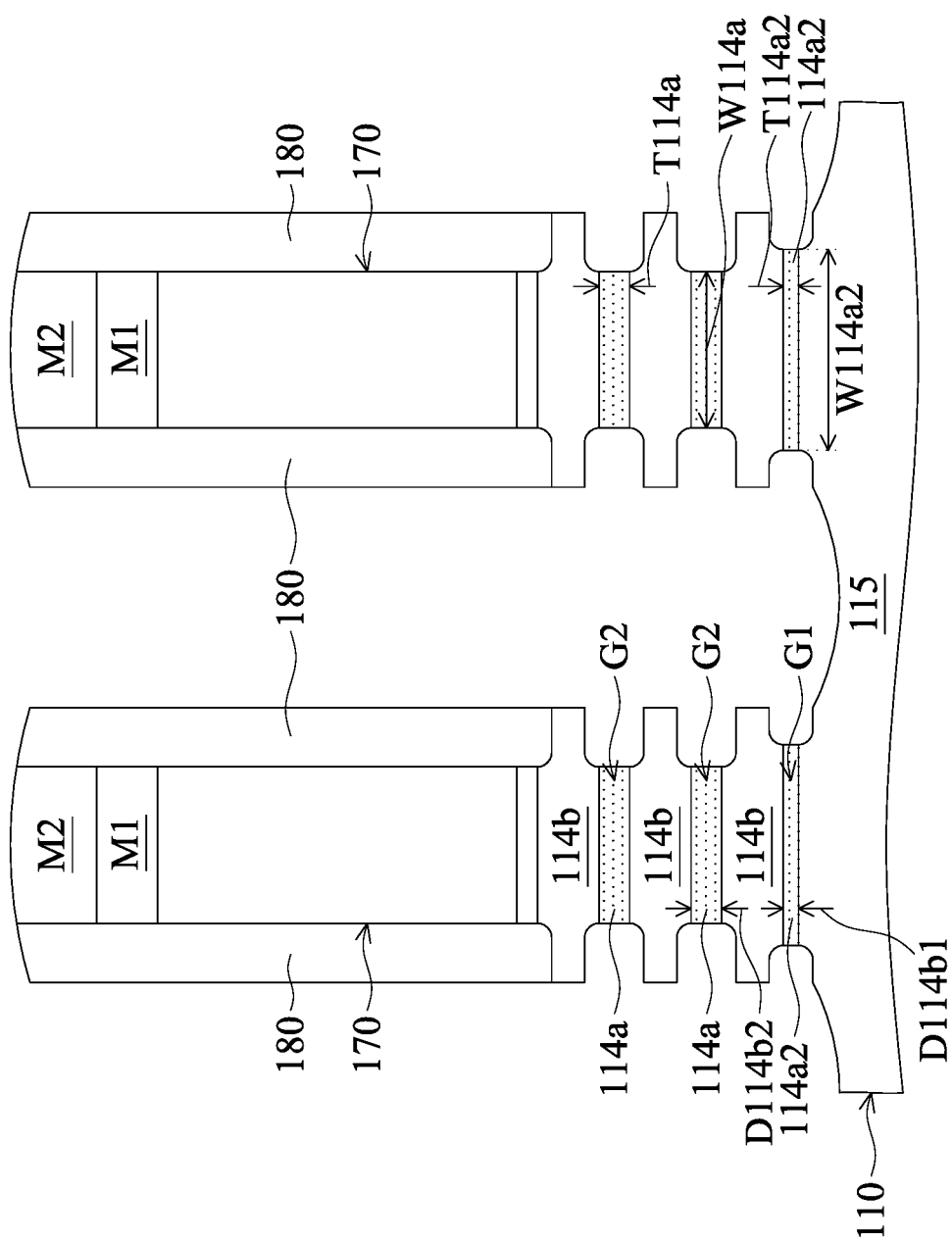
FIGS. 3A-3B are cross-sectional views of various stages of a process for forming a semiconductor device structure, in accordance with some embodiments.
Figure 3B:
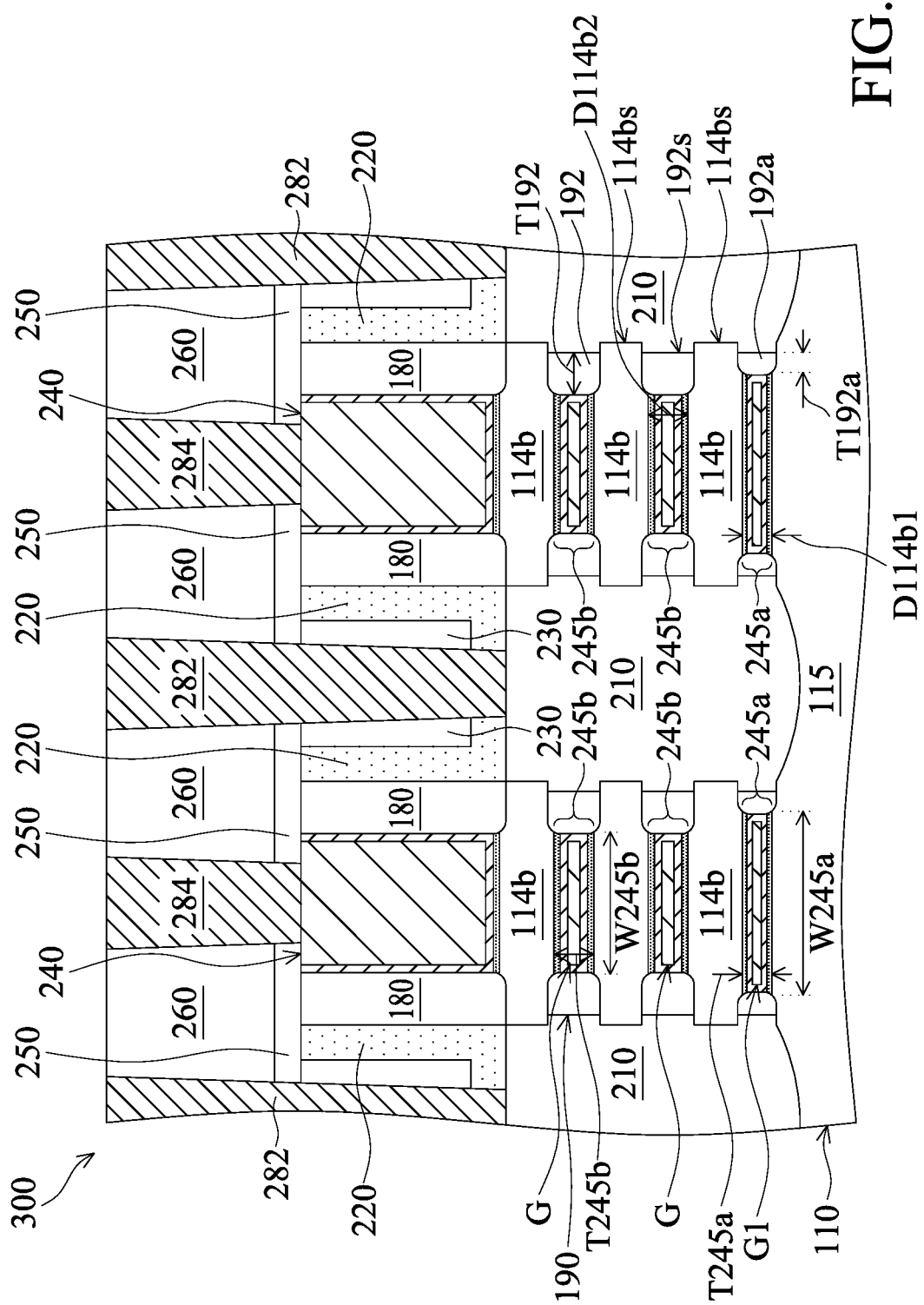

FIGS. 3A-3B are cross-sectional views of various stages of a process for forming a semiconductor device structure, in accordance with some embodiments. As shown in FIG. 3A, the semiconductor device structure of FIG. 3A is similar to the semiconductor device structure of FIG. 2E, except that the distance D114b1 between the channel nanostructure 114b and the bottom portion 115 is less than the distance D114b2 between the channel nanostructures 114b, in accordance with some embodiments.

Since the distance D114b1 is less than the distance D114b2, the etching rate (or the removal speed) of the sacrificial nanostructures 114a2 is lower than the etching rate (or the removal speed) of the sacrificial nanostructures 114a, in accordance with some embodiments. Therefore, after the removal process of FIG. 2E, the width W114a2 of the sacrificial nanostructure 114a2 is greater than the width W114a of the sacrificial nanostructures 114a, in accordance with some embodiments. The thickness T114a2 of the sacrificial nanostructure 114a2 is less than the thickness T114a of the sacrificial nanostructures 114a, in accordance with some embodiments.

As shown in FIG. 3B, the steps of FIGS. 2F-2O are performed to form the inner spacer structure 190, the etch stop layer 220, the dielectric layer 230, the gate stack 240, the etch stop layer 250, the dielectric layer 260, and the contact structures 282 and 284, in accordance with some embodiments. In this step, a semiconductor device structure 300 is substantially formed, in accordance with some embodiments.

Each gate stack 240 has lower portions 245a and 245b, in accordance with some embodiments. The lower portion 245a is thinner than the lower portion 245b, in accordance with some embodiments. That is, the thickness T245a of the lower portion 245a is less than the thickness T245b of the lower portion 245b, in accordance with some embodiments.

The lower portion 245a is wider than the lower portion 245b, in accordance with some embodiments. That is, the width W245a of the lower portion 245a is greater than the width W245b of the lower portion 245b, in accordance with some embodiments. Therefore, the lower portion 245a may control the channel in the bottom portion 115 more effectively, which reduces the leakage current between the source/drain structures 210 on opposite sides of the lower portion 245a.

The inner spacer 192 beside the lower portion 245b is thicker than the inner spacer 192a beside the lower portion 245a, in accordance with some embodiments. That is, the thickness T192 of the inner spacer 192 is greater than the thickness T192a of the inner spacer 192a, in accordance with some embodiments. The (thick) inner spacer 192 is able to avoid short circuit between the lower portion 245b and the source/drain structures 210, in accordance with some embodiments. In some embodiments, sidewalls 192s of the inner spacers 192 and 192a are recessed from the sidewalls 114bs of the channel nanostructures 114b.

Figure 4A:
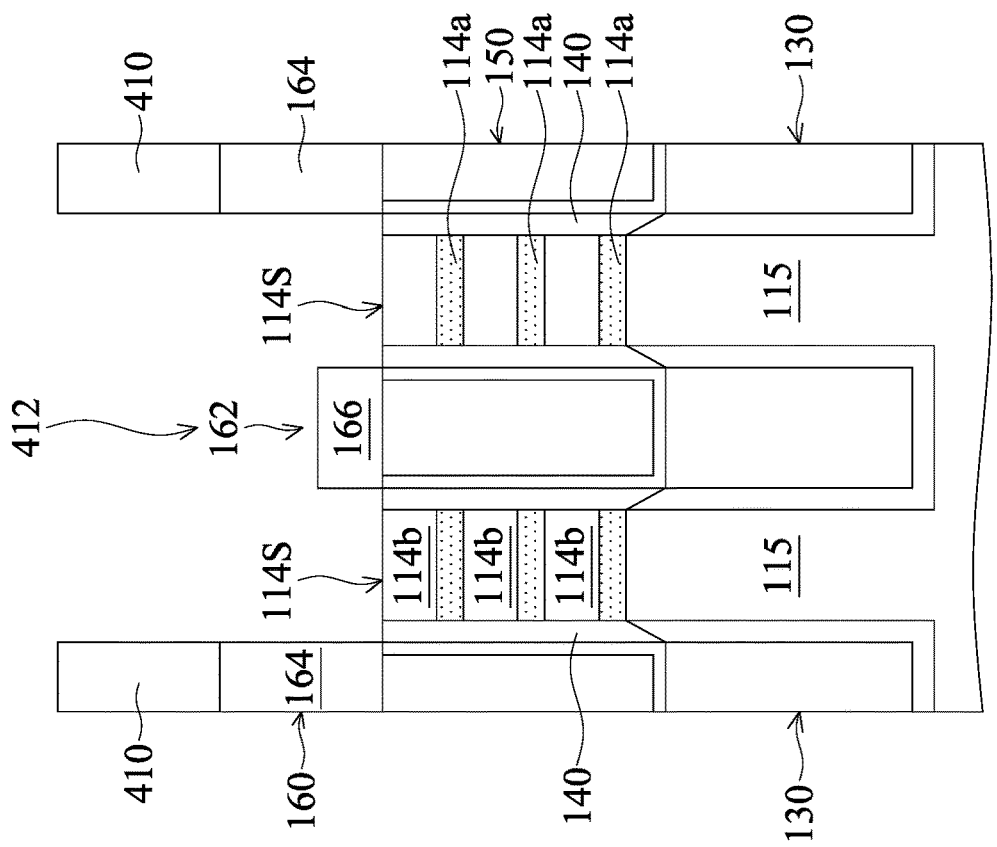
FIGS. 4A-4C are cross-sectional views of various stages of a process for forming a semiconductor device structure, in accordance with some embodiments.
Figure 4B:
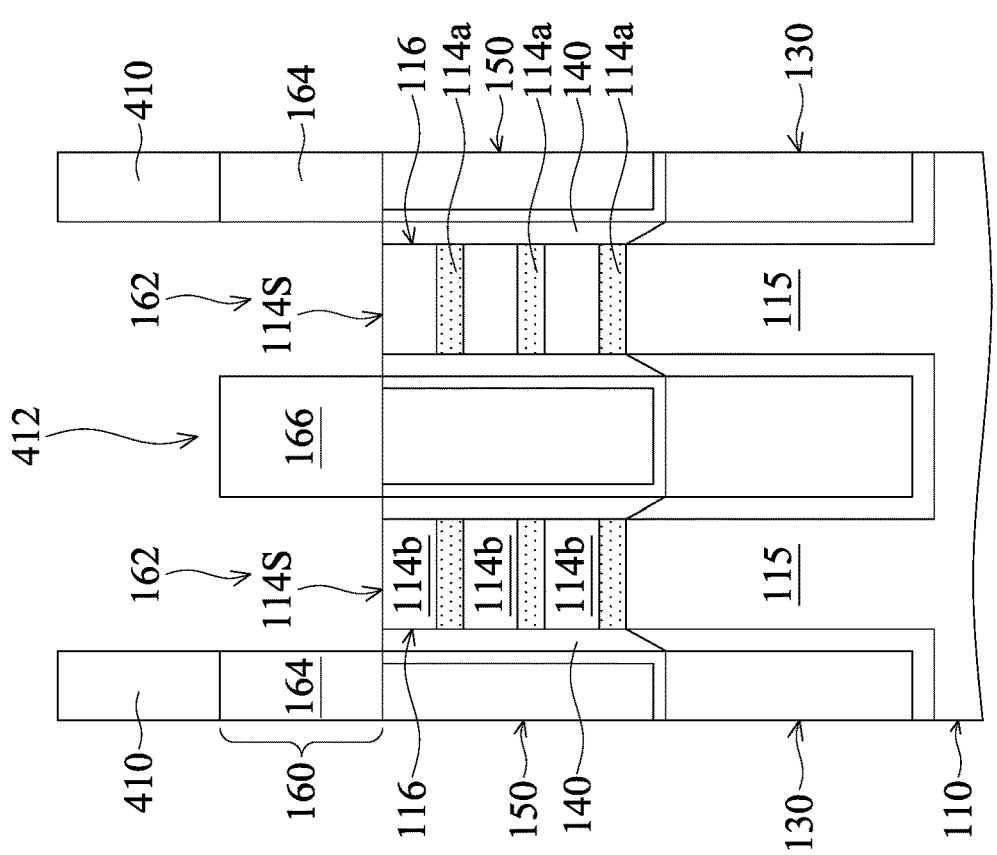
Figure 4C:
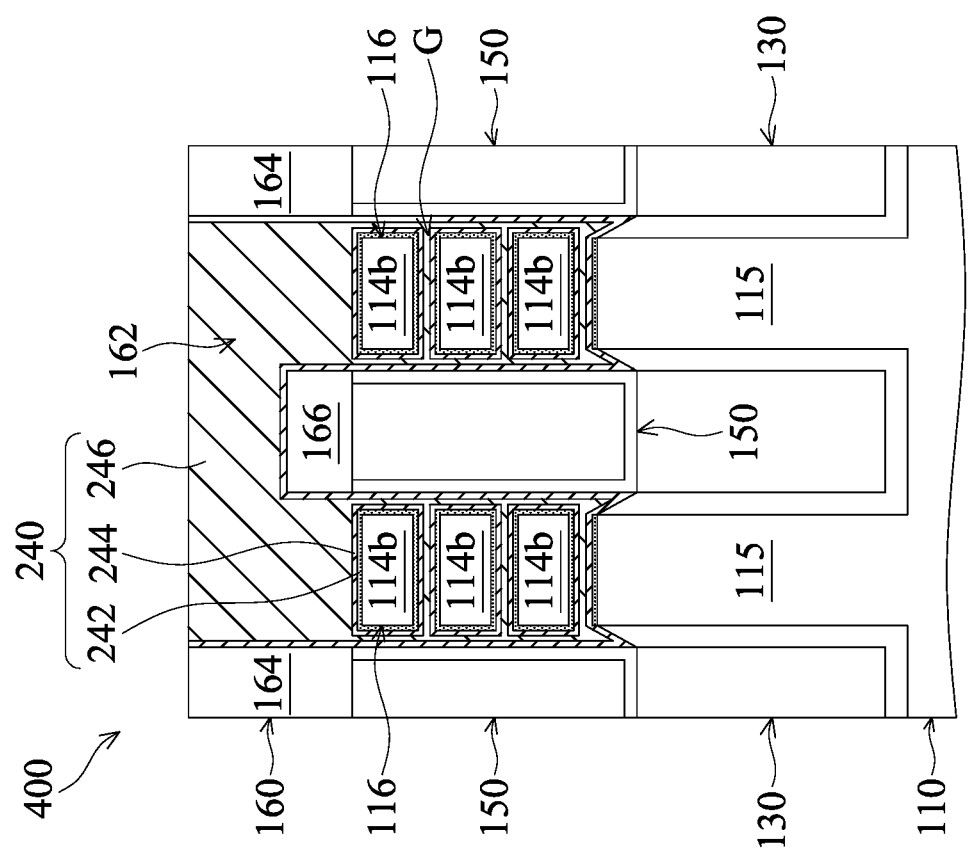

FIGS. 4A-4C are cross-sectional views of various stages of a process for forming a semiconductor device structure, in accordance with some embodiments. As shown in FIG. 4A, after the step of FIG. 2K-2, a mask layer 410 is formed over a portion 164 of the dielectric fins 160, in accordance with some embodiments. The mask layer 410 has an opening 412 exposing a portion 166 of the dielectric fins 160, in accordance with some embodiments.

As shown in FIG. 4B, the portion 166 of the dielectric fins 160 is partially removed through the opening 412, in accordance with some embodiments. As shown in FIG. 4C, the steps of FIGS. 2L-2O are performed, in accordance with some embodiments.

In this step, a semiconductor device structure 400 is substantially formed, in accordance with some embodiments. The gate stack 240 extends across the isolation structure 150 and the portion 166 of the dielectric fins 160, in accordance with some embodiments. The gate stack 240 is wrapped around the channel nanostructures 114b of different fin structures 116, in accordance with some embodiments.

Figures 5A, 5B:
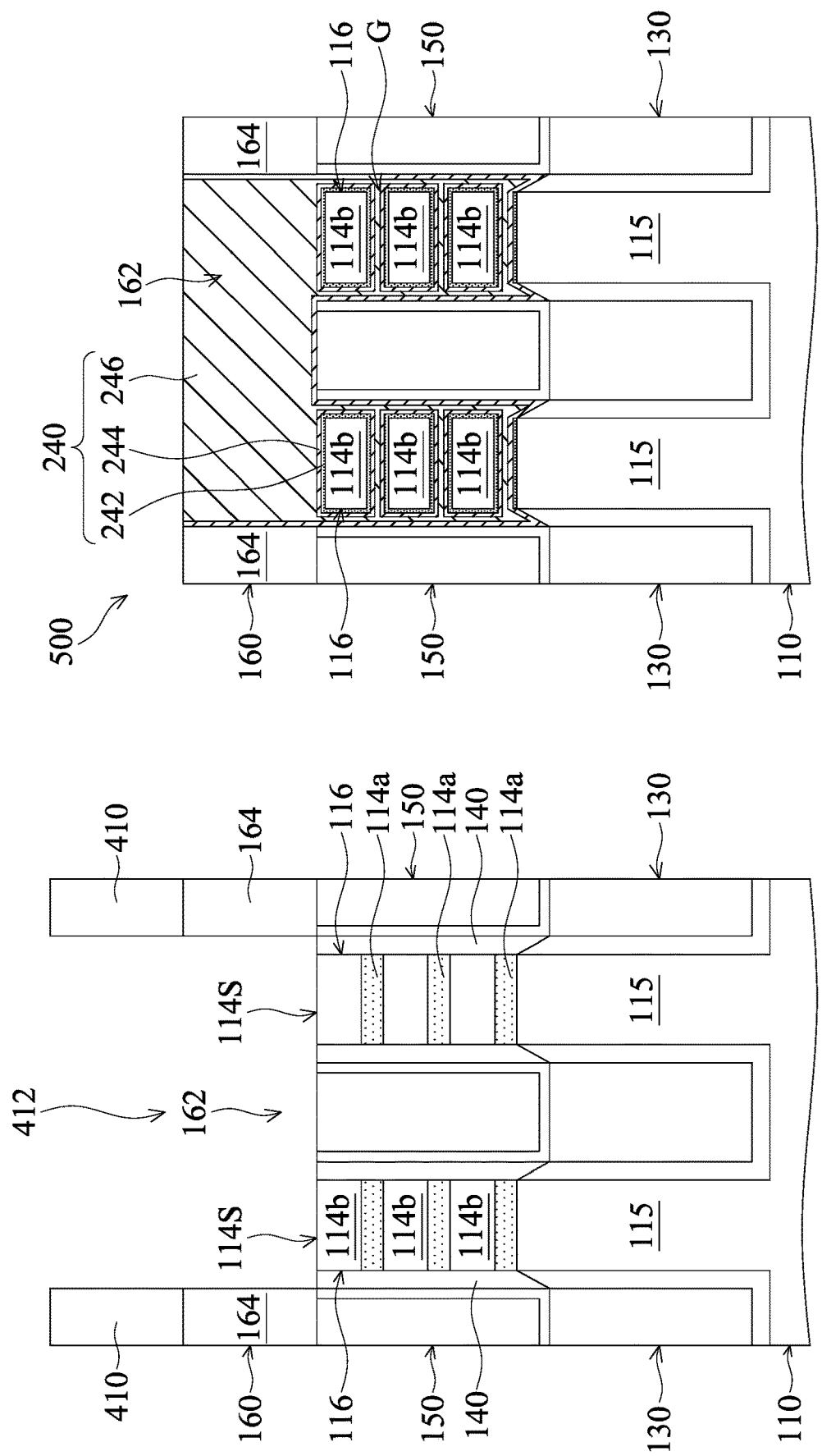
FIGS. 5A-5B are cross-sectional views of various stages of a process for forming a semiconductor device structure, in accordance with some embodiments.

FIGS. 5A-5B are cross-sectional views of various stages of a process for forming a semiconductor device structure, in accordance with some embodiments. As shown in FIG. 5A, after the step of FIG. 4A is performed, the portion 166 of the dielectric fins 160 is removed, in accordance with some embodiments.

As shown in FIG. 5B, the step of FIG. 4C is performed, in accordance with some embodiments. In this step, a semiconductor device structure 500 is substantially formed, in accordance with some embodiments. The gate stack 240 extends across the isolation structure 150, in accordance with some embodiments. The gate stack 240 is wrapped around the channel nanostructures 114b of different fin structures 116, in accordance with some embodiments.

Processes and materials for forming the semiconductor device structures 300, 400, and 500 may be similar to, or the same as, those for forming the semiconductor device structure 200 described above. Elements designated by the same reference numbers as those in FIGS. 1A to 5B have structures and materials that are the same or similar. Therefore, the detailed descriptions thereof will not be repeated herein.

In accordance with some embodiments, semiconductor device structures and methods for forming the same are provided. The methods (for forming the semiconductor device structure) form a thin sacrificial nanostructure under a channel nanostructure and form a cladding layer over sidewalls of the channel nanostructure and the thin sacrificial nanostructure. The etching rate of the thin sacrificial nanostructure is lower than the etching rate of the cladding layer because of the structural obstruction caused by the channel nanostructure. Therefore, after an etching process is performed on sidewalls of the thin sacrificial nanostructure and the cladding layer, the remaining cladding layer is narrower than the remaining sacrificial nanostructure. Since the cladding layer is used to reserve a space for a gate stack formed in the subsequent process, the distance between the gate stack and a source/drain structure is increased by narrowing the cladding layer, which reduces the parasitic capacitance between the gate stack and the source/drain structures. Therefore, the performance of a semiconductor device structure with the gate stack and the source/drain structures is improved.

In accordance with some embodiments, a semiconductor device structure is provided. The semiconductor device structure includes a substrate including a base and a fin structure over the base. The fin structure includes a nanostructure. The semiconductor device structure includes a gate stack over the base and wrapped around the nanostructure. The gate stack has an upper portion and a sidewall portion, the upper portion is over the nanostructure, and the sidewall portion is over a first sidewall of the nanostructure. The semiconductor device structure includes a first inner spacer and a second inner spacer over opposite sides of the sidewall portion. A sum of a first width of the first inner spacer and a second width of the second inner spacer is greater than a third width of the sidewall portion as measured along a longitudinal axis of the fin structure.

In accordance with some embodiments, a semiconductor device structure is provided. The semiconductor device structure includes a substrate including a base and a fin structure over the base. The fin structure includes a nanostructure. The semiconductor device structure includes a gate stack over the base and wrapped around the nanostructure. The gate stack has an upper portion and a sidewall portion, the upper portion is over the nanostructure, and the sidewall portion is over a first sidewall of the nanostructure. The semiconductor device structure includes a first inner spacer and a second inner spacer respectively extending from opposite sides of the sidewall portion into the sidewall portion. A sum of a first width of the first inner spacer and a second width of the second inner spacer is greater than a third width of the sidewall portion as measured along a longitudinal axis of the fin structure.

In accordance with some embodiments, a method for forming a semiconductor device structure is provided. The method includes providing a substrate including a base and a fin structure over the base. The fin structure includes a multilayer stack, and the multilayer stack includes a first nanostructure and a second nanostructure over the first nanostructure. The method includes forming a cladding layer over a first sidewall of the multilayer stack. The method includes forming a gate stack over the multilayer stack and the cladding layer. The method includes partially removing the multilayer stack and the cladding layer, which are not covered by the gate stack. The method includes partially removing the first nanostructure and the cladding layer from sidewalls of the first nanostructure and the cladding layer to form a first recess, a second recess, and a third recess. The first recess is in the multilayer stack, and the second recess and the third recess are on opposite sides of the cladding layer and surrounded by the cladding layer, the gate stack, and the multilayer stack. The method includes forming a first inner spacer, a second inner spacer, and a third inner spacer respectively in the first recess, the second recess, and the third recess. A sum of a first width of the second inner spacer and a second width of the third inner spacer is greater than a third width of the cladding layer as measured along a longitudinal axis of the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    providing a substrate comprising a base and a fin structure over the base, wherein the fin structure comprises a multilayer stack, and the multilayer stack comprises a first nanostructure and a second nanostructure over the first nanostructure;
    forming a first cladding layer over a first sidewall of the multilayer stack;
    forming a gate stack over the multilayer stack and the first cladding layer;
    partially removing the multilayer stack and the first cladding layer, wherein the first cladding layer is not covered by the gate stack; partially removing the first nanostructure and the first cladding layer from sidewalls of the first nanostructure and the first cladding layer to form a first recess, a second recess, and a plurality of third recesses, wherein the first recess is in the multilayer stack, the second recess is in the second nanostructure, and the plurality of third recesses are on opposite sides of the first cladding layer and surrounded by the first cladding layer, the gate stack, and the multilayer stack; and
    forming a first inner spacer, a second inner spacer, and a plurality of third inner spacers respectively in the first recess, the second recess, and the plurality of third recesses, wherein
    a sum of a first widths of a first one of the plurality of third inner spacers and a second width of a second one of the plurality of third inner spacers is greater than a third width of the first cladding layer as measured along a longitudinal axis of the fin structure.

2. The method for forming the semiconductor device structure as claimed in claim 1, wherein a first removal speed of the first nanostructure is lower than a second removal speed of the first cladding layer during partially removing of the first nanostructure and the first cladding layer.

3. The method for forming the semiconductor device as claimed in claim 1, wherein the plurality of third recesses extend into the first cladding layer.

4. The method for forming the semiconductor device structure as claimed in claim 3, wherein the second inner spacer has a curved sidewall.

5. The method for forming the semiconductor device structure as claimed in claim 1, wherein the first nanostructure and the first cladding layer are made of a first material, the second nanostructure is made of a second material, and the first material is different from the second material.

6. The method for forming the semiconductor device structure as claimed in claim 1, wherein the first inner spacer, the second inner spacer, and the third inner spacer are made of a same material.

7. The method for forming the semiconductor device structure as claimed in claim 6, further comprising:
    forming a second cladding layer over a second sidewall of the multilayer stack during forming the first cladding layer over the first sidewall of the multilayer stack, wherein the second sidewall is opposite to the first sidewall;
    partially removing the second cladding layer from a third sidewall of the second cladding layer to form a plurality of fourth recesses during partially removing the first nanostructure and the first cladding layer, wherein the plurality of fourth recesses is surrounded by the second cladding layer, the gate stack, and the multilayer stack; and
    forming a fourth inner spacer in the plurality of fourth recesses during forming the first inner spacer, the second inner spacer, and the third inner spacer, wherein the first inner spacer, the second inner spacer, and the fourth inner spacer together form an inner spacer structure, and the inner spacer structure has a U-like shape.

8. The method for forming the semiconductor device structure as claimed in claim 7, wherein the inner spacer structure surrounds the first nanostructure.

9. The method for forming the semiconductor device structure as claimed in claim 7, further comprising:
after forming the first inner spacer, the second inner spacer, the third inner spacer, and the fourth inner spacer, removing the gate stack, the first nanostructure, the first cladding layer, and the second cladding layer; and
forming a metal gate stack surrounding the second nanostructure.

10. The method for forming the semiconductor device structure as claimed in claim 9, wherein the metal gate stack has a fourth sidewall, a fifth sidewall, and a sixth sidewall connected between the fourth sidewall and the fifth sidewall, and the inner spacer structure covers the fourth sidewall, the fifth sidewall, and the sixth sidewall.

11. The method for forming the semiconductor device structure as claimed in claim 10, wherein an end portion of the inner spacer structure extends into the metal gate stack.

12. The method for forming the semiconductor device structure as claimed in claim 11, wherein the end portion of the inner spacer structure has a curved sidewall.

13. A method for forming a semiconductor device structure, comprising:
providing a substrate comprising a base and a fin structure over the base, wherein the fin structure comprises a multilayer stack, the multilayer stack comprises a first nanostructure and a second nanostructure over the first nanostructure, and the multilayer stack has a first sidewall and a second sidewall opposite to the first sidewall;
forming a first cladding layer and a second cladding layer over the first sidewall and the second sidewall respectively;
forming a gate stack over the multilayer stack, the first cladding layer, and the second cladding layer;
partially removing the multilayer stack, the first cladding layer, and the second cladding layer, which are not covered by the gate stack;
partially removing the first nanostructure, the first cladding layer, and the second cladding layer from sidewalls of the first nanostructure, the first cladding layer, and the second cladding layer to form a first recess, a second recess, a third recess, and a fourth recess, wherein the first recess is in the multilayer stack, the second recess is in the second nanostructure, the third recess is surrounded by the first cladding layer, the gate stack, and the multilayer stack, and the fourth recess is surrounded by the second cladding layer, the gate stack, and the multilayer stack; and
forming a first inner spacer, a second inner spacer, a third inner spacer, and a fourth inner spacer respectively in the first recess, the second recess, the third recess, and the fourth recess, wherein the third inner spacer extends into the first cladding layer.

14. The method for forming the semiconductor device structure as claimed in claim 13, wherein the fourth inner spacer extends into the second cladding layer.

15. The method for forming the semiconductor device as claimed in claim 13, wherein the first nanostructure has a third sidewall and a fourth sidewall connected to the third sidewall, and the first inner spacer and the third inner spacer cover the third sidewall and the fourth sidewall respectively.

16. The method for forming the semiconductor device as claimed in claimed in claim 13, wherein the third inner spacer is wider than the first inner spacer as measured along a longitudinal axis of the fin structure.

17. A method for forming a semiconductor device structure, comprising: providing a substrate comprising a base and a fin structure over the base, wherein the fin structure comprises a multilayer stack, and the multilayer stack comprises a first nanostructure and a second nanostructure over the first nanostructure;
forming a cladding layer over a first sidewall of the multilayer stack;
forming a gate stack over the multilayer stack and the cladding layer;
partially removing the multilayer stack and the cladding layer, which are not covered by the gate stack;
partially removing the first nanostructure and the cladding layer from sidewalls of the first nanostructure and the cladding layer to form a first recess, a second recess, and a plurality of third recesses, wherein the first recess is in the multilayer stack, the second recess is in the second nanostructure, and the plurality of third recesses are in the cladding layer, the cladding layer has a first end portion, a second end portion, and a neck portion connected between the first end portion and the second end portion, and the neck portion is narrower than the first end portion and the second end portion; and
forming a first inner spacer, a second inner spacer, and a plurality of third inner spacers respectively in the first recess, the second recess, and the plurality of third recesses.

18. The method for forming the semiconductor device structure as claimed in claim 17, wherein the first inner spacer is connected to a first one of the plurality of third inner spacers, and the first inner spacer and the first one of the plurality of third inner spacers together form an L-shaped structure.

19. The method for forming the semiconductor device structure as claimed in claim 18, wherein the first inner spacer is longer than the first one of the plurality of third inner spacers.

20. The method for forming the semiconductor device structure as claimed in claim 17, wherein the first one of the plurality of third inner spacers is in direct contact with the first inner spacer, the first nanostructure, the second nanostructure, the cladding layer, and the gate stack.

* * * * *